(12) United States Patent
Nakao et al.

(10) Patent No.: US 10,112,824 B2
(45) Date of Patent: Oct. 30, 2018

(54) SEMICONDUCTOR DEVICE

(71) Applicant: ROHM CO., LTD., Kyoto-shi, Kyoto (JP)

(72) Inventors: Yuichi Nakao, Kyoto (JP); Yasuhiro Fuwa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/132,965

(22) Filed: Apr. 19, 2016

(65) Prior Publication Data

US 2016/0229690 A1    Aug. 11, 2016

Related U.S. Application Data

(63) Continuation of application No. 14/224,489, filed on Mar. 25, 2014, now Pat. No. 9,331,006.

(30) Foreign Application Priority Data

Mar. 25, 2013  (JP) .................................. 2013-062518
Mar. 25, 2013  (JP) .................................. 2013-062519

(Continued)

(51) Int. Cl.
*H01L 23/04*    (2006.01)
*H01L 23/13*    (2006.01)
(Continued)

(52) U.S. Cl.
CPC ............ *B81B 7/0074* (2013.01); *H01L 23/13* (2013.01); *H01L 23/147* (2013.01); *H01L 23/24* (2013.01);
(Continued)

(58) Field of Classification Search
CPC ... H01L 23/04; H01L 23/043; H01L 25/0652; H01L 25/0655; H01L 25/0657; H01L 23/13
See application file for complete search history.

(56) References Cited

U.S. PATENT DOCUMENTS 7,152,473 B1 * 12/2006 Rushefsky ............ B81B 7/0074
                                                                    73/431
8,129,838 B2    3/2012 Reinert
(Continued)

FOREIGN PATENT DOCUMENTS

JP      5-275611 A    10/1993
JP    2002-299553 A   10/2002
(Continued)

OTHER PUBLICATIONS

Definition of "Obverse", http://www.merriam-webster.com/dictionary/obverse (2016).*
(Continued)

*Primary Examiner* — Michele Fan
(74) *Attorney, Agent, or Firm* — Hamre, Schumann, Mueller & Larson, P.C.

(57) ABSTRACT

A semiconductor device includes a substrate that is made of a semiconductor material and has a main surface formed with a recess. The semiconductor device also includes a wiring layer formed on the substrate, an electronic element housed in the recess, and a sealing resin covering at least a part of the electronic element.

25 Claims, 31 Drawing Sheets

(30) Foreign Application Priority Data

| Mar. 25, 2013 | (JP) | 2013-062520 |
| Mar. 25, 2013 | (JP) | 2013-062521 |
| Mar. 25, 2013 | (JP) | 2013-062522 |
| Mar. 25, 2013 | (JP) | 2013-062523 |
| Jan. 24, 2014 | (JP) | 2014-011044 |

(51) Int. Cl.

| H01L 25/065 | (2006.01) |
| B81B 7/00 | (2006.01) |
| H01L 23/495 | (2006.01) |
| H01L 23/14 | (2006.01) |
| H01L 23/24 | (2006.01) |
| H01L 23/31 | (2006.01) |
| H01L 23/498 | (2006.01) |
| H01L 25/16 | (2006.01) |

(52) U.S. Cl.
CPC .... *H01L 23/3135* (2013.01); *H01L 23/49579* (2013.01); *B81B 2201/0235* (2013.01); *B81B 2203/0315* (2013.01); *H01L 23/3128* (2013.01); *H01L 23/49816* (2013.01); *H01L 23/49827* (2013.01); *H01L 25/16* (2013.01); *H01L 2224/16225* (2013.01); *H01L 2224/97* (2013.01); *H01L 2924/14* (2013.01); *H01L 2924/1461* (2013.01); *H01L 2924/157* (2013.01); *H01L 2924/15156* (2013.01); *H01L 2924/15165* (2013.01); *H01L 2924/15192* (2013.01); *H01L 2924/15311* (2013.01); *H01L 2924/15321* (2013.01); *H01L 2924/18161* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

| 8,415,811 B2 | 4/2013 | Fukumura et al. |
| 2006/0171081 A1 | 8/2006 | Breuer et al. |
| 2007/0209437 A1 | 9/2007 | Xue et al. |
| 2009/0079025 A1* | 3/2009 | Yamazaki ......... H01L 21/02002 257/506 |
| 2009/0133914 A1* | 5/2009 | Dellmann .......... B81C 1/00373 174/260 |
| 2009/0166826 A1* | 7/2009 | Janducayan ...... H01L 23/49503 257/676 |
| 2010/0206075 A1 | 8/2010 | Oshio |
| 2010/0252939 A1 | 10/2010 | Finkbeiner et al. |
| 2011/0057273 A1* | 3/2011 | O'Donnell ........... B81C 1/0023 257/414 |
| 2011/0158273 A1* | 6/2011 | Okayama ............... H01L 24/97 372/43.01 |
| 2011/0194273 A1* | 8/2011 | Park ....................... H01L 24/48 362/97.1 |
| 2011/0290023 A1 | 12/2011 | Takagi |
| 2012/0001538 A1* | 1/2012 | Kim .................... H01L 25/0753 313/512 |
| 2012/0279077 A1 | 11/2012 | Withanawasam et al. |
| 2014/0122015 A1 | 5/2014 | Handa |
| 2016/0242292 A1* | 8/2016 | Nishimura ............. H05K 1/111 |

FOREIGN PATENT DOCUMENTS

| JP | 2009-122041 A | 6/2009 |
| JP | 2012-99673 | 5/2012 |

OTHER PUBLICATIONS

Office Action issued in corresponding Japanese Patent application, dated Aug. 22, 2017, and machine translation.

\* cited by examiner

1
SEMICONDUCTOR DEVICE

This application is a Continuation of U.S. Ser. No. 14/224,489, filed Mar. 25, 2014, which application is incorporated herein by reference.

BACKGROUND OF THE INVENTION

1. Field of the Invention

The present invention relates to semiconductor devices.

2. Description of the Related Art

Semiconductor devices receive input currents or output currents from outside and provide various specific functions in response. Semiconductors vary widely in their configurations. Typically, however, semiconductor devices incorporate therein a plurality of elements each constituting part of electric circuitry for achieving the specific functions as the semiconductor devices. In order to support these elements and provide electric continuity between these elements as well, metal lead frames are used. The number, shape and size of the lead frames are determined in accordance with the functions, shape and size of the elements. Once the elements are mounted on a lead frame, they are then covered with sealing resin. The sealing resin protects these elements and part of the lead frame as well. These semiconductor devices are then utilized as mounted on circuit substrates and so on, of electronic products for example.

The lead frames are often formed by punching a sheet of metal with a metal die for example. The method using a metal die has an advantage that it is capable of forming the lead frames efficiently and accurately. However, the lead frames vary considerably in its number, size and shape depending on the elements. Therefore, once there is a change in intended functions, for example, of the semiconductor device, the size and/or shape of the lead frame need be changed. This means that the metal die need be redesigned. Since the metal die is relatively expensive, this results in cost increase in the semiconductor device if the semiconductor device is manufactured only in a small quantity.

Another problem lies in the fact that the lead frame typically is a flat piece of metal since it is made from a sheet of metal. Although it is not impossible to make a three-dimensional shape by means of discretionary squeezing processes, there is a certain limit. For the semiconductor devices, there is a constant demand for a higher level of functionality and a wider range of multi-functionality. In order to meet these demands, high density mounting and three-dimensional layout of the elements will be necessary other than two-dimensional.

Patent Document: JP 2012-99673 A

SUMMARY OF THE INVENTION

The present invention has been proposed under the above-described circumstances. It is therefore an object of the present invention to provide a semiconductor device configured to reduce the costs of manufacture. Another object of the present invention is to provide a semiconductor device configured to ease the limitations to the layout when disposing a plurality of elements.

According to an embodiment of the present invention, there is provided a semiconductor device including: a substrate made of a semiconductor material and including a main surface formed with a recess; a wiring layer formed on the substrate; a first element housed in the recess; and a sealing resin covering at least a part of the first element.

Preferably, the semiconductor device may further include an second element covering at least part of the first element.

Preferably, the recess includes a first hollow and a second hollow. The first hollow houses the first element and includes a first bottom surface and a first inclined side surface. The second hollow includes a second bottom surface and a second inclined side surface. The second bottom surface connects to the first inclined side surface, and the second inclined side surface connects to the second bottom surface and the main surface.

Preferably, the second element is supported by the second bottom surface and overlaps at least a part of the first hollow in a normal direction of the main surface.

Preferably, the second bottom surface includes two regions sandwiching the first hollow, and the second element is supported by the two regions.

Preferably, the first element is supported by the first bottom surface.

Preferably, the semiconductor device may further include a third element supported by the first inclined side surface.

Preferably, the substrate is made of a monocrystal semiconductor material.

Preferably, the semiconductor material is Si.

Preferably, the main surface is provided by a (100) surface, and each of the first inclined side surface and the second inclined side surface includes four inclined surfaces.

Preferably, the main surface is provided by a (110) surface, and the first inclined side surface includes: two inclined surfaces spaced apart from each other with the first bottom surface in-between; and two upright side surfaces perpendicular to the first bottom surface and spaced apart from each other with the first bottom surface in-between, and the second inclined side surface includes: two inclined surfaces spaced apart from each other with the second bottom surface in-between; and two upright side surfaces perpendicular to the first bottom surface and spaced apart from each other with the second bottom surface in-between.

Preferably, the semiconductor device may further include a third element and a fourth element housed in the recess, where the first element, the third element and the fourth element are direction sensor elements having detection reference axes, respectively, that extend in mutually different directions.

Preferably, the semiconductor device may further include an acceleration sensor element for acceleration detection in three mutually different directions.

Preferably, the acceleration sensor element is housed in the first hollow.

Preferably, the acceleration sensor element is supported by the first bottom surface.

Preferably, the wiring layer includes a plurality of external terminals formed on the main surface.

Preferably, the wiring layer includes a plurality of first bottom surface pads formed on the first bottom surface for mounting the first element.

Preferably, the wiring layer includes a plurality of second bottom surface pads formed on the second bottom surface for mounting the second element.

Preferably, the semiconductor device may further include a third element housed in the first hollow, where the wiring layer includes a plurality of first inclined side surface pads formed on the first inclined side surface, and the third element is mounted on the first inclined side surface pads.

Preferably, the wiring layer includes a connection path for connecting two of the external terminals, the first bottom surface pads, the second bottom surface pads and the first inclined side surface pads.

Preferably, the connection path is routed via the second inclined side surface.

Preferably, the connection path is routed via the first inclined side surface.

Preferably, the sealing resin includes: a first sealing resin covering the first element; and a second sealing resin covering at least a part of the second element.

Preferably, the second sealing resin covers the entirety of the second element.

Preferably, the second sealing resin exposes the external terminals.

Other features and advantages of the present invention will become clearer from the following detailed description to be given with reference to the attached drawings.

DETAILED DESCRIPTION OF THE PREFERRED EMBODIMENTS

Preferred embodiments of the present invention will be described below with reference to the drawings.

Figure 1:
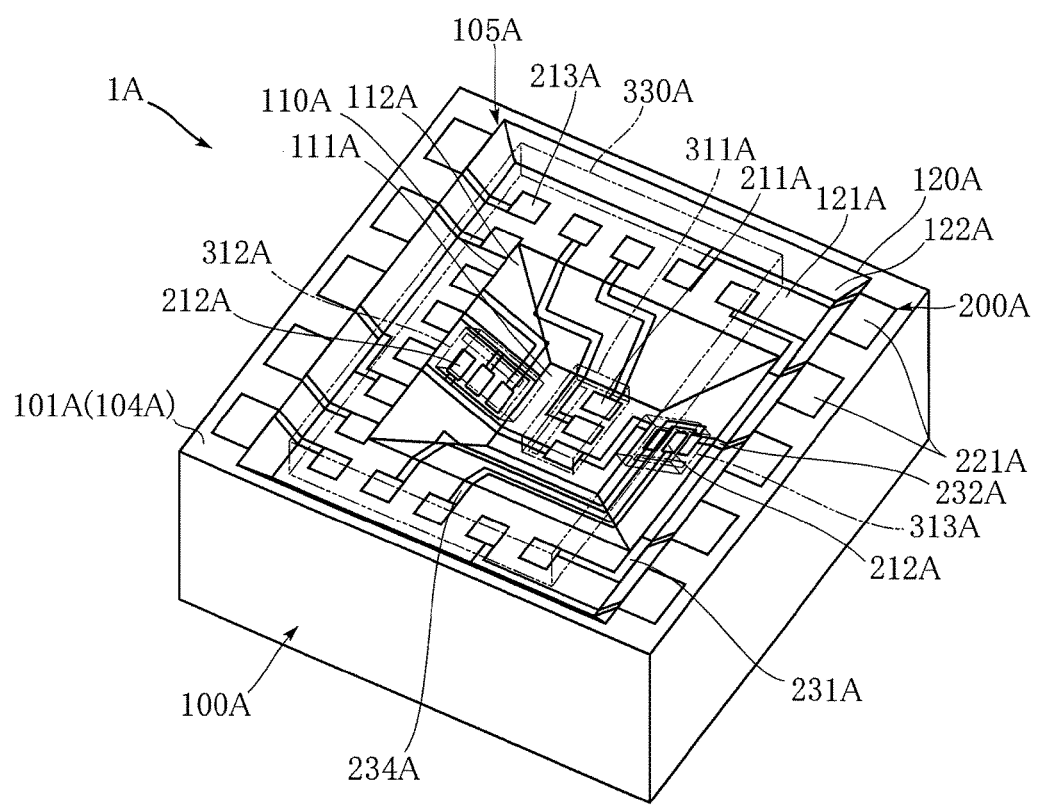
FIG. 1 is a perspective view, showing a primary portion of a semiconductor device according to a first embodiment of the present invention.
Figure 2:
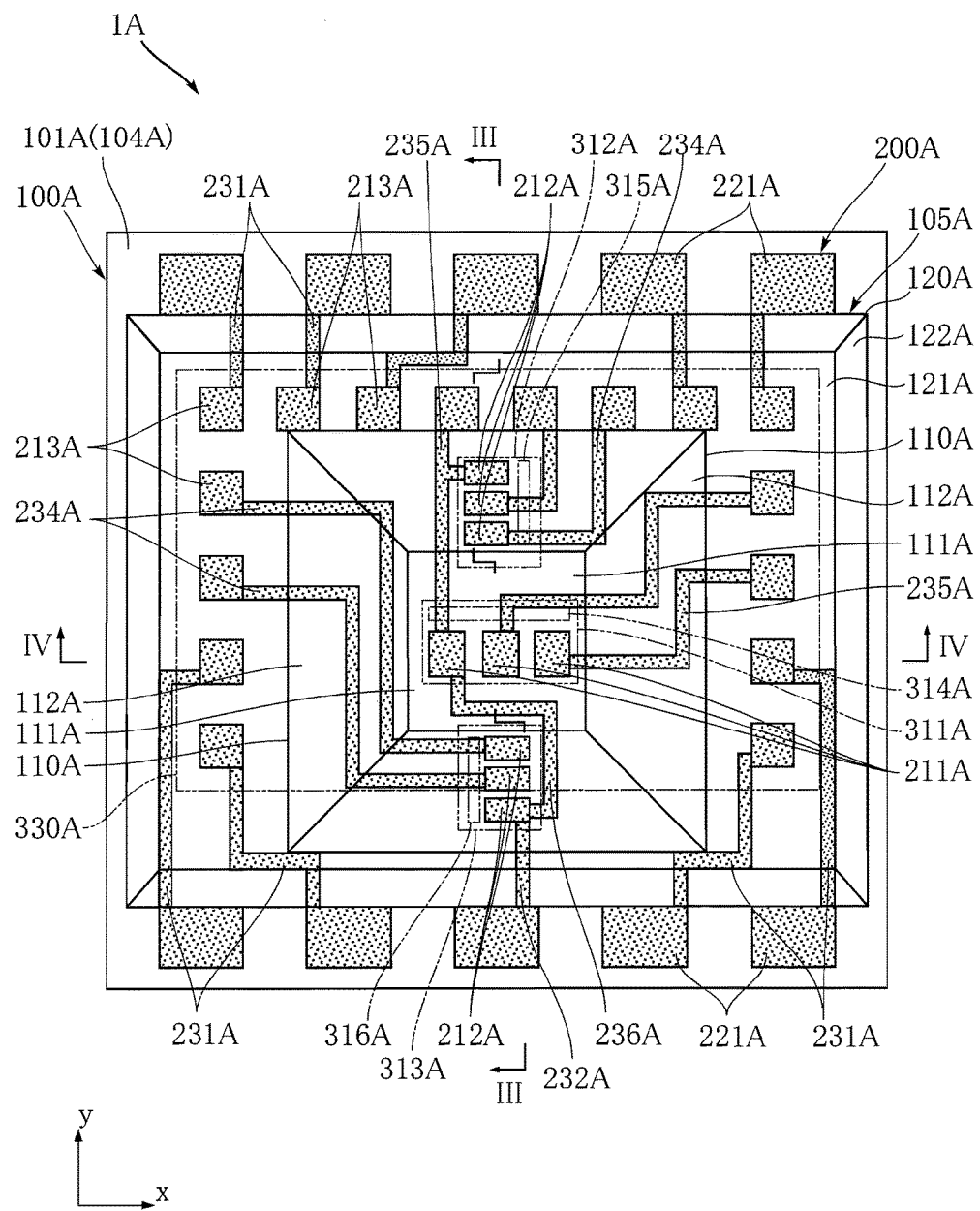
FIG. 2 is a plan view, showing a primary portion of the semiconductor device in FIG. 1.
Figure 3:
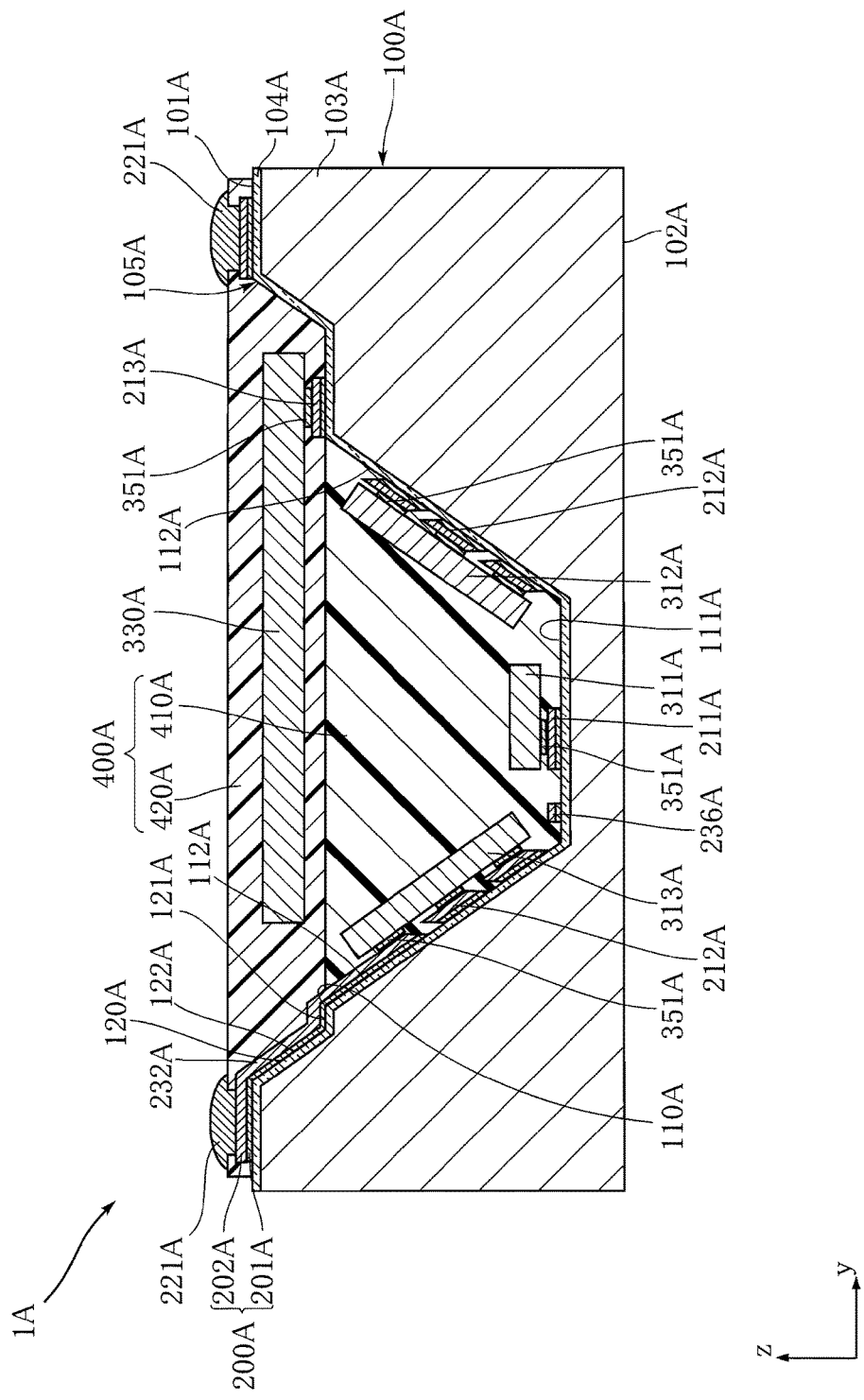
FIG. 3 is a sectional view taken in lines III-III in FIG. 2.
Figure 4:
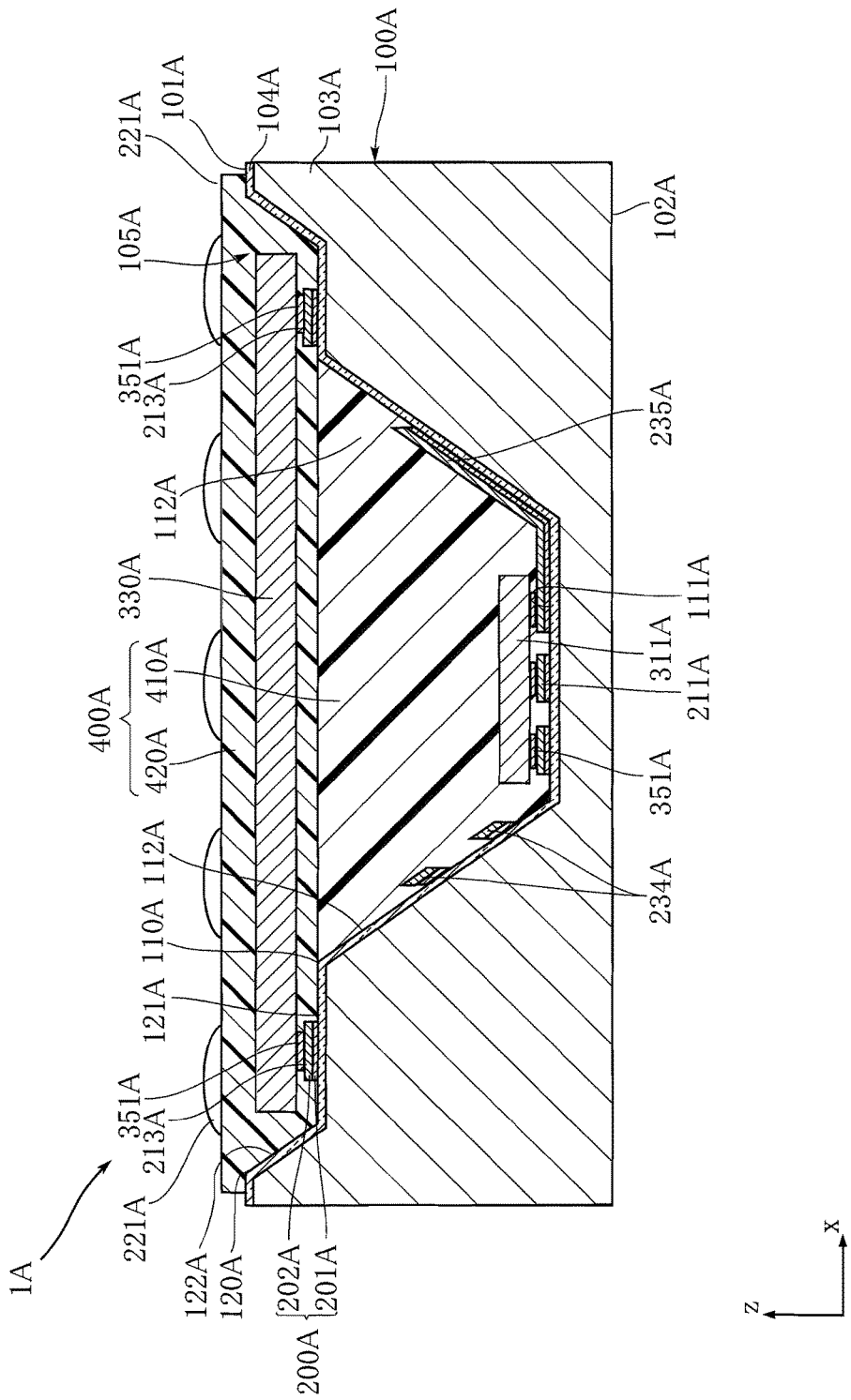
FIG. 4 is a sectional view taken in lines IV-IV in FIG. 2.

FIG. 1 through FIG. 4 show a semiconductor device according to a first embodiment of the present invention. A semiconductor device 1A according to the present embodiment includes a substrate 100A; a wiring layer 200A; three direction sensor elements 311A, 312A, 313A; an integrated circuit element 330A; and a sealing resin 400A. FIG. 1 and FIG. 2 do not show the sealing resin 400A, and show the three direction sensor elements 311A, 312A, 313A and the integrated circuit element 330A in imaginary lines for the sake of easier understanding. FIG. 3 is a sectional view in a yz plane, taken in lines III-III in FIG. 2 whereas FIG. 4 is a sectional view in a zX plane taken in IV-IV in FIG. 2.

The semiconductor device 1A is a surface-mountable orientation detection module capable of detecting three different orientations and has an arrangement to be described herebelow. As an example, the semiconductor device 1A has a size of approximately 2 mm×2 mm in a plan view, with a thickness of approximately 0.76 mm.

The substrate 100A serves as a base of the semiconductor device 1A, and includes a base material 103A and an insulation layer 104A. The substrate 100A has a main surface 101A, a back surface 102A, and a recess 105A. The substrate 100A has a thickness of approximately 700 μm for example. In the present embodiment, the main surface 101A and the back surface 102A face away from each other in a direction z, and the direction z represents a thickness direction of the semiconductor device 1A. A direction x and a direction y are both perpendicular to the direction z.

The base material 103A is made of a monocrystal semiconductor material, and in the present embodiment is made of monocrystal Si. The insulation layer 104A is formed of $SiO_2$ in the present embodiment. The material for the base material 103A is not limited to Si, but may be anything as far as it is possible to form the recess 105A which satisfy the intension to be described later. The insulation layer 104A covers those regions on the base material 103A which are exposed on a side away from the back surface 102A. The insulation layer 104A has a thickness of approximately 0.1 through 1.0 μm for example.

Figure 5:
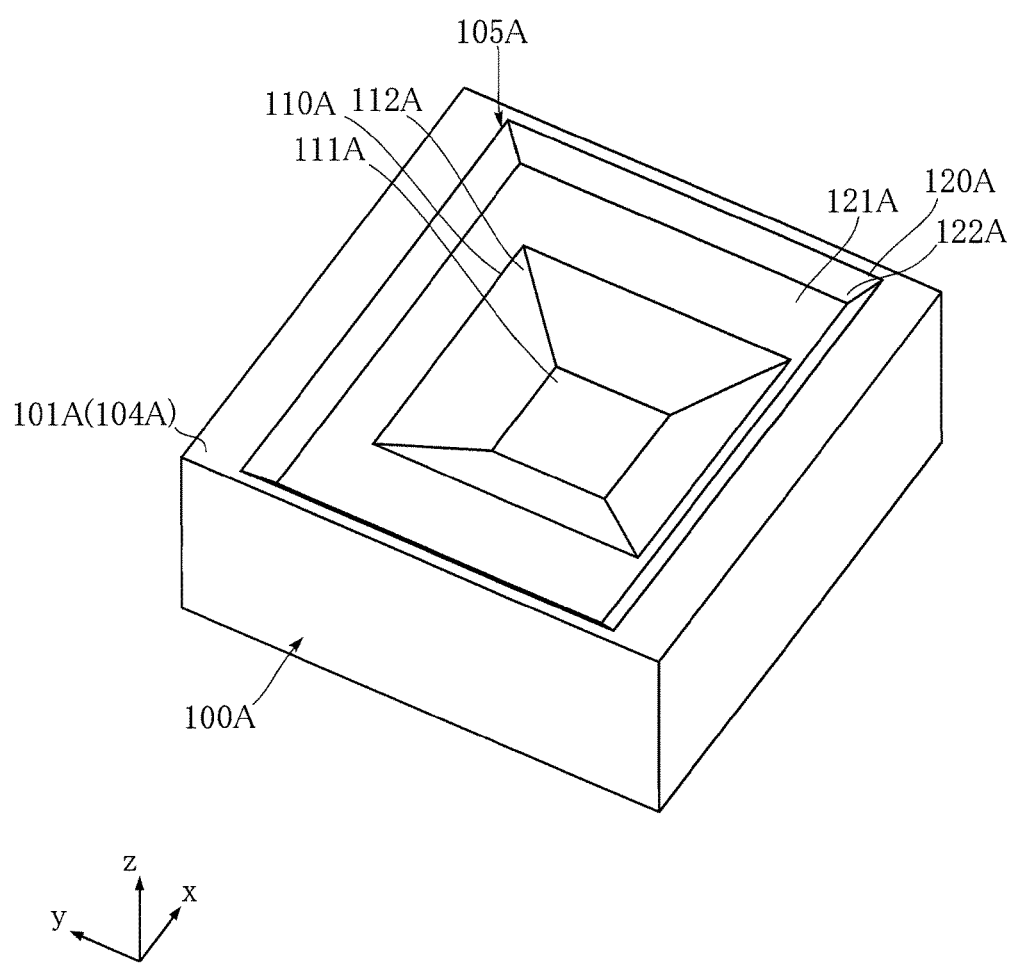
FIG. 5 is a perspective view, showing a substrate of the semiconductor device in FIG. 1.

FIG. 5 is a perspective view of the frame 12. In the present embodiment, the main surface 101A is provided by a (100) surface of the base material 103A. The recess 105A recedes from the main surface 101A toward the back surface 102A. In the present embodiment, the recess 105A includes a first hollow 110A and a second hollow 120A. The first hollow 110A is on a side closer to the back surface 102A, and has a first bottom surface 111A and four first inclined side surfaces 112A. The second hollow 120A is on a side closer to the main surface 101A than is the first hollow 110A, and has a second bottom surface 121A and four second inclined side surfaces 122A. Shapes of the first hollow 110A and of the second hollow 120A are dependent upon the fact that a (100) surface is used as the main surface 101A.

Since the recess 105A is formed, the main surface 101A is rectangle-annular in a plan view. More specifically, the main surface 101A includes two regions spaced from each other in the direction y with the recess 105A in-between, which are significantly larger than the other two regions spaced from each other in the direction x with the recess 105A in-between.

The first hollow 110A is substantially square in a plan view. The first hollow 110A has a depth of approximately 440 μm for example. The first bottom surface 111A is generally square in a plan view, with its sides being 460 μm in length. The four first inclined side surfaces 112A surround the first bottom surface 111A in a plan view, are substantially congruent to each other, and are substantially trapezoidal, with their upper bases each represented by a side of the first bottom surface 111A. Each of the first inclined side surfaces 112A is inclined with respect to the first bottom surface 111A. In the present embodiment, the first inclined side surfaces 112A is inclined by approximately 55 degrees to an xy plane. The fact that the first inclined side surfaces 112A are substantially trapezoidal which are substantially congruent to each other and that the angle described is 55 degrees are dependent upon the fact that a (100) surface is used as the main surface 101A.

The second hollow 120A is rectangular in a plan view. The second hollow 120A has a depth of approximately 120 μm for example. The second bottom surface 121A is rectangle-annular and surrounds the first hollow 110A in a plan view. Also, the second bottom surface 121A connects to the four first inclined side surfaces 112A. The four first inclined side surfaces 122A surround the second bottom surface 121A in a plan view, and are substantially trapezoidal, with their upper bases each represented by a side of the second bottom surface 121A. Each of the second inclined side surfaces 122A is inclined with respect to the second bottom surface 121A. In the present embodiment, the second inclined side surfaces 122A are inclined by approximately 55 degrees with respect to an xy plane. The fact that the second inclined side surfaces 122A are substantially trapezoidal and that the angle described is 55 degrees are dependent upon the fact that a (100) surface is used as the main surface 101A.

In the present embodiment, the first hollow 110A and the second hollow 120A have their respective centers at different locations from each other. As shown in FIG. 2 and FIG. 5, the center of the first hollow 110A is apart from the center of the second hollow 120A in the direction y. Therefore, in the second bottom surface 121A, regions separated by the first hollow 110A in the direction x are substantially as large as each other, but regions separated by the first hollow 110A in the direction y are not, with one region being substantially larger than the other.

The wiring layer 200A is for mounting the three direction sensor elements 311A, 312A, 313A and the integrated circuit element 330A, and providing electric-current paths for input to/output from these elements. The wiring layer 200A is formed on the insulation layer 104A, and in the present embodiment, constituted by a barrier-seed layer 201A and a plating layer 202A laminated thereon.

The barrier-seed layer 201A serves as a so called foundation layer for formation of a desired plating layer 202A, and is formed on the insulation layer 104A. The barrier-seed layer 201A is composed of a Ti layer as a barrier layer, for example, formed on the insulation layer 104A; and a Cu layer serving as a seed layer formed in lamination on the barrier layer. The barrier-seed layer 201A is formed by spattering for example.

The plating layer 202A, which is made of Cu for example, is formed by means of electrolytic plating using the barrier-seed layer 201A. The plating layer 202A has a thickness of approximately 5 μm for example.

In the present embodiment, the wiring layer 200A has first bottom surface pads 211A, first inclined side surface pads 212A, second bottom surface pads 213A, external terminals 221A and the connection paths 231A, 232A, 234A, 235A, 236A.

The first bottom surface pads 211A are formed on the first bottom surface 111A in the first hollow 110A, and are rectangular for example. In the present embodiment, three first bottom surface pads 211A are disposed in the direction x. In the present embodiment, the first bottom surface pads 211A are used to mount the direction sensor element 311A.

The first inclined side surface pads 212A are formed on the first inclined side surfaces 112A in the first hollow 110A, and are rectangular for example. In the present embodiment, the first inclined side surfaces 112A are spaced from each other by the first bottom surface 111A in the direction y, and each first inclined side surface 112A is formed with three first inclined side surface pads 212A. In each first inclined side surface 112A, the three first inclined side surface pads 212A are disposed in the direction y. In the present embodiment, the first inclined side surface pads 212A are used to mount the direction sensor elements 312A, 313A.

The second bottom surface pads 213A are formed on the second bottom surface 121A in the second hollow 120A, and are rectangular for example. In the present embodiment, a plurality of the second bottom surface pads 213A are formed on the two regions which are spaced from each other in the direction x with the first hollow 110A in-between, and on the larger of the two regions which are spaced from each other in the direction y with the first hollow 110A in-between. More specifically, two arrays of five second bottom surface pads 213A arranged in the direction y are spaced from each other in the direction x with the first hollow 110A in-between. Also, between these arrays of five second bottom surface pads 213A, an array of six second bottom surface pads 213A are disposed in the direction x. Hence, a plurality of the second bottom surface pads 213A are disposed in a generally U-shaped pattern. In the present embodiment, the second bottom surface pads 213A are used to mount the integrated circuit element 330A.

The external terminals 221A are formed on the main surface 101A, and are used to surface-mount the semiconductor device 1A onto a circuit substrate of an unillustrated electronic product for example. In the present embodiment, each of the two regions in the main surface 101A, which are spaced from each other in the direction y with the recess 105A in-between, is formed with five external terminals 221A. Also, each external terminal 221A has a side in contact with an outer edge of the recess 105A. The external terminals 221A are provided by bumps obtained through non-electrolytic plating of a metal such as Ni, Pd, Au on the barrier-seed layer 201A and the plating layer 202A. As a result, as shown in FIG. 3 and FIG. 4, the external terminals 221A bulge in the direction z.

The connection paths 231A, 232A, 234A, 235A, 236A constitute pathways for mutual connection between the first bottom surface pads 211A, the first inclined side surface pads 212A, the second bottom surface pads 213A and the external terminals 221A.

The connection paths 231A provide pathways from the main surface 101A to the second bottom surface 121A, connecting mainly the external terminals 221A and the second bottom surface pads 213A with each other. As shown in FIG. 2, in the present embodiment, each connection path 231A connects to the side, which is in contact with the recess 105A, of a corresponding external terminal 221A. Also, each connection path 231A is routed via the second inclined side surface 122A in the second hollow 120A, to the second bottom surface 121A. Each connection path 231A has a portion formed on the second inclined side surface 122A, which extends in the direction y in a plan view and is not angled with respect to the direction y.

Also, four connection paths 231A located in a lower area in the drawing are routed to detour from a region of the second bottom surface 121A, which is located in a lower area in the drawings, to the left or to the right, and then connect to the second bottom surface pads 213A. Two connection paths 231A located at two lower ends in the drawing extend along the second bottom surface 121A, and in contact with an outer side of the second bottom surface 121A. Two connection paths 231A located at the second position from the left or the right end in the drawing are in contact with an outer side and an inner side of the second bottom surface 121A in the second bottom surface 121A, and extend between these sides.

The five connection paths 231A located in an upper area in the drawing are routed from the external terminals 221A, via the second inclined side surface 122A, and then connect to the second bottom surface pads 213A located below the external terminals 221A in the drawings. Two connection paths 231A located at each of the left and right ends in the drawing extend straightly in the direction y in a plan view. The connection path 231A at a center in the left-right direction in the drawing has its part in contact with the outer side of the second bottom surface 121A, and is bent.

The connection path 232A provides a pathway from the main surface 101A to the first inclined side surface 112A, connecting the external terminal 221A and the first inclined side surface pad 212A with each other. In the present embodiment, there is formed only one connection path 232A, starting from the external terminal 221A which is located at a lower left-right center in the drawing, via the second inclined side surfaces 122A and the second bottom surface 121A, to the first inclined side surfaces 112A. This connection path 232A extends straightly in the direction v in a plan view.

The connection paths 234A provide pathways from the second bottom surface 121A to the first inclined side surfaces 112A, connecting the second bottom surface pads 213A and the first inclined side surface pads 212A with each other. In the present embodiment, two connection paths 234A extend from two second bottom surface pads 213A located at an upper area in the drawing, to two first inclined side surface pads 212A. Each of these connection paths 234A connect to one of the sides of the second bottom surface pads 213A which is in contact with an outer edge of the first hollow 110A. Also, each connection path 234A bends in the first inclined side surfaces 112A, connecting to the first inclined side surface pads 212A from the direction x. Further, two connection paths 234A extend from two second bottom surface pads 213A located on the left side in the drawing, to two first inclined side surface pads 212A. Each of these connection paths 234A connects to one of the sides of the second bottom surface pads 213A which is spaced from the outer edge of the first hollow 110A. Also, each connection path 234A bends in the first inclined side surfaces 112A, connecting to the first inclined side surface pads 212A from the direction x.

The connection path 235A provides a pathway from the second bottom surface 121A, via the first inclined side surface 112A, to the first bottom surface 111A, connecting the second bottom surface pad 213A and the first bottom surface pad 211A with each other. In the present embodiment, one connection path 235A extends from one second bottom surface pad 213A located at an upper area in the drawing, to one first bottom surface pad 211A. This connection path 235A extends straightly in the direction y in a plan view. Also, two connection paths 235A extend from two second bottom surface pads 213A located on the right side in the drawing, to two first bottom surface pads 211A. These connection paths 235A bend at two locations in the first inclined side surface 112A. Also, one of these connection paths 235A bends in the first bottom surface 111A.

The connection path 236A provides a pathway from the first inclined side surface 112A to the first bottom surface 111A, connecting the first inclined side surface pad 212A and the first bottom surface pad 211A with each other. In the present embodiment, one connection path 236A extends from one first inclined side surface pad 212A located at a lower area in the drawing, to one first bottom surface pad 212A located on the left side in the drawing. This connection path 236A bends in the first inclined side surface 112A and also in the first bottom surface 111A.

In the present embodiment, the external terminal 221A located at a lower center in the drawing serves as a so called grounding terminal. Grounded to this external terminal 221A are the connection path 232A, the first inclined side surface pads 212A, the connection path 236A, the first bottom surface pads 211A, the connection path 235A, and the second bottom surface pads 213A.

Each of the three direction sensor elements 311A, 312A, 313A has a detection reference axis in a direction different from those of the other two, so that they can serve, for example, in detecting the attitude of the semiconductor device 1A with respect to the geomagnetic field. As shown in FIG. 2, in the present embodiment, the direction sensor elements 311A, 312A, 313A have magnetic cores 314A, 315A, 316A respectively. Each of the magnetic cores 314A, 315A, 316A is provided by a metal bar extending in a predetermined direction, with their length direction representing the detection reference axes of the respective direction sensor elements 311A, 312A, 313A. The direction sensor elements 311A, 312A, 313A further have coils (not illustrated) surrounding the magnetic cores 314A, 315A, 316A respectively. The direction sensor elements 331A, 312A, 313A have a thickness of approximately 80 μm for example.

In the present embodiment, the direction sensor element 311A is supported by the first bottom surface 111A, being mounted by using three first bottom surface pads 211A via solders 351A. Due to this mounting arrangement, the magnetic core 314A of the direction sensor element 311A lies in the direction x.

The direction sensor element 312A is supported by the first inclined side surfaces 112A located at an upper area in the drawing, being mounted by using three first inclined side surface pads 212A via solders 351A. Due to the mounting arrangement as described, the magnetic core 315A of the direction sensor element 312A is perpendicular to the direction x, and along a direction included in a yz plane. This direction is in parallel to the first inclined side surface 112A which supports the direction sensor element 312A.

The direction sensor element 313A is supported by the first inclined side surface 112A located in a lower area in the drawing, being mounted by using three first inclined side surface pads 212A via solders 351A. Due to the mounting arrangement as described, the magnetic core 313A of the direction sensor element 316A is perpendicular to the direction x, and along a direction included in a yz plane. This direction is in parallel to the first inclined side surface 112A which supports the direction sensor element 313A.

The integrated circuit element 330A controls an orientation detection process which involves the three direction sensor elements 311A, 312A, 313A. In the present embodiment, the integrated circuit element 330A is configured as a so called ASIC (Application Specific Integrated Circuit) element, and has a thickness of approximately 80 through 100 μm.

The integrated circuit element 330A is supported by the second bottom surface 121A, being mounted by using the second bottom surface pads 213A via solders 351A. As shown in FIG. 2, the integrated circuit element 330A is mounted by using a plurality of the second bottom surface pads 213A which are disposed in a shape of U, thus being supported by two portions of the second bottom surface 121A which extend in the direction y, and one portion which extends in the direction x. Also, the integrated circuit element, 330A covers most of the first hollow 110A in a plan view. Also in a plan view, the integrated circuit element 330A covers the direction sensor elements 311A, 312A entirely, and overlaps the direction sensor element 313A partially. As shown in FIG. 3 and FIG. 4, the integrated circuit element 330A lies within the second hollow 120A in the direction z.

The orientation detection process by the integrated circuit element 330A using the direction sensor elements 311A, 312A, 313A is performed as follows for example: As has been described, the direction sensor elements 311A, 312A, 313A respectively have the magnetic cores 314A, 315A, 316A each surrounded by a coil which has been described earlier. Since the direction sensor elements 311A, 312A, 313A are mounted in the fashion as has been described, the direction sensor elements 311A, 312A, 313A, or the magnetic cores 314A, 315A, 316A lie along different, directions from each other. The directions along which these magnetic cores 314A, 315A, 316A lie are known information, which is stored in the integrated circuit, element 330A.

The semiconductor device 1A uses the direction sensor elements 311A, 312A, 313A based on the method disclosed in JP-A 2006-47267 Gazette for example, and detects three-dimensionally (performs three-axis detection) in what attitude the device is with respect to the geomagnetic field. The integrated circuit element 330A outputs results of the direction detection of the semiconductor device 1A autonomously or in response to external command received via the external terminals 221A.

The sealing resin 400A covers the direction sensor elements 311A, 312A, 313A and the integrated circuit element 330A, filling the recess 105A. In the present embodiment, the sealing resin 400A includes a first sealing resin 410A and a second sealing resin 420A.

The first sealing resin 410A primarily fills the first hollow 110A, covering the direction sensor elements 311A, 312A, 313A entirely. However, the first sealing resin 410A does not cover the second bottom surface pads 213A or the integrated circuit element 330A.

The second sealing resin 420A fills primarily the second hollow 120A and covers the integrated circuit element 330A entirely. However, the second sealing resin 420A exposes the external terminals 221A. Also, in a plan view, the second sealing resin 420A is at a position slightly receded inward from outer edges of the substrate 100A.

The first sealing resin 410A and the second sealing resin 420A are provided by an epoxy resin, phenol resin, polyimide resin, polybenzoxazole (PBO) resin, silicone resin or the like. The first sealing resin 410A and the second sealing resin 420A may be provided by whichever of a translucent resin and a non-translucent resin. In the present embodiment, however, non-translucent resin is preferred.

Next, a method for manufacturing the semiconductor device 1A will be described with reference to FIG. 6 through FIG. 24. These figures show sections in a yz plane, taken in lines in III-III in FIG. 2.

Figure 6:
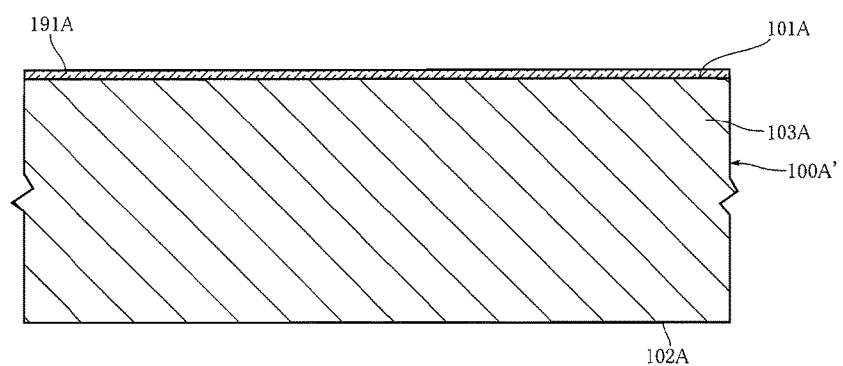
FIG. 6 is a sectional view of a primary portion, showing an example of a method of making the semiconductor device in FIG. 1.

First, as shown in FIG. 6, a substrate material 100A' is prepared. The substrate material 100A' is a monocrystal semiconductor material, and in the present embodiment is made of monocrystal Si. The substrate material 100A' has a thickness of approximately 700 μm for example. The substrate material 100A' is large enough in size to take a plurality of the substrates 100A for manufacture of the semiconductor devices 1A described thus far. Specifically, manufacturing steps to be described hereinafter assume that a plurality of the semiconductor devices 1A will be made simultaneously. The method could be used to make only one semiconductor device 1A, but making a plurality of the semiconductor devices 1A is realistic when considering industrial efficiency into account.

The substrate material 100A' has a main surface 101A and a back surface 102A which face away from each other in the direction z. In the present embodiment, the main surface 101A is provided by a (100) surface, i.e., a surface which has a crystal orientation (100). Next, the main surface 101A is oxidized for example, to form a mask layer 191A of $SiO_2$. The mask layer 191A has a thickness of approximately 0.7 through 1.0 μm for example.

Figure 7:
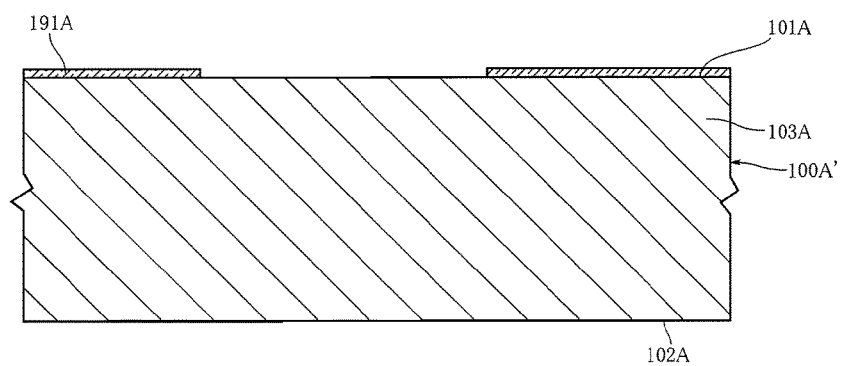
FIG. 7 is a sectional view of a primary portion, showing an example of a method of making the semiconductor device in FIG. 1.

Next, as shown in FIG. 7, the mask layer 191A is patterned by etching for example. Through this patterning, a square opening, for example, is formed in the mask layer 191A. The shape and size of this opening depend upon the shape and size of the first hollow 110A to be obtained.

Figure 8:
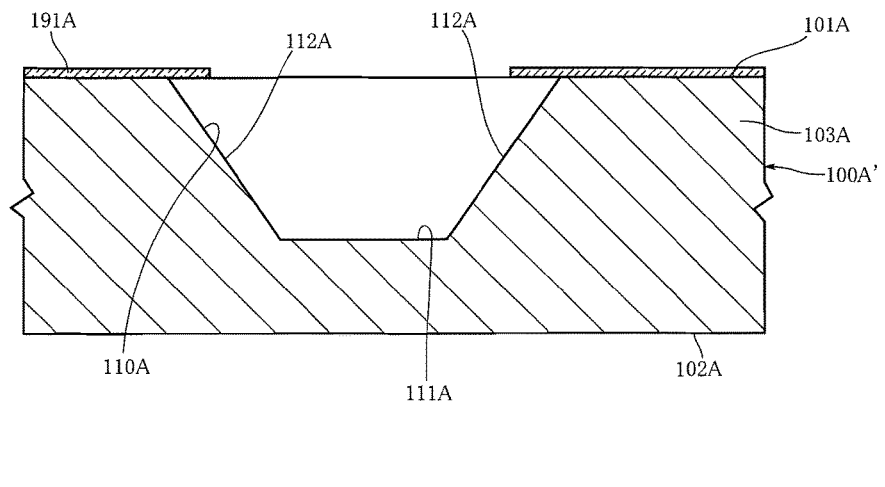
FIG. 8 is a sectional view of a primary portion, showing an example of a method of making the semiconductor device in FIG. 1.
Figure 9:
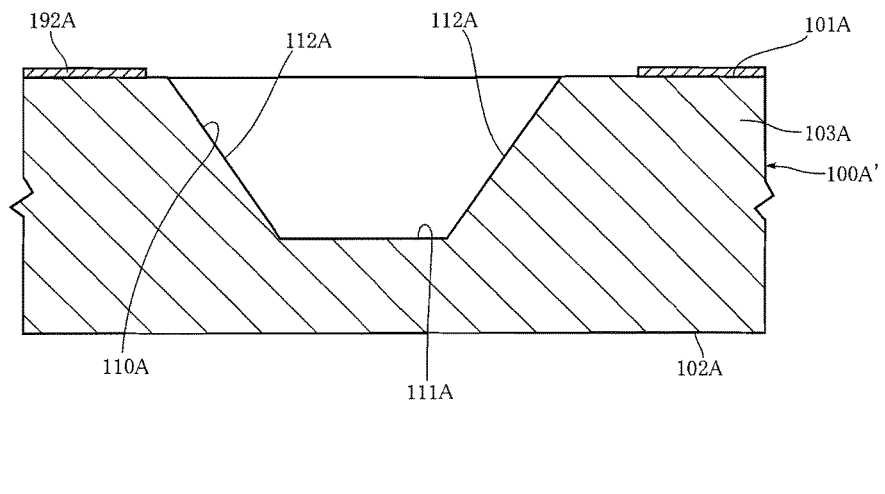
FIG. 9 is a sectional view of a primary portion, showing an example of a method of making the semiconductor device in FIG. 1.

Next, as shown in FIG. 8, the first hollow 110A is formed. The first hollow 110A is formed by means of anisotropic etching with KOH. KOH is an example of an alkaline etchant capable of making good anisotropic etching to monocrystal Si. Through the anisotropic etching, the first hollow 110A is formed which has the first bottom surface 111A and four first inclined side surfaces 112A. The first inclined side surfaces 112A are angled to an xy plane by approximately 55 degrees.

Next, the mask layer 191A is patterned further, whereby a mask layer 192A is formed. The mask layer 192A has a larger opening area than the mask layer 191A. This opening is rectangular for example. The shape and size of this opening depend upon the shape and size of the second hollow 120A to be obtained.

Figure 10:
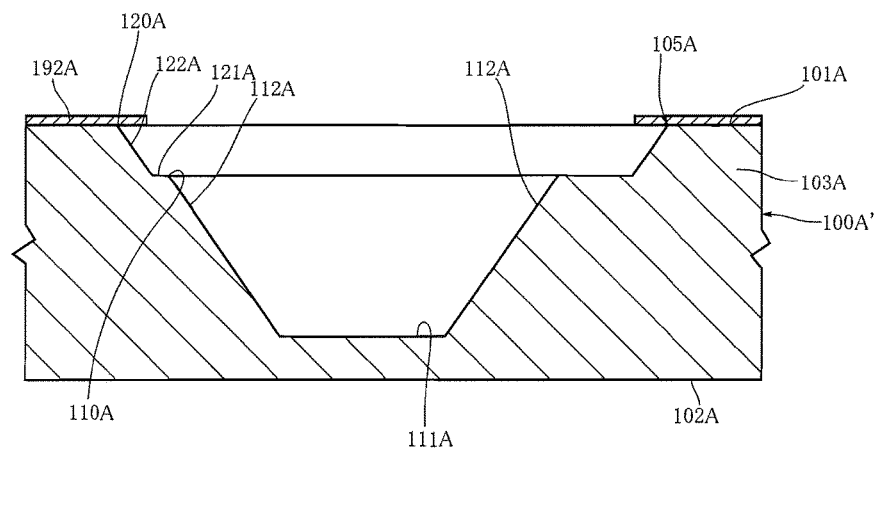
FIG. 10 is a sectional view of a primary portion, showing an example of a method of making the semiconductor device in FIG. 1.

Next, as shown in FIG. 10, the recess 105A is formed. The recess 105A is formed by means of anisotropic etching with the above-described KOH. This anisotropic etching increases the depth and size of the first hollow 110A while newly forming the second hollow 120A. The second hollow 120A has the second bottom surface 121A and four second inclined side surfaces 122A, surrounding the first hollow 110A. The second inclined side surfaces 122A are inclined by approximately 55 degrees with respect to an xy plane, like the first inclined side surfaces 112A. Through these two cycles of anisotropic etching as described, there is formed the recess 105A which has a two-step structure provided by the first hollow 110A and the second hollow 120A. In the present embodiment, the first hollow 110A has a depth of approximately 440 μm whereas the second hollow 120A has a depth of approximately 120 μm.

Figure 11:
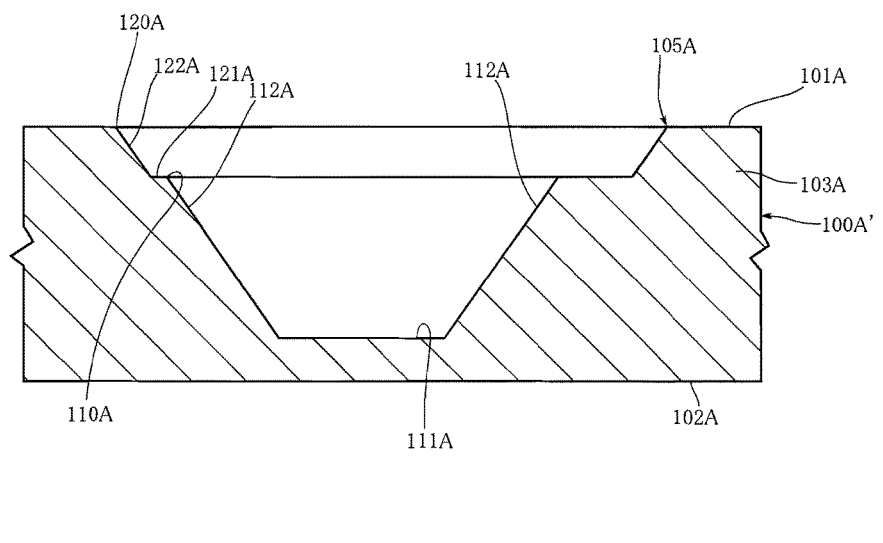
FIG. 11 is a sectional view of a primary portion, showing an example of a method of making the semiconductor device in FIG. 1.

Next, as shown in FIG. 11, the mask layer 192A is removed. The removal is achieved by, e.g., etching with HF.

Figure 12:
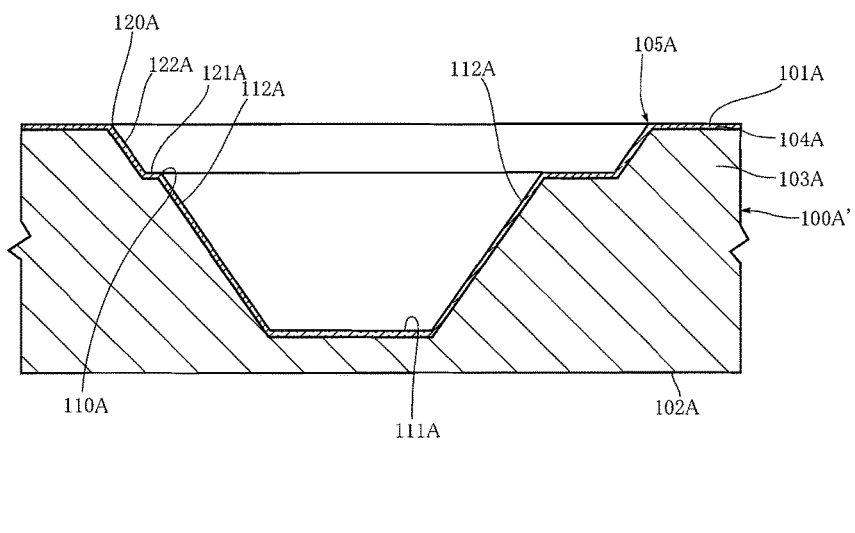
FIG. 12 is a sectional view of a primary portion, showing an example of a method of making the semiconductor device in FIG. 1.

Next, as shown in FIG. 12, an insulation layer 104A of $SiO_2$ for example, is formed. The insulation layer 104A is formed by oxidizing all surface areas which face away from the back surface 102A in the substrate material 100A'. This creates the insulation layer 104A which has a thickness of approximately 0.7 through 1.0 μm for example.

Figure 13:
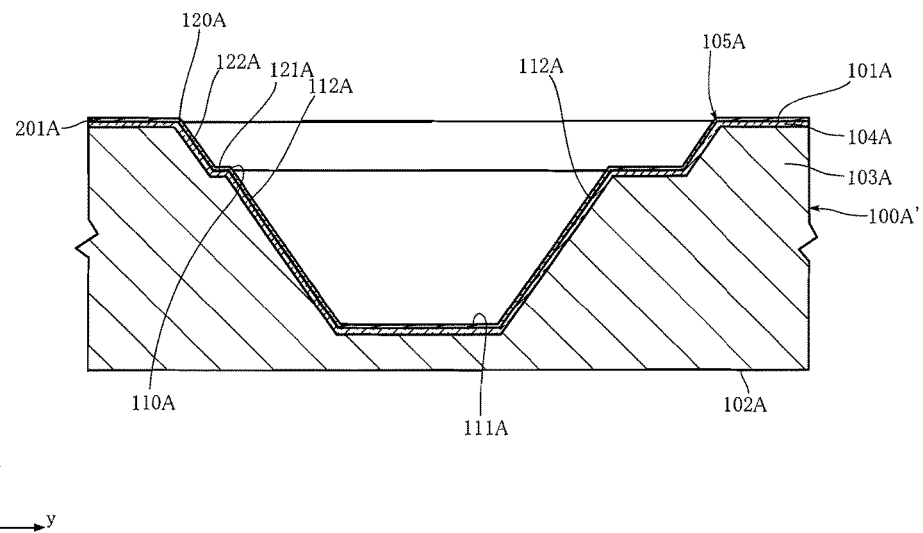
FIG. 13 is a sectional view of a primary portion, showing an example of a method of making the semiconductor device in FIG. 1.

Next, as shown in FIG. 13, a barrier-seed layer 201A is formed. The barrier-seed layer 201A is formed by spattering for example. Specifically, a layer of Ti is formed by spattering on the insulation layer 104A. The layer of Ti will serve as a barrier layer. Next, a layer of Cu is formed on the barrier layer by spattering. The layer of Cu will serve as a seed layer. Through the spattering operations as described, the barrier-seed layer 201A is obtained.

Figure 14:
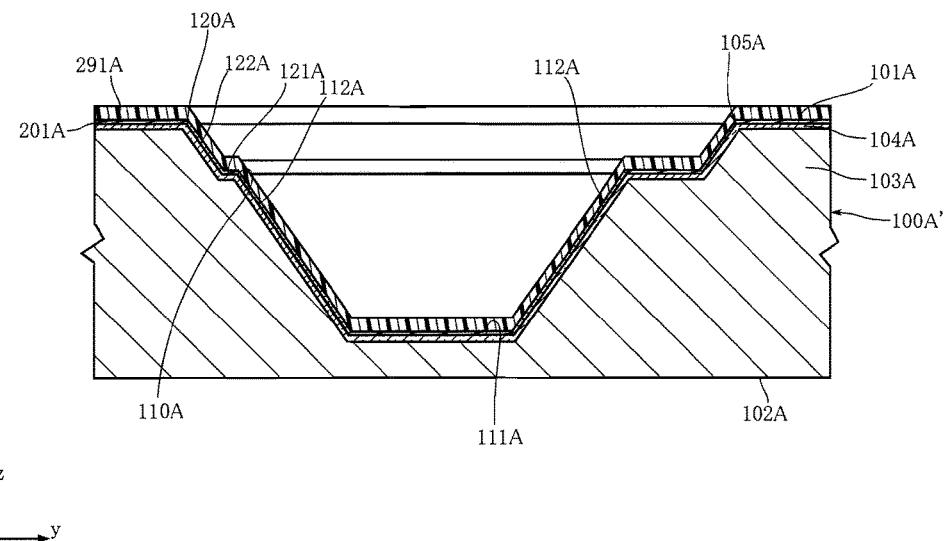
FIG. 14 is a sectional view of a primary portion, showing an example of a method of making the semiconductor device in FIG. 1.

Next, as shown in FIG. 14, a mask layer 291A is formed. The mask layer 291A is formed by spraying a photosensitive resist resin for example.

Figure 15:
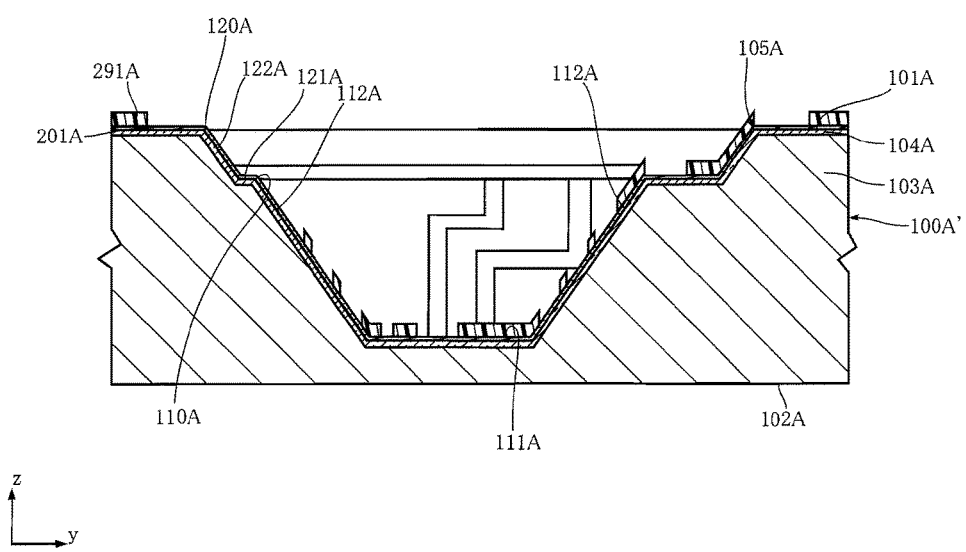
FIG. 15 is a sectional view of a primary portion, showing an example of a method of making the semiconductor device in FIG. 1.

Next, as shown in FIG. 15, patterning is made to the mask layer 291A. The patterning is achieved by photorithographic technique of exposure and development, for example, performed to the mask layer 291A thereby removing predetermined portions. The patterning shapes the mask layer 291A into the shape of the wiring layer 200A described earlier. It should be noted here that since the recess 105A has a certain depth, the exposure may be made a plurality of times at different depths of focus of the light.

Figure 16:
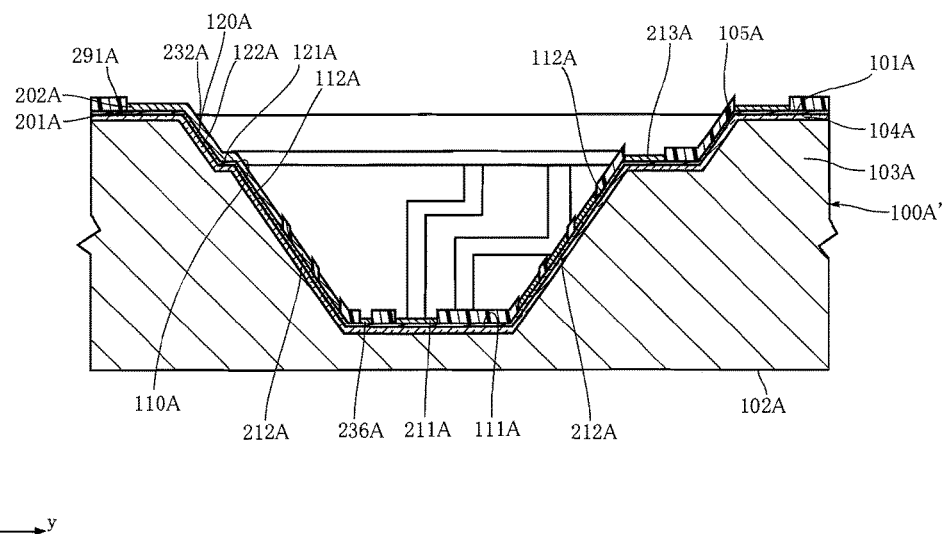
FIG. 16 is a sectional view of a primary portion, showing an example of a method of making the semiconductor device in FIG. 1.

Next, as shown in FIG. 16, a plating layer 202A is formed. The plating layer 202A is formed by electrolytic plating for example, using the seed layer of the barrier-seed layer 201A. As a result, a plating layer 202A of Cu, for example, is obtained. The plating layer 202A has a thickness of approximately 5 μm for example. The plating layer 202A has a shape of the wiring layer 200A described earlier.

Figure 17:
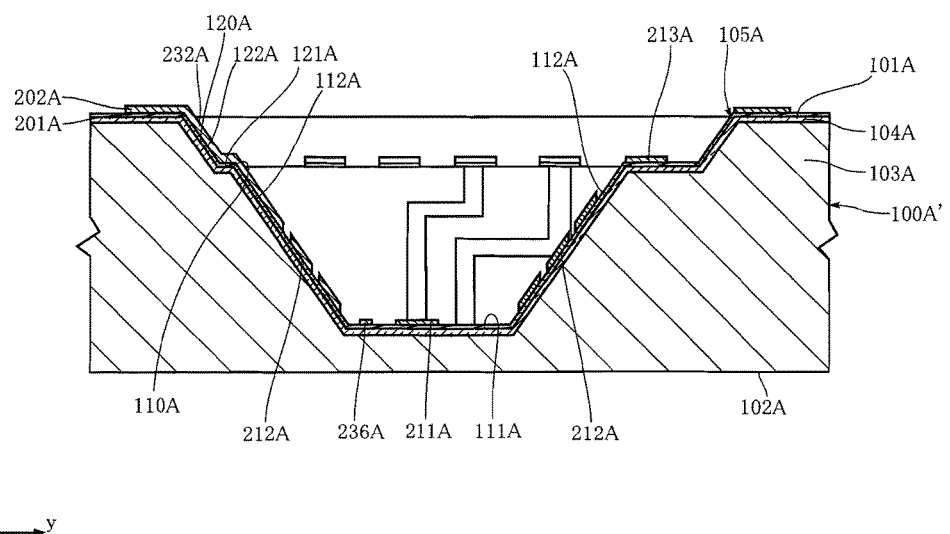
FIG. 17 is a sectional view of a primary portion, showing an example of a method of making the semiconductor device in FIG. 1.
Figure 18:
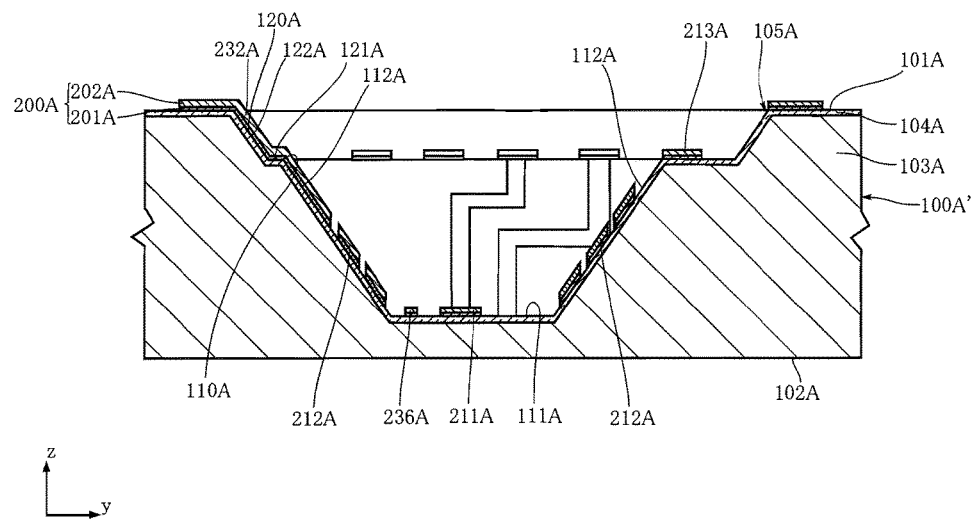
FIG. 18 is a sectional view of a primary portion, showing an example of a method of making the semiconductor device in FIG. 1.

Next, as shown in FIG. 17, the mask layer 291A is removed. Next, as shown in FIG. 18, part of the barrier-seed layer 201A, or the part exposed from the plating layer 202A, is removed. The removal of the barrier-seed layer 201A is achieved by wet etching for example. Thus, there is obtained the wiring layer 200A provided by the patterned set of barrier-seed layer 201A and plating layer 202A.

Figure 19:
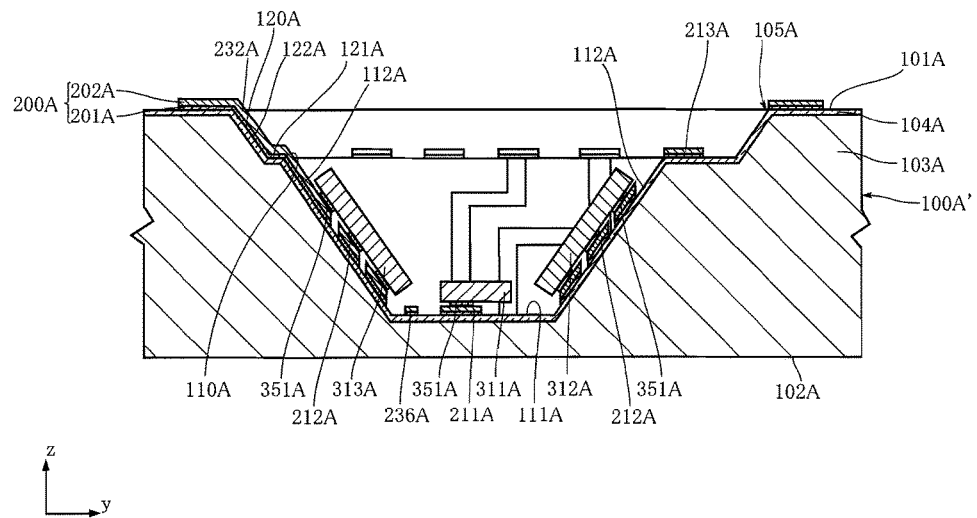
FIG. 19 is a sectional view of a primary portion, showing an example of a method of making the semiconductor device in FIG. 1.

Next, as shown in FIG. 19, direction sensor elements 311A, 312A, 313A are mounted. Before this step, the direction sensor elements 311A, 312A, 313A are formed with solder balls which will later become the solders 351A. Also, flux is applied to these solder balls. Then, by using viscosity of the flux, the direction sensor element 311A is mounted on the first bottom surface 111A, and the direction sensor elements 312A, 313A are mounted on the first inclined side surfaces 112A. Thereafter, the solder balls are melted and then set in a reflow furnace, whereby the mounting of the direction sensor elements 311A, 312A, 313A is complete.

Figure 20:
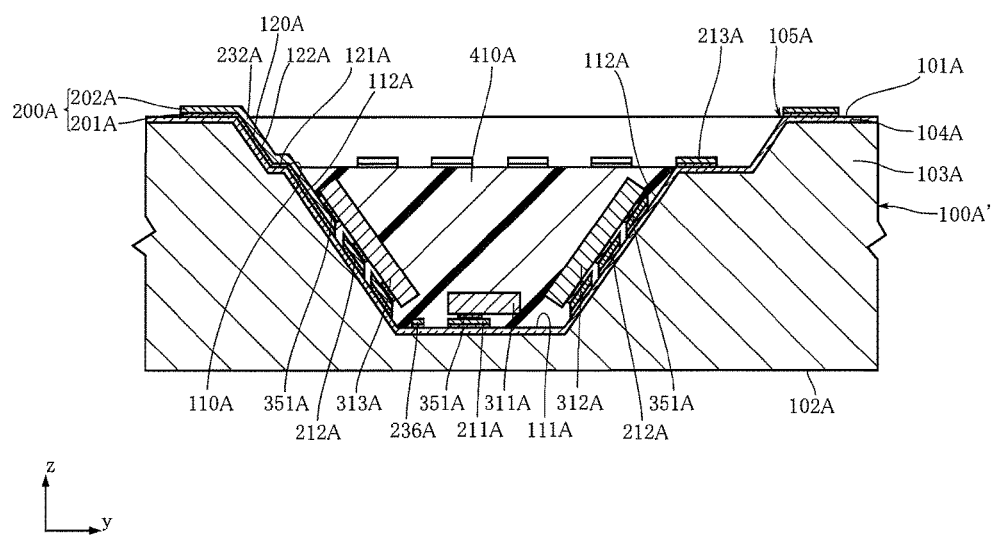
FIG. 20 is a sectional view of a primary portion, showing an example of a method of making the semiconductor device in FIG. 1.

Next, as shown in FIG. 20, the first sealing resin 410A is formed. The formation of the first sealing resin 410A is achieved, for example, by filling a photo-setting resin material which is superior in permeability, primarily into the first hollow 110A and letting the resin material set. In this step, all of the direction sensor elements 311A, 312A, 313A are covered with the resin material. On the other hand, the second bottom surface pads 213A of the second bottom surface 121A need be kept exposed. Examples of the material for formation of the first sealing resin 410A include epoxy resin, phenol resin, polyimide resin, polybenzoxazole (PBO) resin and silicone resin. The first sealing resin 410A may be provided by whichever of a translucent resin and a non-translucent resin. In the present embodiment, however, non-translucent resin is preferred.

Figure 21:
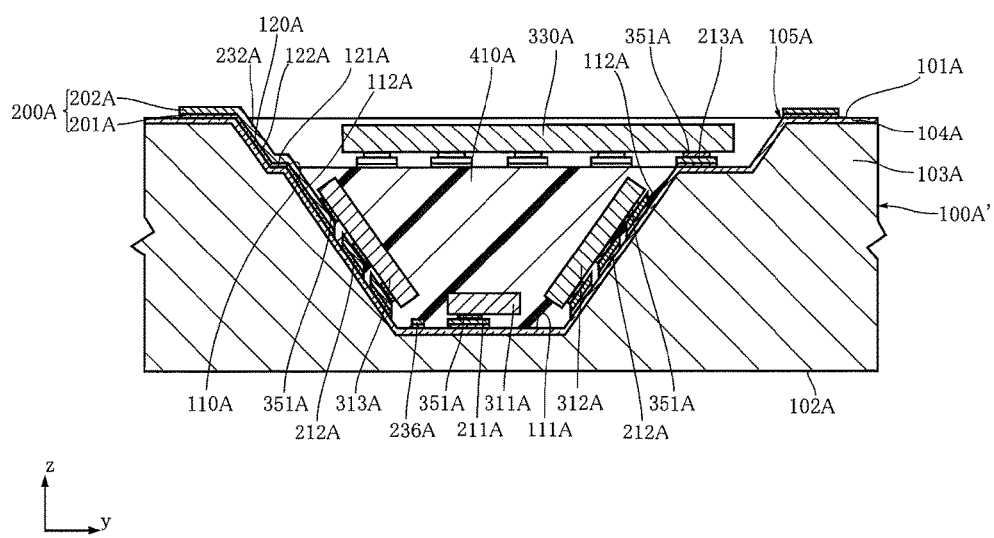
FIG. 21 is a sectional view of a primary portion, showing an example of a method of making the semiconductor device in FIG. 1.

Next, as shown in FIG. 21, an integrated circuit element 330A is mounted. Before this step, the integrated circuit element 330A is formed with solder balls which will later become the solders 351A. Also, flux is applied to these solder balls. Then, by using viscosity of the flux, the integrated circuit element 330A is placed on the second bottom surface 121A. Thereafter, the solder balls are melted and then set in a reflow furnace, whereby the mounting of the integrated circuit element 330A is complete.

Figure 22:
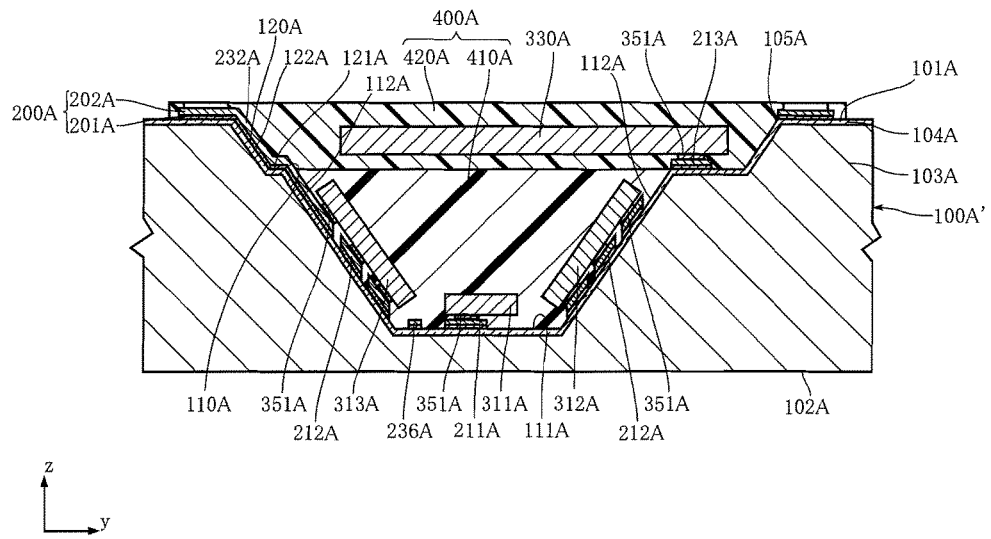
FIG. 22 is a sectional view of a primary portion, showing an example of a method of making the semiconductor device in FIG. 1.

Next, as shown in FIG. 22, the second sealing resin 420A is formed. The formation of the second sealing resin 420A is achieved, for example, by filling a photo-setting resin material which is superior in permeability, primarily into the second hollow 120A and letting the resin material set. In this step, the integrated circuit element 330A is covered entirely by using the resin material. On the other hand, part of the plating layer 202A on the main surface 101A need be kept exposed. Also, the second sealing resin 420A is not to cover cut-off regions which will be described later. Examples of the material for formation of the second sealing resin 420A include epoxy resin, phenol resin, polyimide resin, polybenzoxazole (PBO) resin and silicone resin. The second sealing resin 420A may be provided by whichever of a translucent resin and a non-translucent resin. In the present embodiment, however, non-translucent resin is preferred.

Figure 23:
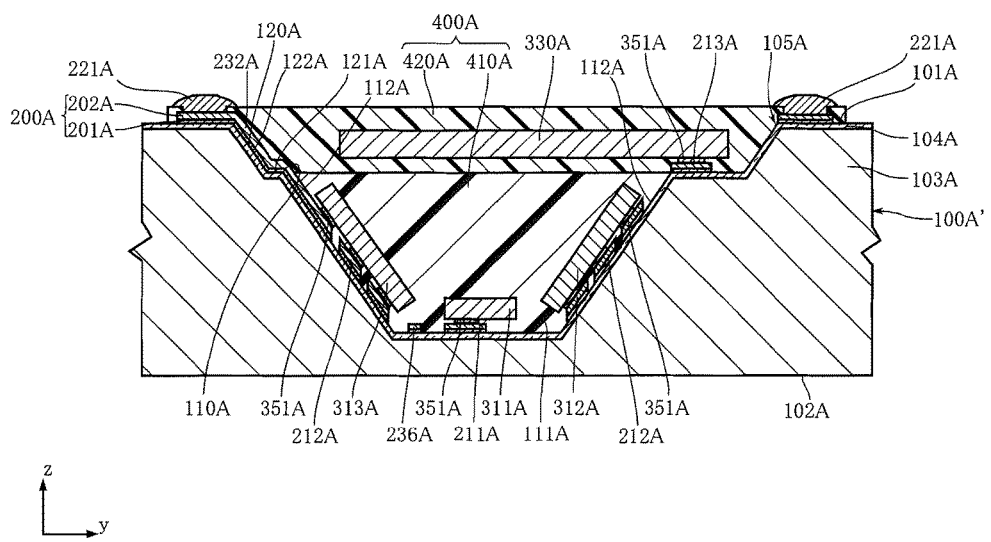
FIG. 23 is a sectional view of a primary portion, showing an example of a method of making the semiconductor device in FIG. 1.

Next, as shown in FIG. 23, non-electrolytic plating of a metal such as Ni, Pd, Au is performed on the external terminals 221A to form bumps bulging in the direction z.

Figure 24:
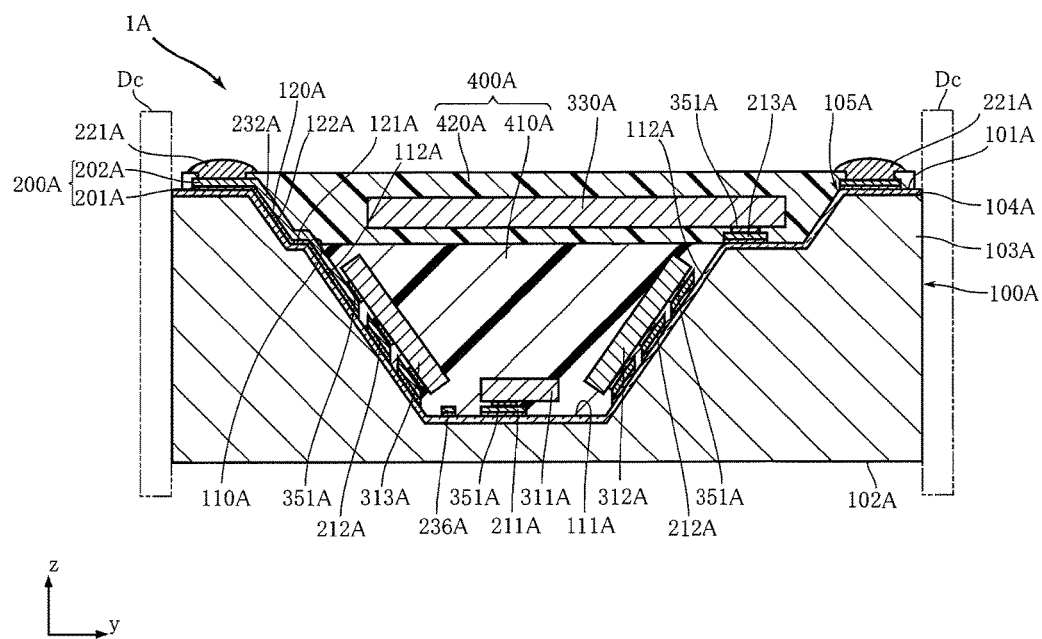
FIG. 24 is a sectional view of a primary portion, showing an example of a method of making the semiconductor device in FIG. 1.

Next, as shown in FIG. 24, the substrate material 100A' is cut with a dicer Dc for example. In this step, the dicer Dc cuts only the substrate material 100A', but not the second sealing resin 420A for example. Through this cutting step, a plurality of the semiconductor device 1A shown in FIG. 1 through FIG. 4 are obtained.

Next, functions of the semiconductor device 1A will be described.

According to the present embodiment, three direction sensor elements 311A, 312A, 313A are embedded in the first hollow 110A of the recess 105A in the substrate 100A of a semiconductor material. Therefore, there is no need for a lead frame which is otherwise necessary to support the three direction sensor elements 311A, 312A, 313A. Compared to a case where the lead frame is formed by using a metal die, the substrate 100A costs less when it need be re-shaped, since it is made of a semiconductor material. Therefore, it is possible to decrease cost of the semiconductor device 1A. The cost reduction is remarkable especially when the semiconductor device 1A is manufactured in a small quantity.

The recess 105A has a two-step structure, having the first hollow 110A and the second hollow 120A. This makes it possible to use the first hollow 110A as a dedicated space for incorporation of the direction sensor elements 311A, 312A, 313A.

The direction sensor elements 312A, 313A are supported by the first inclined side surfaces 112A. This makes it possible to accurately orient the magnetic cores 315A, 316 which represent orientation detection axes for the direction sensor elements 312A, 313A, to known directions. This is advantageous in performing three-axis detection by the semiconductor device 1A at a higher level of accuracy. The direction sensor element 311A is supported by the first bottom surface 111A. This allows the magnetic core 314A of the direction sensor element 311A to be accurately oriented at a different angle from those of the magnetic cores 315A, 316A of the direction sensor elements 312A, 313A. Also, this allows the magnetic core 314A and the magnetic cores 315A, 316A to be placed at relatively large angles to each other. This is advantageous in improving detection accuracy in the semiconductor device 1A.

The substrate 100A is made of a monocrystal material of a semiconductor, as Si being a typical of the semiconductors. This allows the first inclined side surfaces 112A and the second inclined side surfaces 122A to be finished as surfaces accurately inclined by a known predetermined angle with respect to the first bottom surface 111A and the second bottom surface 121A. In particular, by using Si for the substrate 100A and by using a (100) surface as the main surface 101A, it becomes possible that all of the four first inclined side surfaces 112A and the four second inclined side surfaces 122A have an inclination angle of about 55 degrees with respect to the first bottom surface 111A and the second bottom surface 121A. Thus, it is possible to give the semiconductor device 1A a well-balanced shape.

The integrated circuit element 330A is supported by the second bottom surface 121A, and overlaps the first hollow 110A partially in a plan view. This allows the direction sensor elements 311A, 312A, 313A, and the integrated circuit element 330A to be disposed three-dimensionally in the direction z. This makes it possible to achieve both of size reduction and higher functionality in the semiconductor device 1A.

The integrated circuit element 330A is supported by at least two regions of the second bottom surface 121A which sandwich the first hollow 110A in-between. This makes it possible to stably support the integrated circuit element 330A. Further, in the present embodiment, the integrated circuit element 330A is supported by three regions of the second bottom surface 121A. This is well suited in supporting the integrated circuit element 330A stably.

The main surface 101A is formed with external terminals 221A. This allows so called surface mounting of the semiconductor device 1A to be achieved by using the external terminals 221A side (the main surface 101A side) as the mounting side.

The second bottom surface 121A is formed with the second bottom surface pads 213A. This makes it possible to mount the integrated circuit element 330A appropriately in the second bottom surface 121A.

The first bottom surface 111A is formed with the first bottom surface pads 211A, which makes it possible to mount the direction sensor element 311A reliably along the first bottom surface 111A. The first inclined side surfaces 112A are formed with the first inclined side surface pads 212A, which makes it possible to mount the direction sensor elements 312A, 313A reliably along the first inclined side surfaces 112A.

The wiring layer 200A has connection paths 231A, 232A, 234A, 235A, 236A. This makes it possible to provide appropriate continuity between desired components among the external terminals 221A, the second bottom surface pads 213A, the first bottom surface pads 211A and the first inclined side surface pads 212A. The connection paths 231A, 232A are routed via the second inclined side surfaces 122A. This provides appropriate continuity between the external terminals 221A and the second bottom surface pads 213A which are provided on the three-dimensional structure of the substrate 100A, with significantly low risk of discontinuity. The connection paths 234A, 235A, 236A are routed via the first inclined side surfaces 112A. This also provides the advantage of low risk of discontinuity.

The three direction sensor elements 311A, 312A, 313A are covered by the sealing resin 400A. This provides appropriate protection to these direction sensor elements 311A, 312A, 313A. The sealing resin 400A is composed of the first sealing resin 410A and the second sealing resin 420A. This makes it possible to appropriately fill the stepped structure of the recess 105A which is composed of the first hollow 110A and the second hollow 120A.

The first sealing resin 410A is mainly filled into the first hollow 110A. This allows the three direction sensor elements 311A, 312A, 313A to be covered appropriately before the integrated circuit element 330A is mounted. Also, by covering the integrated circuit element 330A with the second sealing resin 420A, the arrangement makes it possible to form a sealing resin 400A to ensure that there is no unintended gap developing between the integrated circuit element 330A and the three direction sensor elements 311A, 312A, 313A. The second sealing resin 420A exposes the external terminals 221A. This ensures easy surface mounting of the semiconductor device 1A while appropriately avoiding such a situation that a circuit substrate, to which the semiconductor device 1A is to be mounted, has undue continuity with the integrated circuit element 330A or the three direction sensor elements 311A, 312A, 313A.

Figure 25:
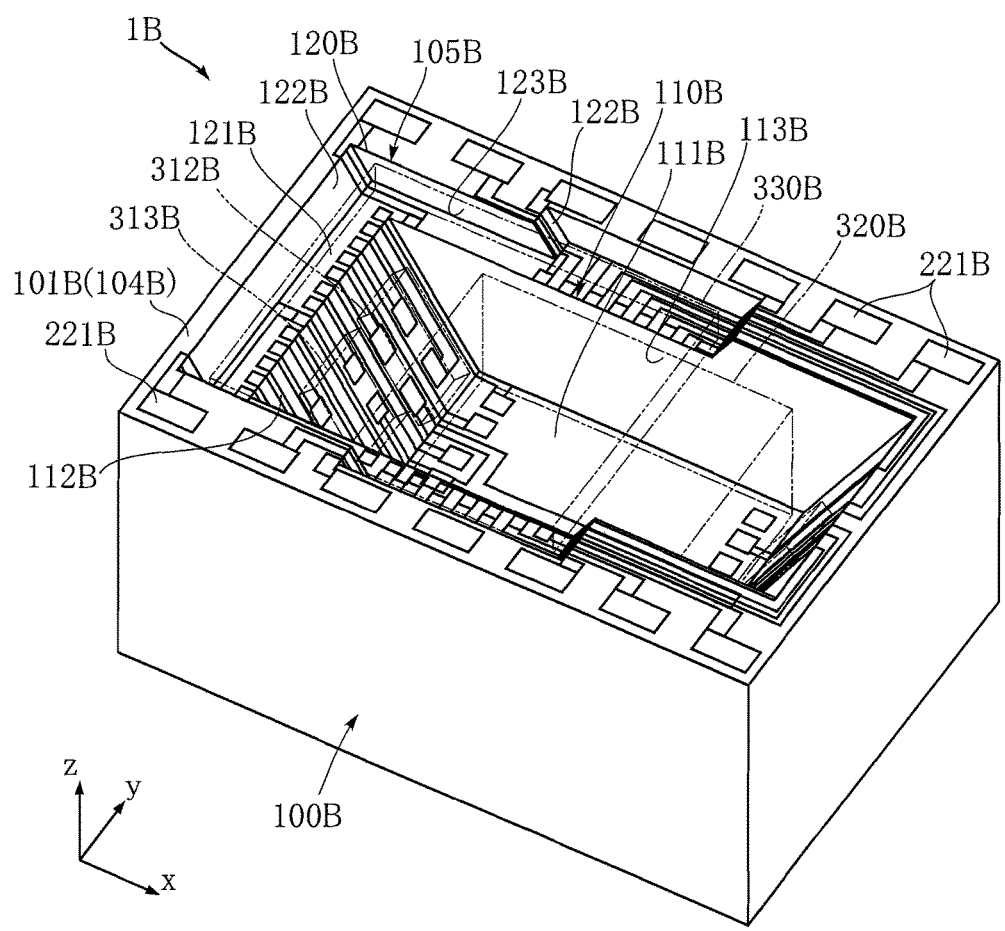
FIG. 25 is a perspective view, showing a primary portion of a semiconductor device according to a second embodiment of the present invention.
Figure 26:
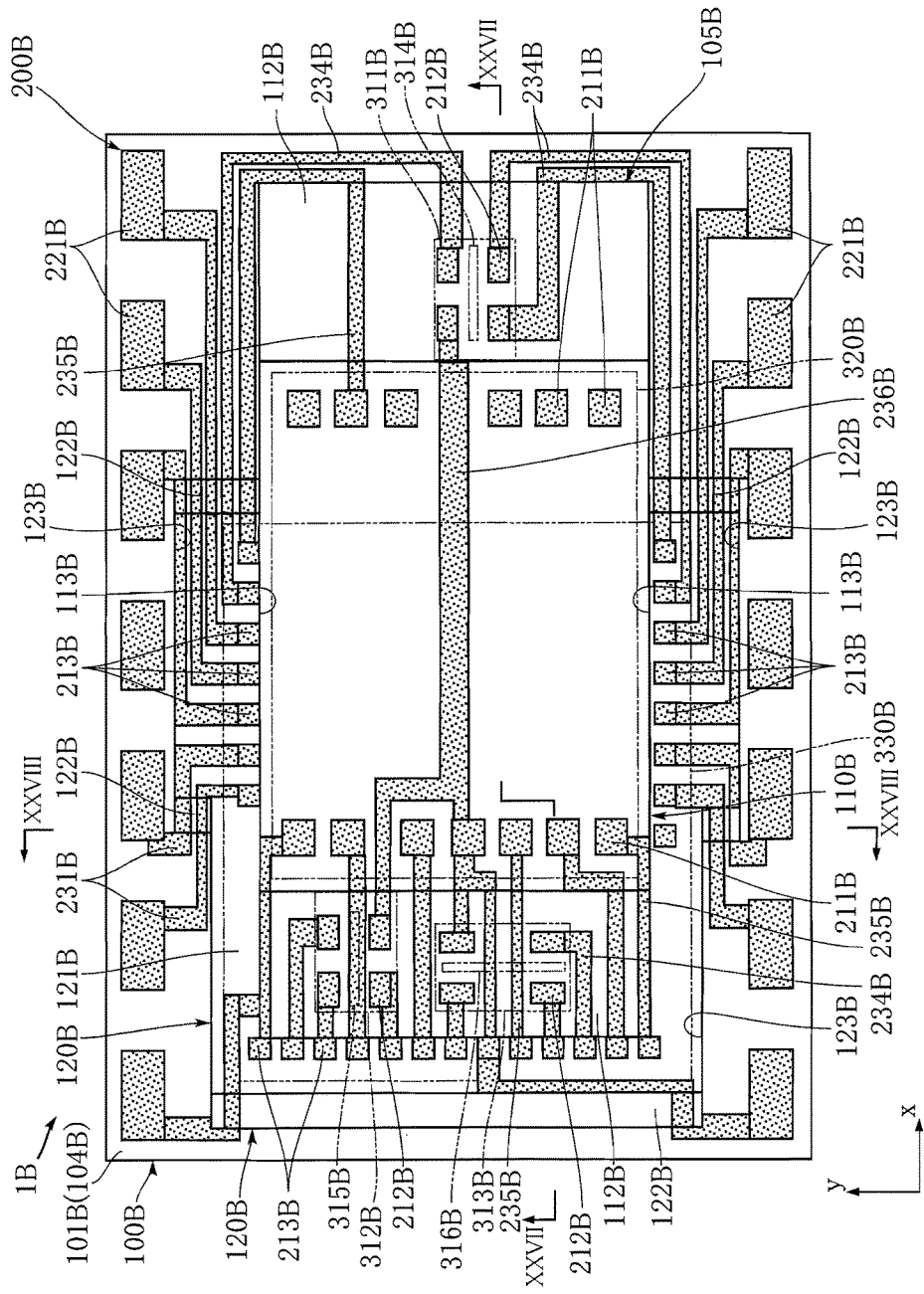
FIG. 26 is a plan view, showing a primary portion of the semiconductor device in FIG. 25.
Figure 27:
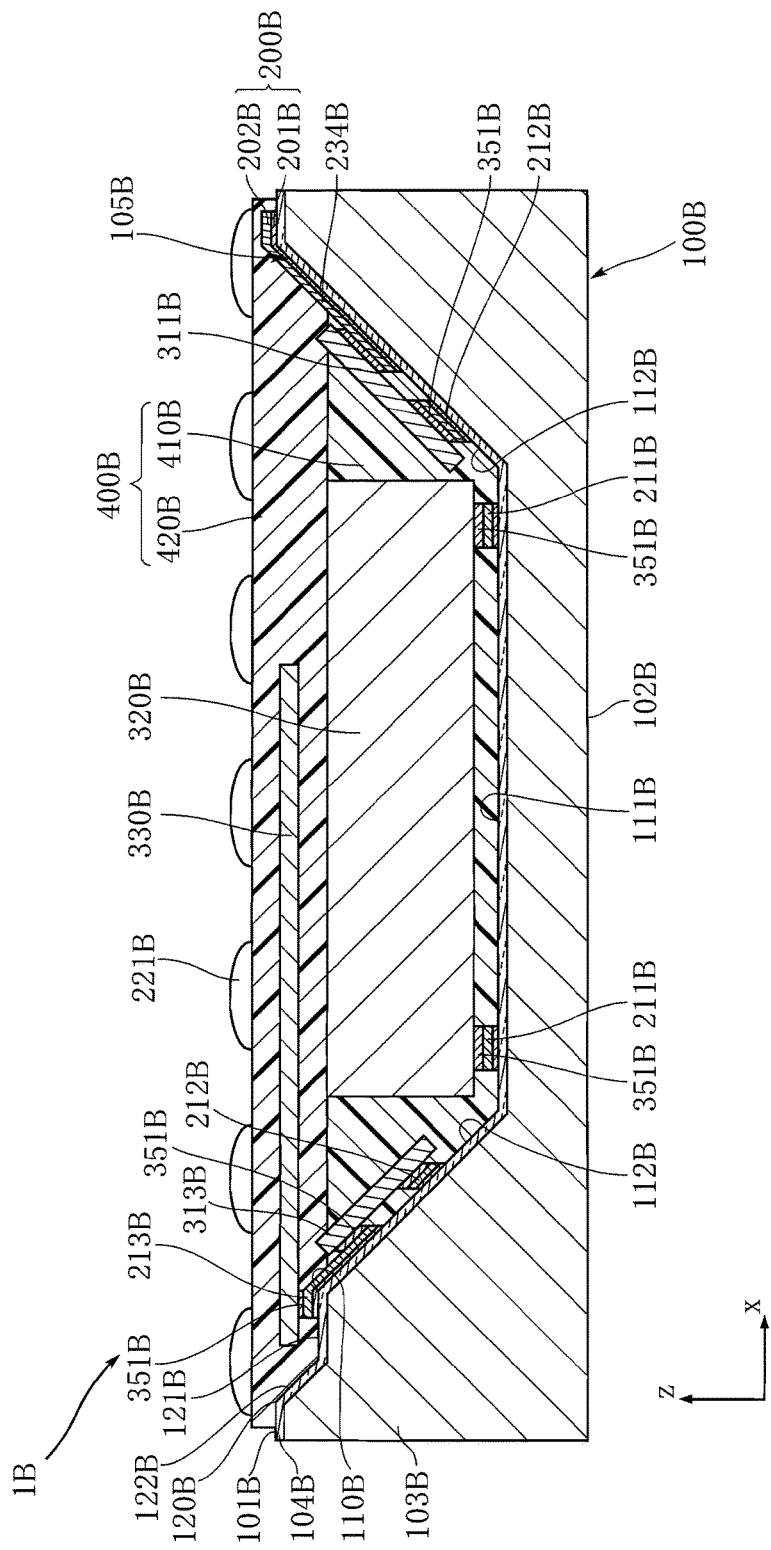
FIG. 27 is a sectional view taken in lines XXVII-XXVII in FIG. 26.
Figure 28:
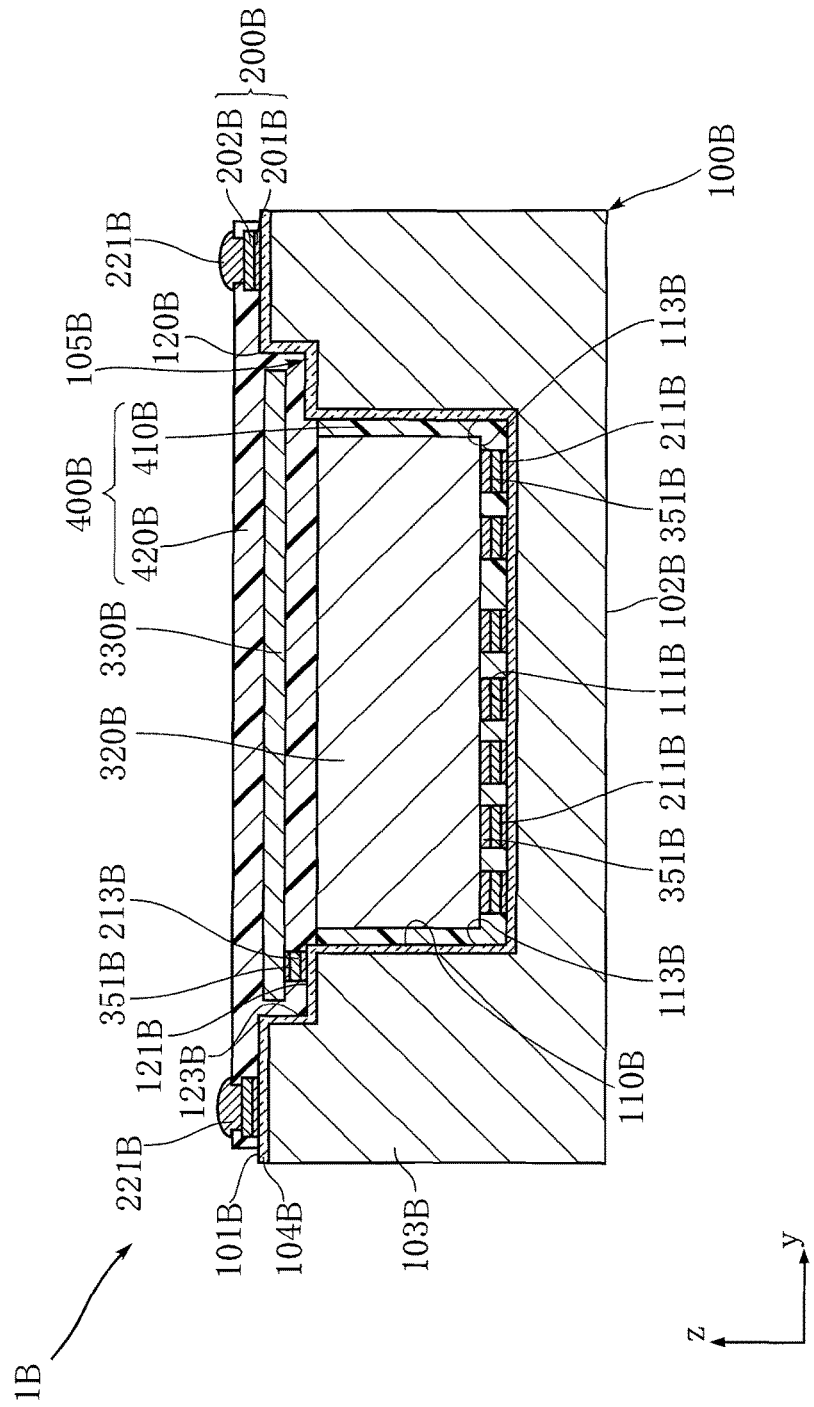
FIG. 28 is a sectional view taken in lines XXVIII-XXVIII in FIG. 26.

FIG. 25 through FIG. 28 show a semiconductor device according to a second embodiment of the present invention. A semiconductor device 1B according to the present embodiment includes a substrate 100B; a wiring layer 200B; three direction sensor elements 311B, 312B, 313B; an acceleration sensor element 320B; an integrated circuit element 330B; and a sealing resin 400B. FIG. 25 and FIG. 26 do not show the sealing resin 400B, and show the three direction sensor elements 311B, 312B, 313B, the acceleration sensor element 320B and the integrated circuit element 330B in imaginary lines for the sake of easier understanding. FIG. 27 is a sectional view in a zx plane, taken in lines XXVII-XXVII in FIG. 26 whereas FIG. 28 is a sectional view in a yz plane, taken in XXVIII-XXVIII in FIG. 26.

The semiconductor device 1B is a surface-mountable orientation-acceleration detection module capable of detecting orientation in three direction and accelerations in three directions, and has an arrangement to be described below. The semiconductor device 1B is approximately 3.52 mm×2.62 mm in size in a plan view, and approximately 0.8 mm in thickness.

The substrate 100B serves as a base of the semiconductor device 1B, and includes a base material 103B and an insulation layer 104B. The substrate 100B has a main surface 101B, a back surface 102B, and a recess 105B. The substrate 100B has a thickness of approximately 750 µm for example. In the present embodiment, the main surface 101B and the back surface 102B face away from each other in a direction z, and the direction z represents a thickness direction of the semiconductor device 1B. A direction x and a direction y are both perpendicular to the direction z.

The base material 103B is of a monocrystal semiconductor material, and in the present embodiment is made of monocrystal Si. The insulation layer 104B is formed of $SiO_2$ in the present embodiment. The material for the base material 103B is not limited to Si, but may be anything as far as it is possible to form the recess 105B which satisfy the intension to be described later. The insulation layer 104B covers those regions on the base material 103B which are exposed on a side away from the back surface 102B. The insulation layer 104B has a thickness of approximately 0.7 through 1.0 µm for example.

Figure 29:
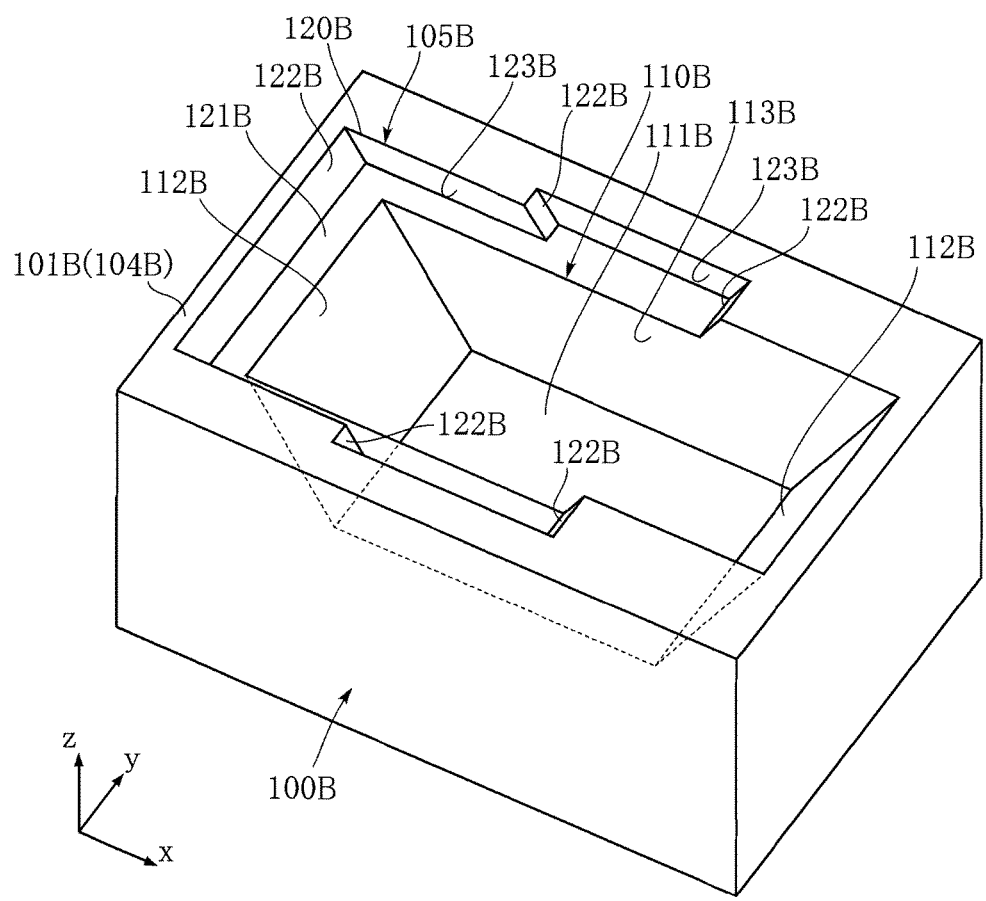
FIG. 29 is a perspective view, showing a substrate of the semiconductor device in FIG. 25.

FIG. 29 is a perspective view of the substrate 100B. In the present embodiment, the main surface 101B is provided by a surface (110) of the base material 103B. The recess 105B recedes from the main surface 101B toward the back surface 102B. In the present embodiment, the recess 105B includes a first hollow 110B and a second hollow 120B. The first hollow 110B is on a side closer to the back surface 102B, and has a first bottom surface 111B, two first inclined side surfaces 112B and two first upright side surfaces 113B. The second hollow 120B is on a side closer to the main surface 101B than is the first hollow 110B, and has a second bottom surface 121B, five second inclined side surfaces 122B and four second upright side surfaces 123B. Shapes of the first hollow 110B and of the second hollow 120B are dependent upon the fact that a (110) surface is used as the main surface 101B.

Since the recess 105B is formed, the main surface 101B is substantially rectangle-annular in a plan view. More specifically, the main surface 101B includes two regions spaced from each other in the direction y with the recess 105B in-between, which are significantly larger than the other two regions spaced from each other in the direction x with the recess 105B in-between. Also, the two portions of the main surface 101B which are spaced from each other in the direction y with the recess 105B in-between are narrowed in their intermediate regions in the direction x.

The first hollow 110B is substantially rectangular in a plan view. The first hollow 110B has a depth of approximately 500 µm for example. The first bottom surface 111B is rectangular in a plan view. The two first inclined side surfaces 112B are substantially rectangular, and sandwich the first bottom surface 111B in the direction x in a plan view. Each of the first inclined side surfaces 112B is inclined with respect to the first bottom surface 111B. In the present embodiment, the first inclined side surfaces 112B is inclined by approximately 45 degrees to an xy plane. The fact that the first inclined side surfaces 112B are substantially rectangular and that the angle described is 45 degrees are dependent upon the fact that a (110) surface is used as the main surface 101B. The two first upright side surfaces 113B, which sandwich the first bottom surface 111B in the direction y in a plan view, are substantially trapezoidal, with their upper bases represented by their sides which are in contact with the first bottom surface 111B. Each of the first upright side surfaces 113B is substantially perpendicular to the first bottom surface 111B, and substantially in parallel to a zx plane. The fact that the first upright side surfaces 113B are substantially trapezoidal and are perpendicular to the first bottom surface 111B is dependent upon the fact that a (110) surface is used as the main surface 101B.

The first hollow 120B is substantially U-shaped in a plan view. The second hollow 120B has a depth of approximately 120 µm for example. The second bottom surface 121B is substantially U-shaped in a plan view, surrounding the first hollow 110B from three directions. Also, the second bottom surface 121B connects to one of the first inclined side surfaces 112B and the two first upright side surfaces 113B. Each of the five second inclined side surfaces 122B is substantially rectangular, in parallel to the direction y and inclined with respect to the direction x and the direction z. As shown in FIG. 29, the five second inclined side surfaces 122B consist of one which is located on the left side in the direction x; and two pairs of mutually opposed surfaces in the direction x. One of the pairs is on an upper side in the direction y while the other pair is on a lower side. Each of the second inclined side surfaces 122B is inclined with respect to the second bottom surface 121B. In the present embodiment, the second inclined side surfaces 122B are inclined by approximately 45 degrees with respect to an xy plane. The fact that the second inclined side surfaces 122B are substantially rectangular and that the angle described is 45 degrees are dependent upon the fact that a (110) surface is used as the main surface 101B. The four second upright side surfaces 123B sandwich the second bottom surface 121B in the direction y in a plan view, and are substantially trapezoidal, with their upper bases represented by their sides which are in contact with the second bottom surface 121B. Each of the second upright side surfaces 123B is substantially perpendicular to the second bottom surface 121B, and substantially in parallel to a zx plane. The fact that the second upright side surfaces 123B are substantially trapezoidal and are perpendicular to the second bottom surface 121B depends upon the fact that a (110) surface is used as the main surface 101B.

In the present embodiment, the first hollow 110B and the second hollow 120B have their respective centers at different locations from each other. As shown in FIG. 26 and FIG. 29, the center of the first hollow 110B is away from the center of the second hollow 120B in the direction x. Further, in the present embodiment, part of the first hollow 110B extends outward from the second hollow 120B in the direction x.

The wiring layer 200B is for mounting the three direction sensor elements 311B, 312B, 313B; the acceleration sensor element 320B; and the integrated circuit element 330B, and providing electric-current paths for input to/output from these elements. The wiring layer 200B is formed on the insulation layer 104B, and in the present embodiment, constituted by a barrier-seed layer 201B and a plating layer 202B laminated thereon.

The barrier-seed layer 201B serves as a so called foundation layer for formation of a desired plating layer 202B, and is formed on the insulation layer 104B. The barrier-seed layer 201B is composed of a Ti layer as a barrier layer, for example, formed on the insulation layer 104B; and a Cu layer serving as a seed layer formed in lamination on the barrier layer. The barrier-seed layer 201B is formed by spattering for example.

The plating layer 202B, which is made of Cu for example, is formed by means of electrolysis plating using the barrier-seed layer 201B. The plating layer 202B has a thickness of approximately 5 μm for example.

In the present embodiment, the wiring layer 200B has first bottom surface pads 211B, first inclined side surface pads 212B, second bottom surface pads 213B, external terminals 221B and connection paths 231B, 234B, 235B, 236B.

The first bottom surface pads 211B are formed on the first bottom surface 110B in the first hollow 111B, and are rectangular for example. In the present embodiment, a plurality of the first bottom surface pads 211B are disposed in two rows in the direction y. These rows are disposed adjacently to two ends of the first bottom surface 111B in the direction x. In the present embodiment, the first bottom surface pads 211B are used to mount the acceleration sensor element 320B.

The first inclined side surface pads 212B are formed on the first inclined side surfaces 112B in the first hollow 110B, and are rectangular for example. In the present embodiment, the two first inclined side surfaces 112B are spaced from each other by the first bottom surface 111B in the direction x. One of the two first inclined side surfaces 112B is formed with four first inclined side surface pads 212B whereas the other is formed with eight first inclined side surface pads 212B. Also, the first inclined side surface pads 212B are disposed in groups of four, with each of the four placed at a position corresponding to a corner of a rectangle. In the present embodiment, the first inclined side surface pads 212B are used to mount the direction sensor elements 311B, 312B, 313B.

The second bottom surface pads 213B are formed on the second bottom surface 120B in the second hollow 121B, and are rectangular for example. In the present embodiment, a plurality of the second bottom surface pads 213B are formed on the two regions which are spaced from each other in the direction y with the first hollow 110B in-between, and on one region which is on one side in the direction x with respect to the first hollow 110B. More specifically, two arrays of the second bottom surface pads 213B arranged in the direction x are spaced from each other in the direction y, with the first hollow 110B in-between. Also, between these two arrays of the second bottom surface pads 213B, an array of the second bottom surface pads 213B are disposed in the direction y. Hence, a plurality of the second bottom surface pads 213B are disposed in a generally U-shaped pattern. In the present embodiment, the second bottom surface pads 213B are used to mount the integrated circuit element 330B.

The external terminals 221B are formed on the main surface 101B, and are used to surface-mount the semiconductor device 1B onto a circuit substrate of an unillustrated electronic product for example. In the present embodiment, each of the two regions in the main surface 101B, which are spaced from each other in the direction y with the recess 105B in-between, is formed with seven external terminals 221B. The external terminals 221B are provided by bumps obtained through non-electrolytic plating of a metal such as Ni, Pd, Au on the barrier-seed layer 201B and plating layer 202B. As a result, as shown in FIG. 27 and FIG. 28, the external terminals 221B bulge in the direction z.

The connection paths 231B, 234B, 235B, 236B, constitute pathways for mutual connection between the first bottom surface pads 211B, the first inclined side surface pads 212B, the second bottom surface pads 213B and the external terminals 221B.

The connection paths 231B provide pathways from the main surface 101B to the second bottom surface 121B, connecting mainly the external terminals 221B and the second bottom surface pads 213B with each other. As shown in FIG. 26, in the present embodiment, each connection path 231B is routed via the second inclined side surface 122B in the second hollow 120B, to the second bottom surface 121B. Each connection path 231B has a portion formed on the second inclined side surface 122B, which extends in the direction x in a plan view and is not angled with respect to the direction x. Each of the connection paths 231B is routed via one of the five second inclined side surfaces 122B which is relatively near by, to the second bottom surface 121B.

The connection paths 234B provide pathways from the second bottom surface 121B to the first inclined side surfaces 112B, connecting the second bottom surface pads 213B and the first inclined side surface pads 212B with each other. In the present embodiment, one of the connection paths 234B starts from the second bottom surface pads 213B on the left side in the drawing, and connects directly to the first inclined side surface 112B. On the other hand, other connection paths 234B are routed from the second bottom surface pad 213B on either side of the first hollow 110B in the direction y, via the second bottom surface 121B, the second inclined side surfaces 122B, then the main surface 101B, to the first inclined side surfaces 112B from a right side in the drawing.

The connection paths 235B provide pathways from the second bottom surface 121B, via the first inclined side surfaces 112B, to the first bottom surface 111B, connecting the second bottom surface pads 213B and the first bottom surface pads 211B with each other. In the present embodiment, portions of the connection paths 235B routed across the first inclined side surfaces 112B extend straightly in the direction x in a plan view. Also, some connection paths 235B bend in the first bottom surface 111B.

The connection path 236B provides a pathway from the first inclined side surface 112B to the first bottom surface 111B, connecting the first inclined side surface pads 212B and the first bottom surface pads 211B with each other. In the present embodiment, one connection path 236B extends from one first inclined side surface pads 212B located on the right side in the drawing, to one first bottom surface pad 211B located on the left side in the drawing. This connection path 236B extends straightly in the direction x in both of the first inclined side surface 112B and the first bottom surface 111B.

In the present embodiment, the external terminal 221B located at a lower left place in the drawing serves as a so called grounding terminal. Grounded to this external terminal 221B are the first inclined side surface pads 212B, the first bottom surface pads 211B and the second bottom surface pads 213B.

Also, in the present embodiment, five of the six first bottom surface pads 211B located on the right side in the draining are not connected with any of the external terminals 221B. These first bottom surface pads 211B are intentionally excluded from electric current path design.

Each of the three direction sensor elements 311B, 312B, 313B has a detection reference axis in a direction different from those of the other two, so that they can serve, for example, in detecting the attitude of the semiconductor device 1B with respect to the global magnetic field. As shown in FIG. 26, in the present embodiment, the direction sensor elements 311B, 312B, 313B have magnetic cores 314B, 315B, 316B respectively. Each of the magnetic cores 314B, 315B, 316B is provided by a metal bar extending in a predetermined direction, with their length direction representing the detection reference axes of the respective direction sensor elements 311B, 312B, 313B. The direction sensor elements 311B, 312B, 313B further have coils (not illustrated) surrounding the magnetic cores 314B, 315B, 316B respectively. The direction sensor elements 311B, 312B, 313B have a thickness of approximately 80 μm for example.

In the present embodiment, the direction sensor element 311B is supported by the first inclined side surface 112B located at the right side in the drawing, being mounted by using four first inclined side surface pads 212B via solders 351B. Due to this mounting arrangement, the magnetic core 311B of the direction sensor element 314B lies along the first inclined side surface 112B.

The direction sensor element 312B is supported by the first inclined side surface 112B located in a lower area in the drawing, being mounted by using four first inclined side surface pads 212B via solders 351B. Due to this mounting arrangement, the magnetic core 315B of the direction sensor element 312B lies along the first inclined side surface 112B, and is perpendicular to the direction y.

The direction sensor element 313B is supported by the first inclined side surface 112B located in a lower the drawing, being mounted by using four first inclined side surface pads 212B via solders 351B. Due to this mounting arrangement, the magnetic core 316B of the direction sensor element 313B lies along the first inclined side surface 112B, and is perpendicular to the direction x.

The acceleration sensor element 320B is capable of detecting acceleration in three different directions. The acceleration sensor element 320B is substantially a rectangular parallelepiped in its shape, having an approximate size of 1.75 mm×1.35 mm s 0.5 mm for example. The acceleration sensor element 320B as described above can suitably be provided by a conventional semiconductor product which makes use of so called MEMS (Micro Electro Mechanical System). Depending on its detection principle, the product can be classified into different types such as electrostatic capacitance type, piezoresistance type, gas temperature distribution type, etc.

In the present embodiment, the acceleration sensor element 320B is supported by the first bottom surface 111B. The acceleration sensor element 320B is mounted by using a plurality of the first bottom surface pad 211B via solders 351B.

The integrated circuit element 330B controls an orientation detection process and an acceleration detection process which involves the three direction sensor elements 311B, 312B, 313B and the acceleration sensor element 320B. In the present embodiment, the integrated circuit element 330B is configured as a so called ASIC (Application Specific Integrated Circuit) element, and has a thickness of approximately 80 through 100 μm.

The integrated circuit element 330B is supported by the second bottom surface 121B, being mounted by using the second bottom surface pads 213B via solders 351B. As shown in FIG. 26, the integrated circuit element 330B is mounted by using a plurality of the second bottom surface pads 213B which are disposed in a shape of U, thus being supported by two portions of the second bottom surface 121B which extend in the direction x, and one portion which extends in the direction y. Also, the integrated circuit element 330B covers more than half of the first hollow 110B in a plan view. Also in a plan view, the integrated circuit element 330B covers the direction sensor elements 312B, 313B entirely, and overlaps the direction sensor element 320B partially. As shown in FIG. 27 and FIG. 28, the integrated circuit element 330B lies within the second hollow 120B in the direction z.

The orientation detection process by the integrated circuit element 330B using the direction sensor elements 311B, 312B, 313B is performed as follows for example: As has been described, the direction sensor elements 311B, 312B, 313B respectively have the magnetic cores 314B, 315B, 316B each surrounded by a coil which has been described earlier. Since the direction sensor elements 311B, 312B, 313B are mounted in the fashion as has been described, the direction sensor elements 311B, 312B, 313B, or the magnetic cores 314B, 315B, 316B are along different directions from each other. The directions along which these magnetic cores 314B, 315B, 316B lie are known information and stored in the integrated circuit element 330B.

The semiconductor device 1B uses the direction sensor elements 311B, 312B, 313B based on the method disclosed in JP-A 2006-47267 Gazette for example, and detects three-dimensionally (performs three-axis detection) in what attitude the device is with respect to the geomagnetic field. The integrated circuit element 330B outputs results of the orientation detection of the semiconductor device 1B autonomously or in response to external command received via the external terminals 221B.

The sealing resin 400B covers the direction sensor elements 311B, 312B, 313B, the acceleration sensor element 320B and the integrated circuit element 330B, filling the recess 105B. In the present embodiment, the sealing resin 400B includes a first sealing resin 410B and a second sealing resin 420B.

The first sealing resin 410B primarily fills the first hollow 110B, covering the direction sensor elements 311B, 312B, 313B and the acceleration sensor element 320B almost entirely. However, the first sealing resin 410B does not cover the second bottom surface pads 213B or the integrated circuit element 330B.

The second sealing resin 420B fills primarily the second hollow 120B and covers the integrated circuit element 330B entirely. However, the second sealing resin 420B exposes the external terminals 221B. Also, in a plan view, the second sealing resin 420B is at a position slightly receded inward from outer edges of the substrate 100B.

The first sealing resin 410B and the second sealing resin 420B are provided by, e.g., epoxy resin, phenol resin, polyimide resin, polybenzoxazole (PBO) resin, and silicone resin. The first sealing resin 410B and the second sealing resin 420B may be provided by whichever of a translucent resin and a non-translucent resin. In the present embodiment, however, non-translucent resin is preferred.

Next, functions of the semiconductor device 1B will be described.

According to the present embodiment, three direction sensor elements 311B, 312B, 313B are embedded in the first hollow 110B of the recess 105B in the substrate 100B of a semiconductor material. Therefore, there is no need for a lead frame which is otherwise necessary to support the three direction sensor elements 311B, 312B, 313B. Compared to a case where the lead frame need be formed by using a metal die, the substrate 100B costs less when it need be re-shaped, since it is made of a semiconductor material. Therefore, it is possible to decrease cost of the semiconductor device 1B. The cost reduction is remarkable especially when the semiconductor device 1B is manufactured in a small quantity.

Also, the present embodiment has an acceleration sensor element 320B. Thus, it is possible to perform three-axis acceleration detection in addition to three-axis orientation detection.

The recess 105B has a two-step structure, having the first hollow 110B and the second hollow 120B. This makes it possible to use the first hollow 110B as a dedicated space for incorporation of the direction sensor elements 311B, 312B, 313B and the acceleration sensor element 320B.

The direction sensor elements 311B, 312B, 313B are supported by the first inclined side surfaces 112B. This makes it possible to accurately orient the magnetic cores 314B, 315B, 316B which represent orientation detection axes for the direction sensor elements 311B, 312B, 313B to known directions. This is advantageous in performing three-axis detection by the semiconductor device 1B at a higher level of accuracy. Since the direction sensor element 311B, 312B, 313B are supported on two first inclined side surfaces 112B, it is possible to accurately place the magnetic cores 314B, 315B, 316B at different angles from each other. Also, this allows the magnetic cores 314B, 315B, 316B to be placed at relatively large angles to each other. This is advantageous in improving detection accuracy in the semiconductor device 1B.

The substrate 100B is made of a monocrystal material of a semiconductor, as Si being a typical of the semiconductors. This allows the first inclined side surfaces 112B and the second inclined side surfaces 122B to be finished as surfaces accurately inclined by a known predetermined angle with respect to the first bottom surface 111B and the second bottom surface 121B. In particular, by using Si for the substrate 100B and by using a (110) surface for the main surface 101B, it becomes possible that the two first inclined side surfaces 112B and the five second inclined side surfaces 122B have an inclination angle of about 45 degrees with respect to the first bottom surface 111B and the second bottom surface 121B. Thus, it is possible to give the semiconductor device 1B a well-balanced shape. On the other hand, using a (110) surface as the main surface 101B makes it possible to form the first upright side surfaces 113B and the second upright side surfaces 123B. The first upright side surfaces 113B and the second upright side surfaces 123B are perpendicular to the first bottom surface 111B and the second bottom surface 121B. This is suitable for reducing plan-view dimensions of the semiconductor device 1B.

The integrated circuit element 330B is supported by the second bottom surface 121B, and overlaps the first hollow 110B partially in a plan view. This allows the direction sensor elements 311B, 312B, 313B, the acceleration sensor element 320B, and the integrated circuit element 330B to be disposed three-dimensionally in the direction z. This makes it possible to achieve both of size reduction and higher functionality in the semiconductor device 1B.

The integrated circuit element 330B is supported by at least two regions of the second bottom surface 121B which sandwich the first hollow 110B in-between. This makes it possible to stably support the integrated circuit element 330B. Further, in the present embodiment, the integrated circuit element 330B is supported by three regions of the second bottom surface 121B. This is well suited in supporting the integrated circuit element 330B stably.

The main surface 101B is formed with external terminals 221B. This allows so called surface mounting of the semiconductor device 1B to be achieved by using the external terminals 221B side (the main surface 101B side) as the mounting side.

The second bottom surface 121B is formed with the second bottom surface pads 213B. This makes it possible to mount the integrated circuit element 330B appropriately in the second bottom surface 121B.

The first bottom surface 111B is formed with the first bottom surface pads 211B. This makes it possible to mount the acceleration sensor element 320B reliably along the first bottom surface 111B. The first inclined side surfaces 112B are formed with the first inclined side surface pads 212B. This makes it possible to mount the direction sensor elements 311B, 312B, 313B reliably along the first inclined side surfaces 112B.

The wiring layer 200B has connection paths 231B, 234B, 235B, 236B. This makes it possible to provide appropriate continuity between desired components among the external terminals 221B, the second bottom surface pads 213B, the first bottom surface pads 211B and the first inclined side surface pads 212B. The connection paths 231B are routed via the second inclined side surface 122B. This provides appropriate continuity between the external terminals 221B and the second bottom surface pads 213B which are formed on a three-dimensional structure of the substrate 100B, with significantly low risk of discontinuity. The connection paths 234B, 235B, 236B are routed via the first inclined side surfaces 112B. This also provides the advantage of low risk of discontinuity. The connection paths 231B, 234B, 235B, 236B are not routed via any of the first upright side surfaces 113B and the second upright side surfaces 123B. This further reduces chances for discontinuity.

The three direction sensor elements 311B, 312B, 313B and the acceleration sensor element 320B are covered by the sealing resin 400B. This provides appropriate protection to these direction sensor elements 311B, 312B, 313B and the acceleration sensor element 320B. The sealing resin 400B is composed of the first sealing resin 410B and the second sealing resin 420B. This makes it possible to appropriately fill the stepped structure of the recess 105B which is composed of the first hollow 110B and the second hollow 120B.

The first sealing resin 410B is mainly filled into the first hollow 110B. This allows the three direction sensor elements 311B, 312B, 313B and the acceleration sensor element 320B to be covered appropriately before the integrated circuit element 330B is mounted. Also, by covering the integrated circuit element 330B with the second sealing resin 420B, the arrangement makes it possible to form a sealing resin 400B to ensure that there is no unintended gap developing between the integrated circuit element 330B and the three direction sensor elements 311B, 312B, 313B, and the acceleration sensor element 320B. The second sealing resin 420B exposes the external terminals 221B. This ensures easy surface mounting of the semiconductor device 1B while appropriately avoiding such a situation that a circuit substrate, to which the semiconductor device 1B is to be mounted, has undue continuity with the integrated circuit element 330B, the three direction sensor elements 311B, 312B, 313B or the acceleration sensor element 320B.

Figure 30:
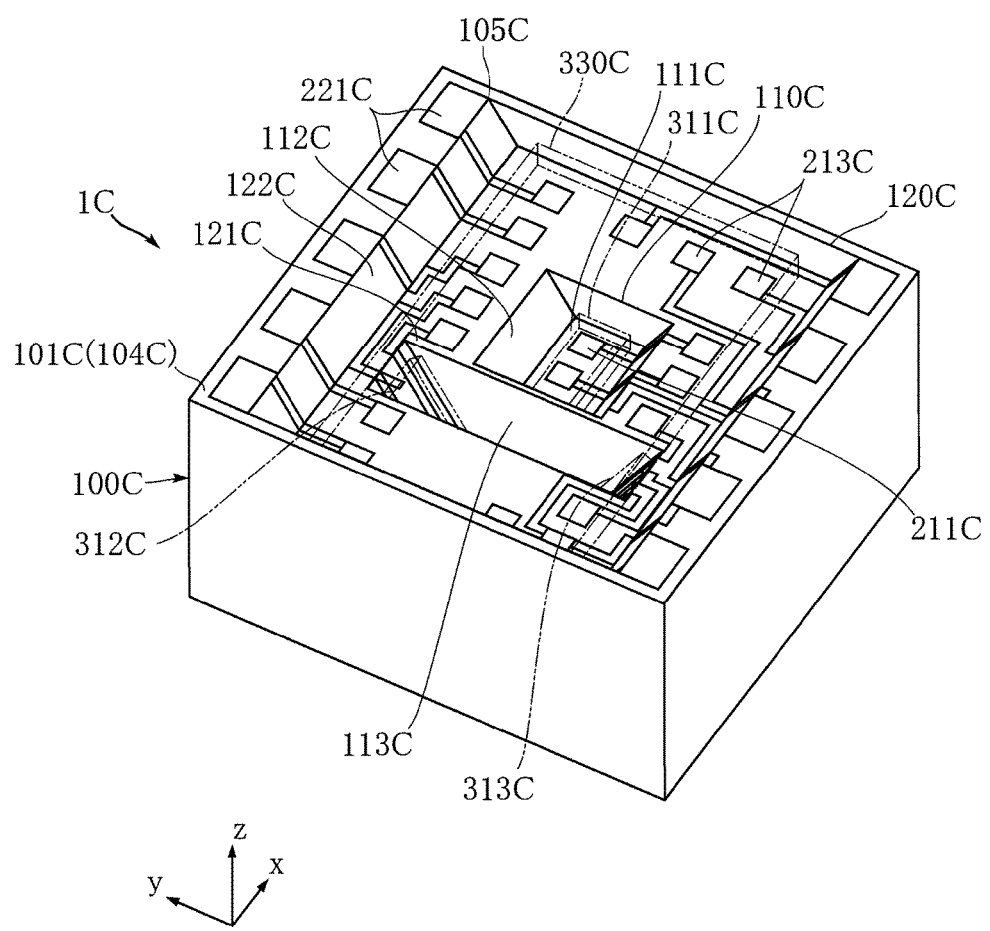
FIG. 30 is a perspective view, showing a primary portion of a semiconductor device according to a third embodiment of the present invention.
Figure 31:
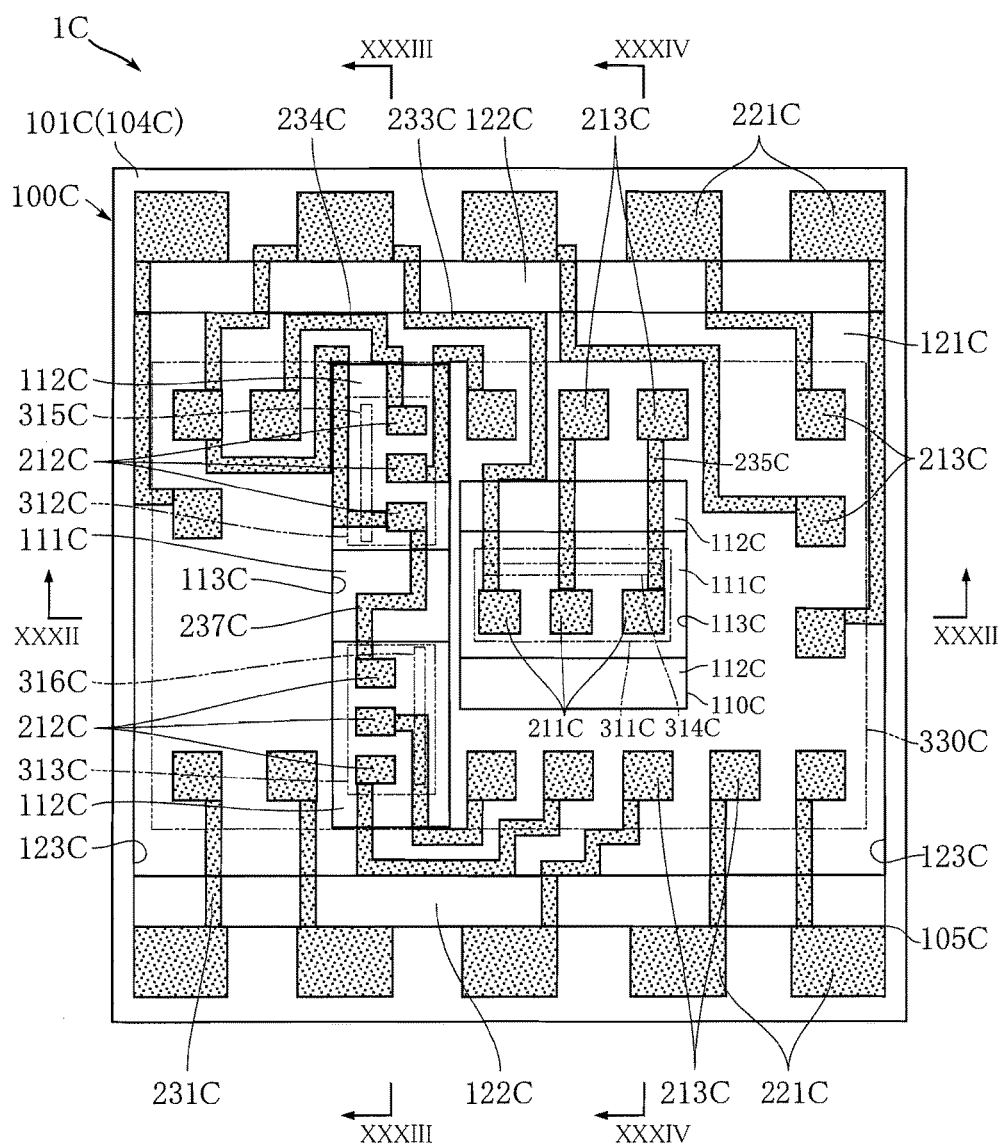
FIG. 31 is a plan view, showing a primary portion of the semiconductor device in FIG. 30.
Figure 32:
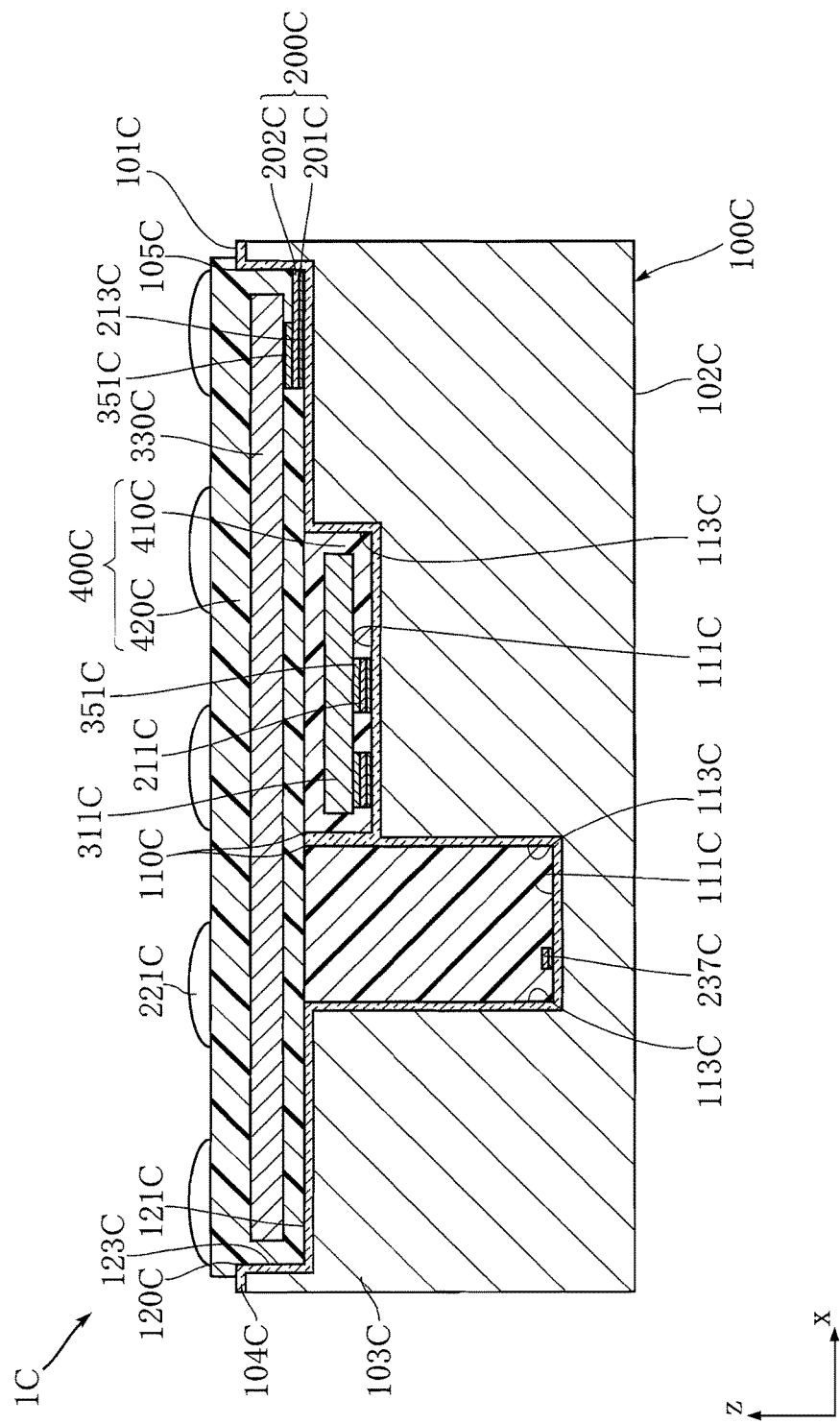
FIG. 32 is a sectional view taken in lines XXXII-XXXII in FIG. 31.
Figure 33:
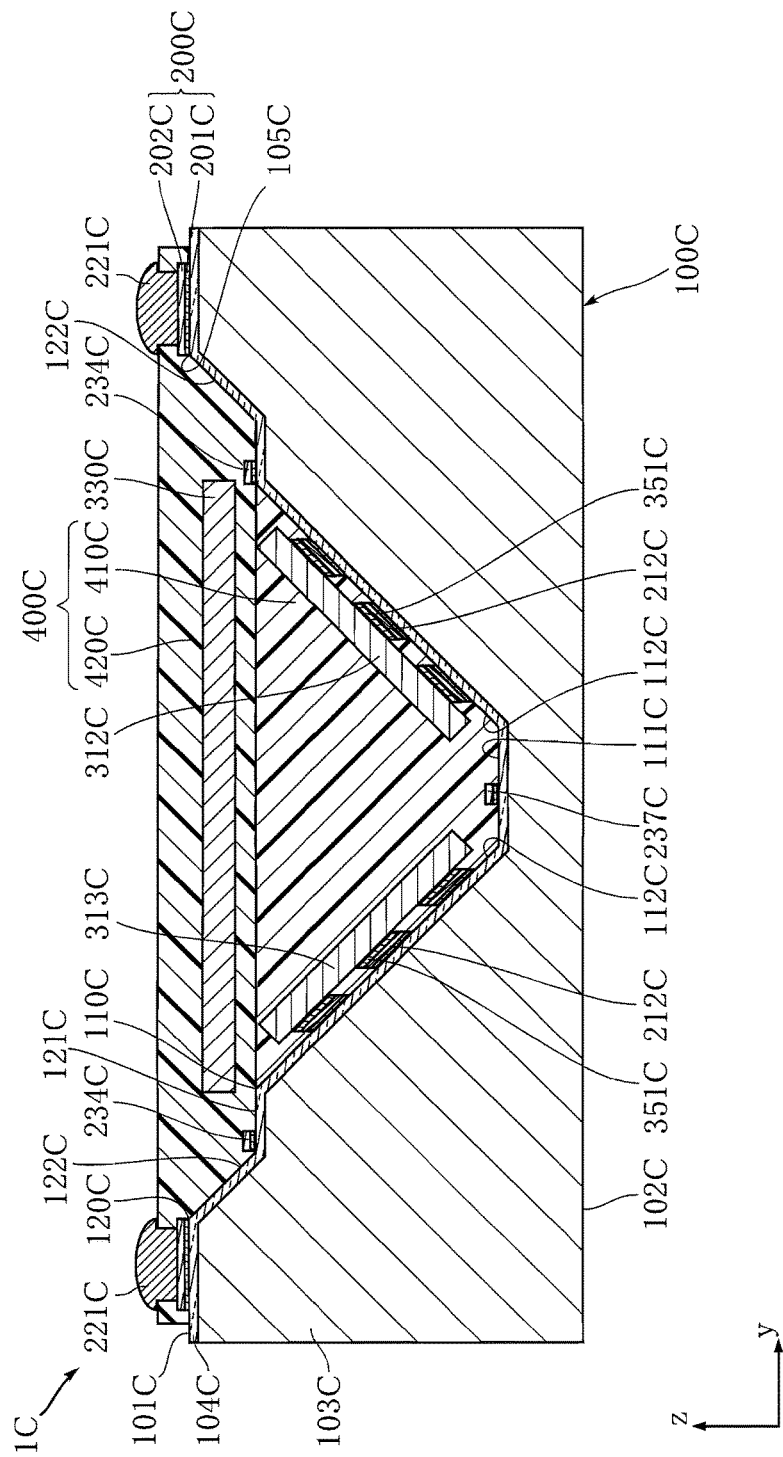
FIG. 33 is a sectional view taken in lines XXXIII-XXXIII in FIG. 31.

FIG. 30 through FIG. 34 show a semiconductor device according to a third embodiment of the present invention. A semiconductor device 1C according to the present embodiment includes a substrate 100C; a wiring layer 200C; three direction sensor elements 311C, 312C, 313C; an integrated circuit element 330C; and a sealing resin 400C. FIG. 30 and FIG. 31 do not show the sealing resin 400C, and show the three direction sensor elements 311C, 312C, 313C and the integrated circuit element 330C in imaginary lines for the sake of easier understanding. FIG. 32 is a sectional view in a zx plane, taken in lines XXXII-XXXII in FIG. 31, FIG. 33 is a sectional view in a yz plane, taken in lines XXXIII-XXXIII in FIG. 31, and FIG. 33 is a sectional view in a yz plane, taken in lines XXXIV-XXXIV in FIG. 31.

The semiconductor device 1C is a surface-mountable orientation detection module capable of detecting orientation in three different directions, and has an arrangement to be described below. As an example, the semiconductor device 1C is approximately 2.02 mm×2.02 mm in size in a plan view, and approximately 0.80 mm in thickness.

The substrate 100C serves as a base of the semiconductor device 1C, and includes a base material 103C and an insulation layer 104C. The substrate 100C has a main surface 101C, a back surface 102C, and a recess 105C. The substrate 100C has a thickness of approximately 750 µm for example. In the present embodiment, the main surface 101C and the back surface 102C face away from each other in a direction z, and the direction z represents a thickness direction of the semiconductor device 1C. A direction x and a direction y are both perpendicular to the direction z.

The base material 103C is of a monocrystal semiconductor material, and in the present embodiment is made of monocrystal Si. The insulation layer 104C is formed of $SiO_2$ in the present embodiment. The material for the base material 103C is not limited to Si, but may be anything as far as it is possible to form the recess 105C which satisfy the intension to be described later. The insulation layer 104C covers those regions on the base material 103C which are exposed on a side away from the back surface 102C. The insulation layer 104C has a thickness of approximately 0.7 through 1.0 µm for example.

Figure 35:
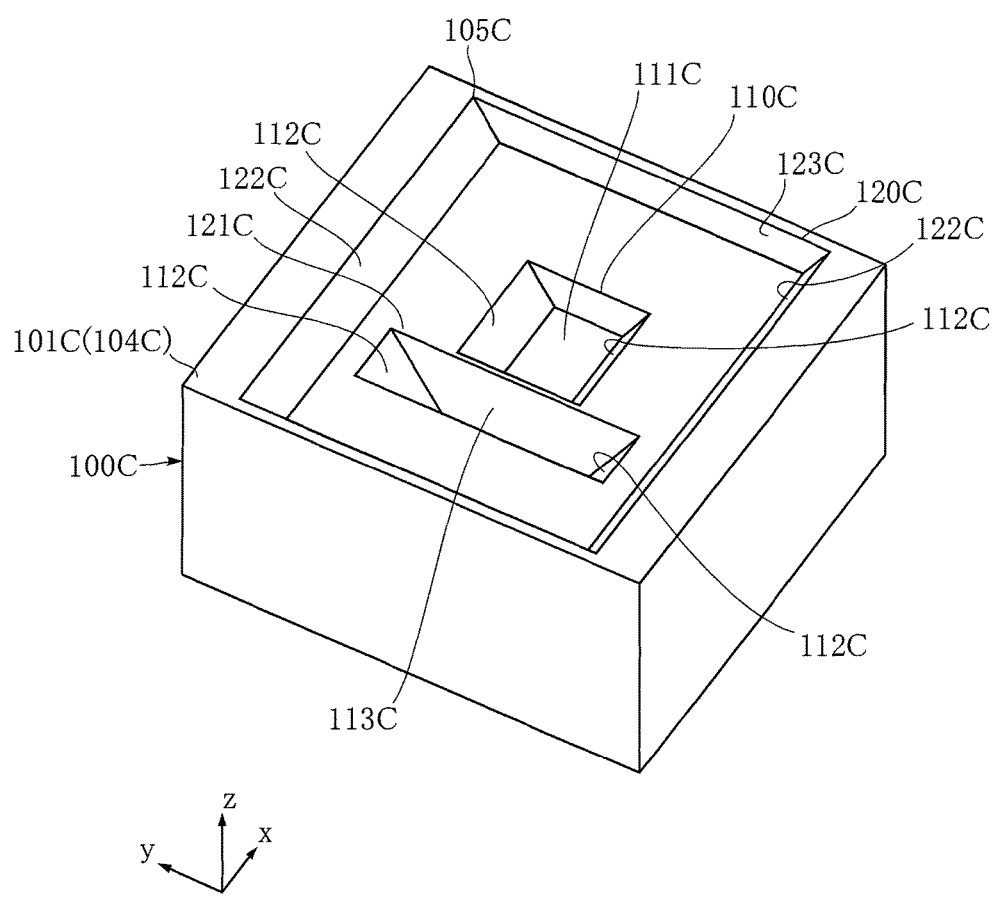
FIG. 35 is a perspective view, showing a substrate of the semiconductor device in FIG. 30.

FIG. 35 is a perspective view of the substrate 100C. In the present embodiment, the main surface 101C is provided by a (110) surface of the base material 103C. The recess 105C recedes from the main surface 101C toward the back surface 102C. In the present embodiment, the recess 105C includes two first hollows 110C and a second hollow 120C. The two first hollows 110C are on a side closer to the back surface 102B, and each has a first bottom surface 111C, two first inclined side surfaces 112C and two first upright side surfaces 113C. The second hollow 120C is on a side closer to the main surface 101C than is the first hollow 110C, and has a second bottom surface 121C, two second inclined side surfaces 122C and two second upright side surfaces 123C. Shapes of these first hollows 110C and of the second hollow 120C are dependent upon the fact that a (110) surface is used as the main surface 101C.

Since the recess 105C is formed, the main surface 101C is rectangle-annular in a plan view. More specifically, the main surface 101C includes two regions spaced from each other in a direction y with the recess 105C in-between, which are significantly larger than the other two regions which are spaced from each other in a direction x with the recess 105C in-between.

The two first hollows 110C are disposed in the direction x. One of the first hollows 110C is substantially square in a plan view whereas the other first hollow 110C has a substantially rectangular in a plan view. The rectangular parallelepiped first hollow 110C is deeper than the square-shaped first hollow 110C. The first bottom surface 111C is rectangular in a plan view. The two first inclined side surfaces 112C in each first hollow 110C are spaced from each other in the direction y in a plan view with the first bottom surface 111C in-between, substantially congruent to each other, and substantially rectangular. Each first inclined side surface 112C is inclined with respect to the first bottom surface 111C. In the present embodiment, the first inclined side surfaces 122C are inclined by approximately 45 degrees with respect to an xy plane. The fact that the first inclined side surfaces 112C are substantially rectangular which are substantially congruent to each other and that the angle described is 45 degrees are dependent upon the fact that a (110) surface is used as the main surface 101C. The two first upright side surfaces 113C in each first hollow 110C sandwich the first bottom surface 111C in the direction x in a plan view, and are substantially trapezoidal, with their upper bases represented by their sides which are in contact with the first bottom surface 111C. Each first upright side surface 113C is substantially perpendicular to the first bottom surface 111C, and substantially in parallel to a yz plane. The fact that the first upright side surfaces 113C are substantially trapezoidal and are perpendicular to the first bottom surface 111C is dependent upon the fact that a (110) surface is used as the main surface 101C.

The second hollow 120C is rectangular in a plan view. The second hollow 120C has a depth of approximately 120 µm for example. The second bottom surface 121C is rectangular in a plan view and surrounds the two first hollows 110C. Also, the second bottom surface 121C connects to the four first inclined side surfaces 112C and the four first upright side surfaces 113C. The two second inclined side surfaces 122C sandwich the second bottom surface 121C in the direction y in a plan view, and are substantially rectangular, being substantially congruent to each other. Each second inclined side surface 122C is inclined with respect to the second bottom surface 121C. In the present embodiment, the second inclined side surfaces 122C are inclined by approximately 45 degrees with respect to an xy plane. The fact that the second inclined side surfaces 122C are substantially rectangular and that the angle described is 45 degrees are dependent upon the fact that a (110) surface is used as the main surface 101C. The two second upright side surfaces 123C sandwich the second bottom surface 121C in the direction x in a plan view, and are substantially trapezoidal, with their upper bases represented by their sides which are in contact with the second bottom surface 121C. Each second upright side surface 123C is substantially perpendicular to the second bottom surface 121C, and substantially in parallel to a yz plane. The fact that the second upright side surfaces 123C are substantially trapezoidal and are perpendicular to the second bottom surface 121C is dependent upon the fact that a (110) surface is used as the main surface 101C.

The wiring layer 200C is for mounting the three direction sensor elements 311C, 312C, 313C and the integrated circuit element 330C, and providing electric-current, paths for input to/output from these elements. The wiring layer 200C is formed on the insulation layer 104C, and in the present embodiment, constituted by a barrier-seed layer 201C and a plating layer 202C laminated thereon.

The barrier-seed layer 201C serves as a so called foundation layer for formation of a desired plating layer 202C, and is formed on the insulation layer 104C. The barrier-seed layer 201C is composed of a Ti layer as a barrier layer, for example, formed on the insulation layer 104C; and a Cu layer serving as a seed layer formed in lamination on the barrier layer. The barrier-seed layer 201C is formed by spattering for example.

The plating layer 202C, which is made of Cu for example, is formed by means of electrolytic plating using the barrier-seed layer 201C. The plating layer 202C has a thickness of approximately 5 µm for example.

In the present embodiment, the wiring layer 200C has first bottom surface pads 211C, first inclined side surface pads 212C, second bottom surface pads 213C, external terminals 221C and connection paths 231C, 233C, 2340, 235C, 237C.

The first bottom surface pads 211C are formed on the first bottom surface 111C in the first hollow 110C found on the right side in FIG. 31, and are rectangular for example. In the present embodiment, three first bottom surface pads 211C are disposed in the direction x. In the present embodiment, the first bottom surface pads 211C are used to mount the direction sensor element 311C.

The first inclined side surface pads 212C are formed on the first inclined side surfaces 112C in the first hollow 110C found on the left side in FIG. 31, and are rectangular for example. In the present embodiment, the two first inclined side surfaces 112C are spaced from each other by the first bottom surface 111C in the direction y, and each first inclined side surface 112C is formed with three first inclined side surface pads 212C. In each first inclined side surface 112C, the three first inclined side surface pads 212C are disposed in the direction y. In the present embodiment, the first inclined side surface pads 212C are used to mount the direction sensor elements 312C, 313C.

The second bottom surface pads 213C are formed on the second bottom surface 121C in the second hollow 120C, and are rectangular for example. In the present embodiment, a plurality of the second bottom surface pads 213C are disposed in a substantially rectangular pattern, surrounding the two first hollows 110C. In the present embodiment, the second bottom surface pads 213C are used to mount the integrated circuit element 330C.

Figure 34:
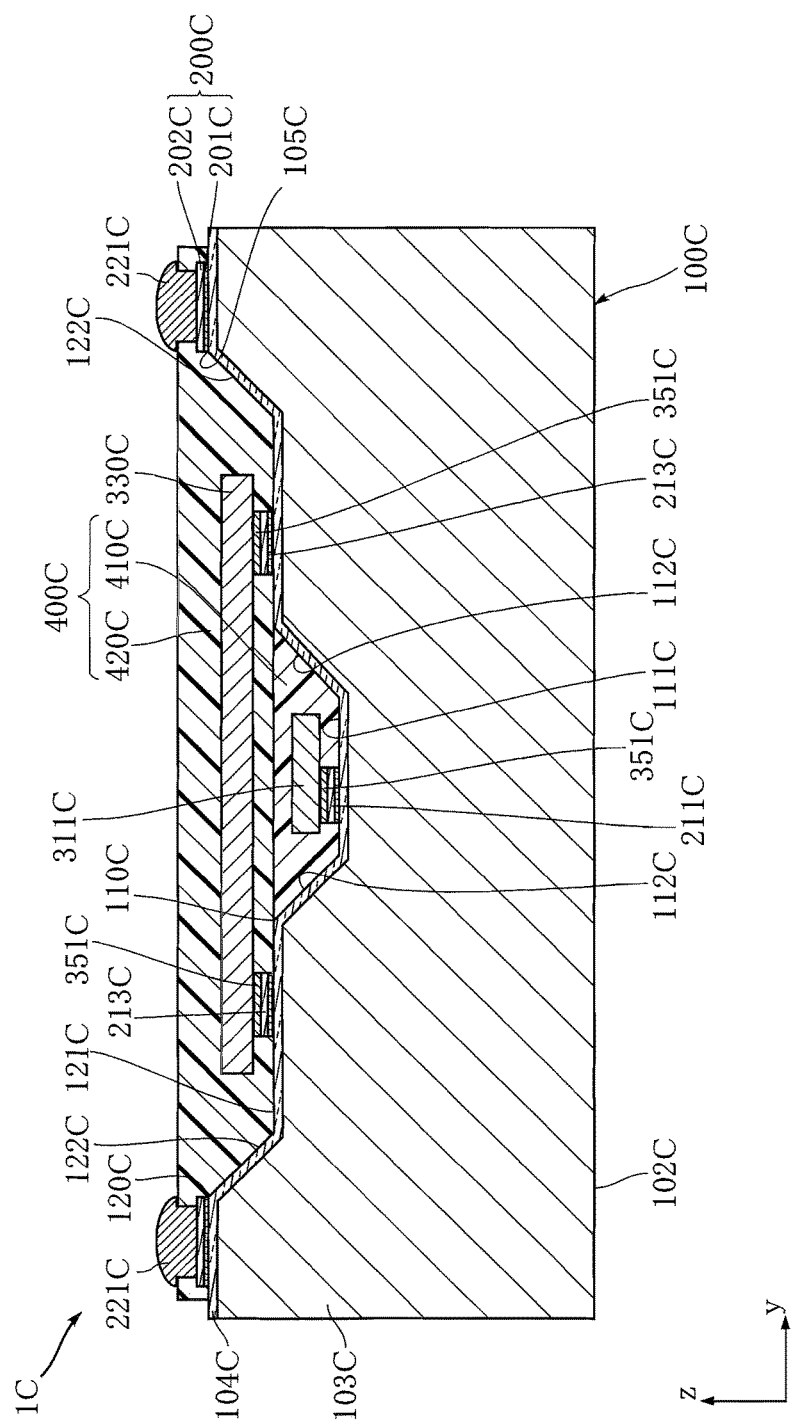
FIG. 34 is a sectional view taken in lines XXXIV-XXXIV in FIG. 31.

The external terminals 221C are formed on the main surface 101C, and are used to surface-mount the semiconductor device 1C onto a circuit substrate of an unillustrated electronic product for example. In the present embodiment, each of the two regions in the main surface 101C, which are spaced from each other in the direction y with the recess 105C in-between, is formed with five external terminals 221C. Also, each external terminal 221C has a side in contact with an outer edge of the recess 105C. The external terminals 221C are provided by bumps obtained through non-electrolytic plating of a metal such as Ni, Pd, Au on the barrier-seed layer 201C and plating layer 202C. As a result, as shown in FIG. 32 through FIG. 34, the external terminals 221C bulge in the direction z.

The connection paths 231C, 233C, 234C, 235C, 237C, constitute pathways for mutual connection between the first bottom surface pads 211C, the first inclined side surface pads 212C, the second bottom surface pads 213C and the external terminals 221C.

The connection paths 231C provide pathways from the main surface 101C to the second bottom surface 121C, connecting mainly the external terminals 221C and the second bottom surface pads 213C with each other. As shown in FIG. 31, in the present embodiment, some connection paths 231C connect to the side of the external terminals 221C which is in contact with the recess 105C. Also, each connection path 231C is routed via the second inclined side surface 122C in the second hollow 120C, to the second bottom surface 121C. Each connection path 231C has a portion formed on the second inclined side surface 122C, which extends in the direction y in a plan view and is not angled with respect to the direction y.

The connection path 233C is routed from the main surface 101C, via the second inclined side surface 122C, the second bottom surface 121C and the first inclined side surface 112C, to the first bottom surface 111C, providing a connection between the external terminal 221C and the first bottom surface pad 211C. In the present embodiment, one connection path 233C is formed, extending from the external terminal 221C located in an upper left area of the drawing.

The connection path 234C provides a pathway from the second bottom surface 121C to the first inclined side surface 112C, connecting the second bottom surface pad 213C and the first inclined side surface pad 212C with each other. In the present embodiment, the connection path 234C detours from the second bottom surface pad 213C, enters the first inclined side surface 112C, and then connects to the first inclined side surface pad 212C.

The connection path 235C provides a pathway from the second bottom surface 121C, via the first inclined side surface 112C, to the first bottom surface 111C, connecting the second bottom surface pad 213C and the first bottom surface pad 211C with each other. In the present embodiment, the connection path 235C extends straightly in the direction y in a plan view.

The connection path 237C provides a pathway within the first hollow 110C located on the left side in FIG. 31, from one of the first inclined side surfaces 112C, via the first bottom surface 111C, to the other first inclined side surface 112C, connecting two first inclined side surface pads 212C with each other. In the present embodiment, the connection path 237C is bent in a plan view in the first bottom surface 111C.

In the present embodiment, the external terminal 221C located at the second place from the left in upper left area of the drawing serves as a so called grounding terminal. Grounded to this external terminal 221C are the first inclined side surface pads 212C, the first bottom surface pads 211C and the second bottom surface pads 213C.

Each of the three direction sensor elements 311C, 312C, 313C has a detection reference axis in a direction different from those of the other two, so that they can serve, for example, in detecting the attitude of the semiconductor device 1B with respect to the global magnetic field. As shown in FIG. 31, in the present embodiment, the direction sensor elements 311C, 312C, 313C have magnetic cores 314C, 315C, 316C respectively. Each of the magnetic cores 314C, 315C, 316C is provided by a metal bar extending in a predetermined direction, with their length direction representing the detection reference axes of the respective direction sensor elements 311C, 312C, 313C. The direction sensor elements 311C, 312C, 313C further have coils (not illustrated) surrounding the magnetic cores 314C, 315C, 316C respectively. The direction sensor elements 311C, 312C, 313C have a thickness of approximately 80 µm for example.

In the present embodiment, the direction sensor element 311C is supported by the first bottom surface 111C of the first hollow 110C which is located on the right side in the drawing, being mounted by using the three first bottom surface pads 211C via solders 351C. Due to this mounting arrangement, the magnetic core 314C of the direction sensor element 311C lies in the direction x.

The direction sensor element 312C is supported by the upper of the first inclined side surfaces 112C of the first hollow 110C which is located on the left side in the drawing, being mounted by using the three first inclined side surface pads 212C via solders 351C. In the mounting arrangement as described, the magnetic core 315C of the direction sensor element 312C is perpendicular to the direction x, and along a direction included in a yz plane. This direction is in parallel to the first inclined side surface 112C which supports the direction sensor element 312C.

The direction sensor element 313C is supported by the lower of the first inclined side surfaces 112C of the first hollow 110C which is located on the left side in the drawing, being mounted by using the three first inclined side surface pads 212C via solders 351C. In the mounting arrangement as described, the magnetic core 316C of the direction sensor element 313C is perpendicular to the direction x, and along a direction included in a yz plane. This direction is in parallel to the first inclined side surface 112C which supports the direction sensor element 313C.

The integrated circuit element 330C controls an orientation detection process which involves the three direction sensor elements 311C, 312C, 313C. In the present embodiment, the integrated circuit, element 330C is configured as a so called ASIC (Application Specific Integrated Circuit) element, and has a thickness of approximately 80 through 100 µm.

The integrated circuit element 330C is supported by the second bottom surface 121C, being mounted by using the second bottom surface pads 213C via solders 351C. As shown in FIG. 31, the integrated circuit element 330C is mounted by using a plurality of the second bottom surface pads 213C disposed in a substantially rectangular pattern to surround the two first hollows 110C. Thus, the integrated circuit element 330C is supported along a region near its four sides. Also, the integrated circuit element 330C covers both of the first hollows 110C entirely in a plan view. Further, the integrated circuit element 330C overlaps all of the direction sensor elements 311C, 312C, 313C in a plan view. As shown in FIG. 32 and FIG. 34, the integrated circuit element 330C lies within the second hollow 120C in the direction z.

The orientation detection process by the integrated circuit element 330C using the direction sensor elements 311C, 312C, 313C is performed as follows for example: As has been described, the direction sensor elements 311C, 312C, 313C respectively have the magnetic cores 314C, 315C, 316C each surrounded by a coil which has been described earlier. Since the direction sensor elements 311C, 312C, 313C are mounted in the fashion as has been described, the direction sensor elements 311C, 312C, 313C, or the magnetic cores 314C, 315C, 316C are along different, directions from each other. The directions along which these magnetic cores 314C, 315C, 316C lie are known information and stored in the integrated circuit element 330C.

The semiconductor device 1C uses the direction sensor elements 311C, 312C, 313C based on the method disclosed in JP-A 2006-47267 Gazette for example, and detects three-dimensionally (performs three-axis detection) in what attitude the device is with respect to the geomagnetic field. The integrated circuit element 330C outputs results of the orientation detection of the semiconductor device 1C autonomously or in response to external command received via the external terminals 221C.

The sealing resin 400C fills the recess 105C, covering the direction sensor elements 311C, 312C, 313C and the integrated circuit element 330C. In the present embodiment, the sealing resin 400C includes a first sealing resin 410C and a second sealing resin 420C.

The first sealing resin 410C primarily fills the first hollows 110C, covering the direction sensor elements 311C, 312C, 313C entirely. However, the first sealing resin 410C does not cover the second bottom surface pads 213C or the integrated circuit element 330C.

The second sealing resin 420C fills primarily the second hollow 120C and covers the integrated circuit element 330C entirely. However, the second sealing resin 420C exposes the external terminals 221C. Also, in a plan view, the second sealing resin 420C is at a position slightly receded inward from outer edges of the substrate 100C.

The first sealing resin 410C and the second sealing resin 420C are provided by, e.g., epoxy resin, phenol resin, polyimide resin, polybenzoxazole (PBO) resin, and silicone resin. The first sealing resin 410C and the second sealing resin 420C may be provided by whichever of a translucent resin and a non-trans lucent resin. In the present embodiment, however, non-translucent resin is preferred.

Next, functions of the semiconductor device 1C will be described.

According to the present embodiment, three direction sensor elements 311C, 312C, 313C are embedded in the first hollows 110C of the recess 105C in the substrate 100C of a semiconductor material. Therefore, there is no need for a lead frame which is otherwise necessary to support the three direction sensor elements 311C, 312C, 313C. Compared to a case where the lead frame is formed by using a metal die, the substrate 100C costs less when it need be re-shaped, since it is made of a semiconductor material. Therefore, it is possible to decrease cost of the semiconductor device 1C. The cost reduction is remarkable especially when the semiconductor device 1C is manufactured in a small quantity.

The recess 105C has a two-step structure, having the first hollows 110C and the second hollow 120C. This makes it possible to use the first hollows 110C as dedicated space for incorporation of the direction sensor elements 311C, 312C, 313C.

The direction sensor elements 312C, 313C are supported by the first inclined side surfaces 112C. This makes it possible to accurately orient the magnetic cores 315C, 316C which represent the orientation detection axes for the direction sensor elements 312C, 313C to known directions. This is advantageous in performing three-axis detection by the semiconductor device 1C at a higher level of accuracy. The direction sensor element 311C is supported by the first bottom surface 111C. This allows the magnetic core 314C of the direction sensor element 311C to be accurately oriented at a different angle from those of the magnetic cores 315C, 316C in the direction sensor elements 312C, 313C. Also, this allows the magnetic core 314C and the magnetic cores 315C, 316C to be placed at relatively large angles to each other. This is advantageous in improving detection accuracy in the semiconductor device 1C.

The substrate 100C is made of a monocrystal material of a semiconductor, as Si being a typical of the semiconductors. This allows the first inclined side surfaces 112C and the second inclined side surfaces 122C to be finished as surfaces accurately inclined by a known predetermined angle with respect to the first bottom surface 111C and the second bottom surface 121C. In particular, by using Si for the substrate 100C and by using a (110) surface as the main surface 101C, it becomes possible that all of the four first inclined side surfaces 112C and the two second inclined side surfaces 122C have an inclination angle of about 45 degrees with respect to the first bottom surface 111C and the second bottom surface 121C. Thus, it is possible to give the semiconductor device 1C a well-balanced shape. On the other hand, using a (110) surface as the main surface 101C makes it possible to form the first upright side surfaces 113C and the second upright side surfaces 123C. The first upright side surfaces 113C and the second upright side surfaces 123C are perpendicular to the first bottom surface 111C and the second bottom surface 121C. This is suitable for reducing plan-view dimensions of the semiconductor device 1C. Also, two first hollows 110C are used to separately embed the direction sensor elements 311C, 312C, 313C, so each first hollow 110C can be relatively small, and this helps decrease the size of the semiconductor device 1C.

The integrated circuit element 330C is supported by the second bottom surface 121C, and overlaps all of the two first hollows 110 entirely in a plan view. This allows the direction sensor elements 311C, 312C, 313C, and the integrated circuit element 330C to be disposed three-dimensionally in the direction z. This makes it possible to achieve both of size reduction and higher functionality in the semiconductor device 1C.

The integrated circuit element 330C is supported at its four sides by the second bottom surface 121C. This is well suited for stably supporting the integrated circuit element 330C.

The main surface 101C is formed with external terminals 221C. This allows so called surface mounting of the semiconductor device 1C to be achieved by using the external terminals 221C side (the main surface 101C side) as the mounting side.

The second bottom surface 121C is formed with the second bottom surface pads 213C. This makes it possible to mount the integrated circuit element 330C appropriately in the second bottom surface 121C.

The first bottom surface 111C is formed with the first bottom surface pads 211C. This makes it possible to mount the direction sensor element 311C reliably along the first bottom surface 111C. The first inclined side surfaces 112C are formed with the first inclined side surface pads 212C. This makes it possible to mount the direction sensor elements 312C, 313C reliably along the first inclined side surfaces 112C.

The wiring layer 200C has connection paths 231C, 233C, 234C, 235C, 236C. This makes it possible to provide appropriate continuity between desired components among the external terminals 221C, the second bottom surface pads 213C, the first bottom surface pads 211C and the first inclined side surface pads 212C. The connection paths 231C are routed via the second inclined side surface 122C. This provides appropriate continuity between the external terminals 221C and the second bottom surface pads 213C which are formed on a three-dimensional structure of the substrate 100C, with significantly low risk of discontinuity. The connection paths 233C, 234C, 235C are routed via the first inclined side surface 112C. This also provides the advantage of low risk of discontinuity. The connection paths 231C, 233C, 234C, 235C, 237C are not routed via any of the first upright side surfaces 113C and the second upright side surfaces 123C. This further reduces chances for discontinuity.

The three direction sensor elements 311C, 312C, 313C are covered by the sealing resin 400C. This provides appropriate protection to these direction sensor elements 311C, 312C, 313C. The sealing resin 400C is composed of the first sealing resin 410C and the second sealing resin 420C. This makes it possible to appropriately fill the stepped structure of the recess 105C which is composed of the first hollows 110C and the second hollow 120C.

The first sealing resin 410C is mainly filled into the first hollows 110C. This allows the three direction sensor elements 311C, 312C, 313C to be covered appropriately before the integrated circuit element 330C is mounted. Also, by covering the integrated circuit element 330C with the second sealing resin 420C, the arrangement makes it possible to form a sealing resin 400C to ensure that there is no unintended gap developing between the integrated circuit element 330C and the three direction sensor elements 311C, 312C, 313C. The second sealing resin 420C exposes the external terminals 221C. This ensures easy surface mounting of the semiconductor device 1C while appropriately avoiding such a situation that a circuit substrate, to which the semiconductor device 1C is to be mounted, has undue continuity with the integrated circuit element 330C or the three direction sensor elements 311C, 312C, 313C.

Figure 36:
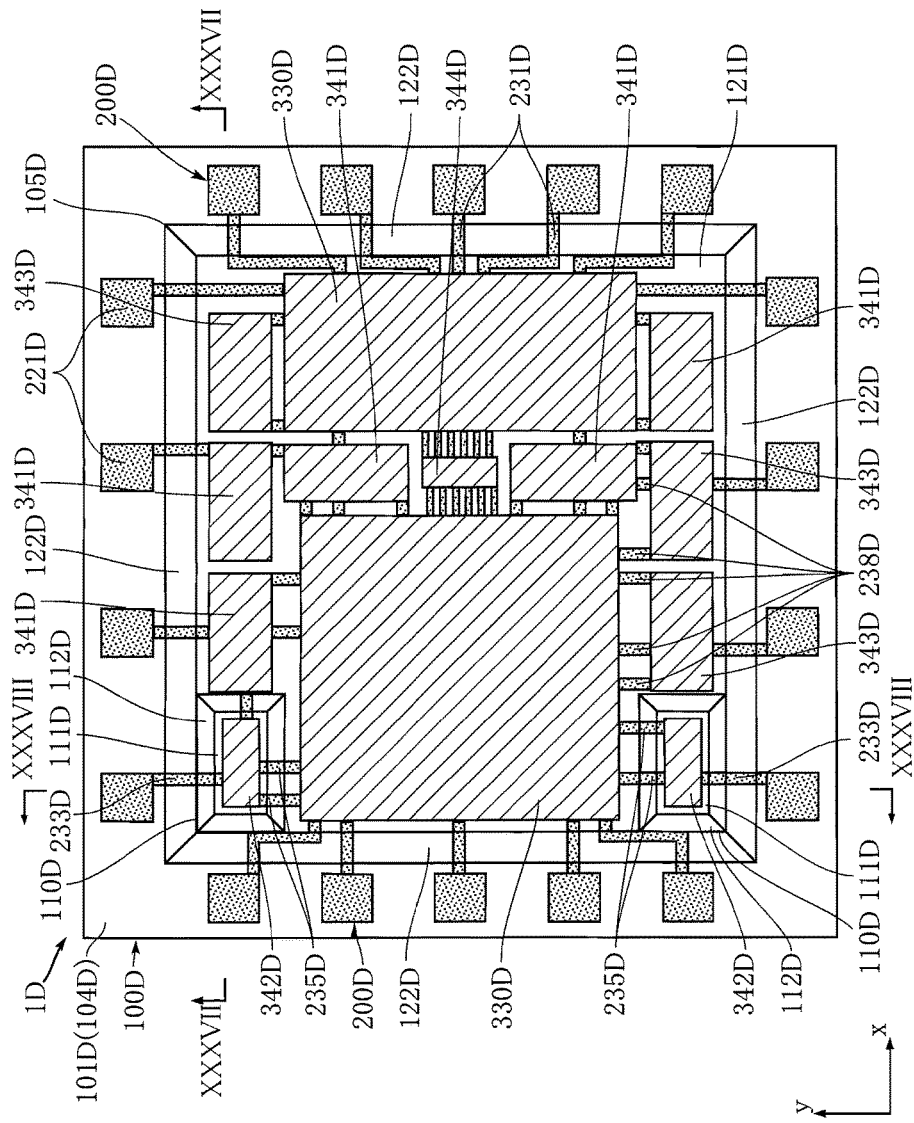
FIG. 36 is a plan view, showing a primary portion of a semiconductor device according to a fourth embodiment of the present invention.
Figure 37:
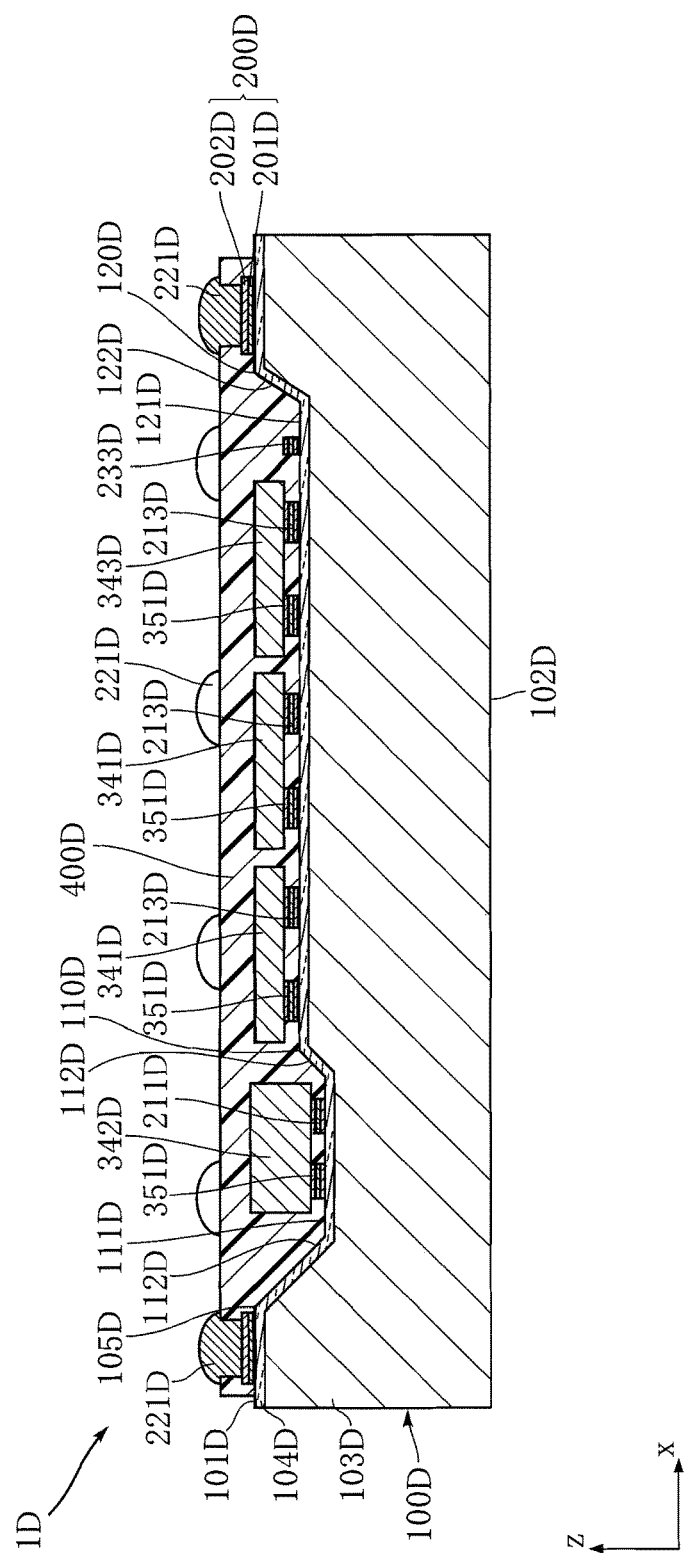
FIG. 37 is a sectional view taken in lines XXXVII-XXXVII in FIG. 36.
Figure 38:
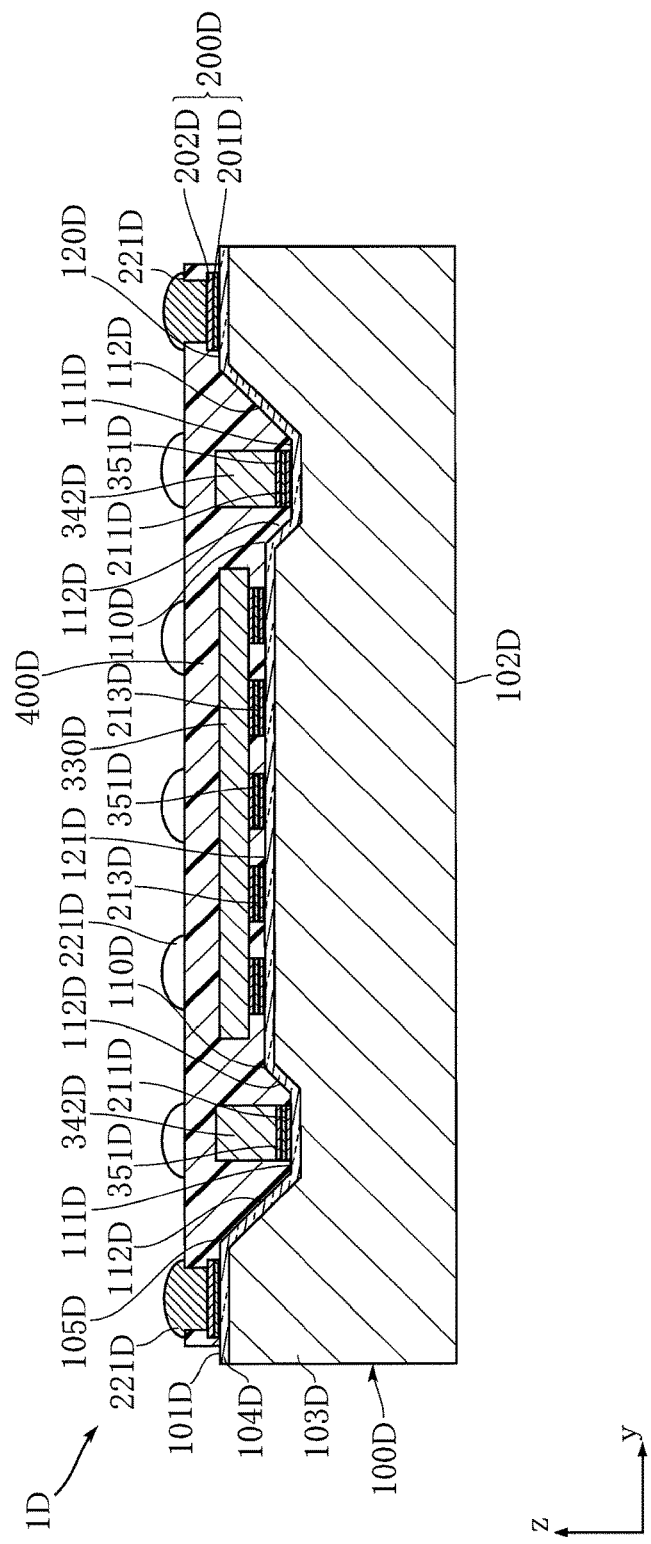
FIG. 38 is a sectional view taken in lines XXXVIII-XXXVIII in FIG. 36.

FIG. 36 through FIG. 38 show a semiconductor device according to a fourth embodiment of the present invention. A semiconductor device 1D according to the present embodiment includes a substrate 100D, a wiring layer 200D, an integrated circuit element 330D, chip resistors 341D, coils 342D, capacitors 343D, a fuse 344D and a sealing resin 400D. FIG. 37 is a sectional view in a zx plane, taken in lines XXXVII-XXXVII in FIG. 36 whereas FIG. 38 is a sectional view in a yz plane, taken in XXXVIII-XXXVIII in FIG. 36.

The semiconductor device 1D is a DC/DC converter module for example, is surface-mountable and has an arrangement to be described below. As an example, the semiconductor device 1D is approximately 2.68 mm×2.40 mm in size in a plan view, and approximately 0.66 mm in thickness.

The substrate 100D serves as a base of the semiconductor device 1D, and includes a base material 103D and an insulation layer 104D. The substrate 100D has a main surface 101D, a back surface 102D, and a recess 105D. The substrate 100D has a thickness of approximately 600 μm for example. In the present embodiment, the main surface 101D and the back surface 102D face away from each other in a direction z, and the direction z represents a thickness direction of the semiconductor device 1D. A direction x and a direction y are both perpendicular to the direction z.

The base material 103D is of a monocrystal semiconductor material, and in the present embodiment is made of monocrystal Si. The insulation layer 104D is formed of $SiO_2$ in the present embodiment. The material for the base material 103D is not limited to Si, but may be anything as far as it is possible to form the recess 105D which satisfy the intension to be described later. The insulation layer 104D covers those regions on the base material 103D which are exposed on a side away from the back surface 102D. The insulation layer 104D has a thickness of approximately 0.7 through 1.0 μm for example.

In the present embodiment, the main surface 101D is provided by a (100) surface of the base material 103D. The recess 105C recedes from the main surface 101C toward the back surface 102C. In the present embodiment, the recess 105D includes two first hollows 110D and a second hollow 120D. The two first hollows 110D are on a side closer to the back surface 102D, and each has a first bottom surface 111D and four first inclined side surfaces 112D. The second hollow 120D is on a side closer to the main surface 101D than is the first hollow 110D, and has a second bottom surface 121D and four second inclined side surfaces 122D. Shapes of these first hollows 110D and of the second hollow 120D are dependent upon the fact that a (100) surface is used as the main surface 101D.

Since the recess 105D is formed, the main surface 101D is rectangle-annular in a plan view.

The two first hollows 110D are both rectangular in a plan view, and spaced from each other in the direction y. The four first inclined side surfaces 112D in each first hollow 110D surrounds the first bottom surface 111D in a plan view, and are substantially trapezoidal, with their upper bases represented by their sides which are in contact with the first bottom surface 111D. Each first inclined side surface 112D is inclined with respect to the first bottom surface 111D. In the present embodiment, the first inclined side surfaces 122D are inclined by approximately 55 degrees with respect to an xy plane. The fact that the first inclined side surfaces 122D are substantially trapezoidal and that the angle described is 55 degrees are dependent upon the fact that a (100) surface is used as the main surface 101D.

The second hollow 120D is rectangular in a plan view. The second bottom surface 121D is substantially rectangular in a plan view, with two corner regions cut off by the two first hollows 110D. The four first inclined side surfaces 112D connect to the second bottom surface 121D and the second inclined side surfaces 122D. The four second inclined side surfaces 122D surround the second bottom surface 121D in a plan view, and are substantially trapezoidal, with their upper bases each represented by a side of the second bottom surface 121D. Each second inclined side surface 122D is inclined with respect to the second bottom surface 121D. In the present embodiment, the second inclined side surfaces 122D are inclined by approximately 55 degrees with respect to an xy plane. The fact that the second inclined side surfaces 122D are substantially trapezoidal and that the angle described is 55 degrees are dependent upon the fact that a (100) surface is used as the main surface 101D.

The wiring layer 200D is for mounting the integrated circuit element 330D, the chip resistors 341D, the coils 342D, the capacitors 343D and the fuse 344D, and providing electric-current paths for input to/output from these elements. The wiring layer 200D is formed on the insulation layer 104D, and in the present embodiment, constituted by a barrier-seed layer 201D and a plating layer 202D laminated thereon.

The barrier-seed layer 201D serves as a so called foundation layer for formation of a desired plating layer 202D, and is formed on the insulation layer 104D. The barrier-seed layer 201D is composed of a Ti layer as a barrier layer, for example, formed on the insulation layer 104D; and a Cu layer serving as a seed layer formed in lamination on the barrier layer. The barrier-seed layer 201D is formed by spattering for example.

The plating layer 202D, which is made of Cu for example, is formed by means of electrolytic plating using the barrier-seed layer 201D. The plating layer 202D has a thickness of approximately 5 μm for example.

In the present embodiment, the wiring layer 200D has first bottom surface pads 211D, second bottom surface pads 213D, external terminals 221D and connection paths 231D, 233D, 235D, 238D.

The first bottom surface pads 211D are formed on the first bottom surface 111D in each first hollow 110D. In the present embodiment, the first bottom surface pads 211D are used to mount the coils 342D.

The second bottom surface pads 213D are formed on the second bottom surface 121D in the second hollow 120D. In the present embodiment, the second bottom surface pads 213D are used to mount the integrated circuit element 330D, the chip resistors 341D, the capacitors 343D and the fuse 344D.

The external terminals 221D are formed on the main surface 101D, and are used to surface-mount the semiconductor device 1D onto a circuit substrate of an unillustrated electronic product for example. The external terminals 221D are provided by bumps obtained through non-electrolytic plating of a metal such as Ni, Pd, Au on the barrier-seed layer 201D and plating layer 202D. As a result, as shown in FIG. 37 and FIG. 38, the external terminals 221D bulge in the direction z.

The connection paths 231D, 233D, 235D, 236D constitute pathways for mutual connection between the first bottom surface pads 211D, the second bottom surface pads 213D and external terminals 221D.

The connection paths 231D provide pathways from the main surface 101D to the second bottom surface 121D, connecting mainly the external terminals 221D and the second bottom surface pads 213D with each other. The connection paths 231D are routed via the second inclined side surface 122D in the second hollow 120D, to the second bottom surface 121D.

The connection paths 231D provide pathways from the main surface 101D to the first bottom surface 111D, connecting the external terminals 221D and the first bottom surface pads 211D with each other. In the present embodiment, the connection paths 233D are routed from the external terminals 221D, via the second inclined side surfaces 122D and the first inclined side surfaces 112D, to the first bottom surface 111D.

The connection paths 235D provide pathways from the second bottom surface 121D, via the first inclined side surfaces 112D, to the first bottom surface 111D, connecting the second bottom surface pads 213D and the first bottom surface pads 211D with each other.

The connection paths 238D provide pathways within the second bottom surface 121D, each connecting two second bottom surface pads 213D with each other.

Each of the chip resistors 341D, the coils 342D, the capacitors 343D and the fuse 344D is an individual element which has surface-mountable terminals (not illustrated), and is classified as a so called discrete element. Each of the chip resistors 341D, the coils 342D, the capacitors 343D and the fuse 344D serves as a single-function electric part in the work of the semiconductor device 1D as a DC/DC converter module. It should be noted here that the direction sensor elements and the acceleration sensor element described earlier can also be classified as discrete elements in that they are individual single-piece element having surface-mountable terminals (not illustrated).

The chip resistors 341D, the capacitors 343D and the fuse 344D are supported by the second bottom surface 121D, being mounted by using the second bottom surface pads 213D via solders 351D.

The coils 342D are generally taller than the chip resistors 341D, the capacitors 343D and the fuse 344D. In the present embodiment, the coils 342D are supported on the first bottom surfaces 111D, being mounted by using the first bottom surface pads 211D via solders 351D. As shown in FIG. 37 and FIG. 38, each coil 342D has their lower part within the first hollow 110A and its upper part within the second hollow 120D.

The integrated circuit element 330D controls a DC/DC conversion process which involves the chip resistors 341D, the coils 342D, the capacitors 343D and the fuse 344D. In the present embodiment, the integrated circuit element 330D is configured as a so called ASIC (Application Specific Integrated Circuit) element, and has a thickness of approximately 80 through 100 μm.

The integrated circuit element 330D is supported by the second bottom surface 121D, being mounted by using the second bottom surface pads 213D via solders 351D. As shown in FIG. 36 and FIG. 38, the integrated circuit element 330D lies within the second hollow 120D in the direction z.

The sealing resin 400D fills the recess 105D and covers the chip resistors 341D, the coils 342D, the capacitors 343D, the fuse 344D and the integrated circuit element 330D. However, the sealing resin 400D exposes the external terminals 221D. Also, in a plan view, the sealing resin 400D is at a position slightly receded inward from outer edges of the substrate 100D.

The sealing resin 400D is provided by, e.g., epoxy resin, phenol resin, polyimide resin, polybenzoxazole (PBO) resin, and silicone resin. The sealing resin 400D may be provided by whichever of a translucent resin and a non-translucent resin. In the present embodiment, however, non-translucent resin is preferred.

Next, functions of the semiconductor device 1D will be described.

According to the present embodiment, the chip resistors 341D, the coils 342D, the capacitors 343D, the fuse 344D and the integrated circuit element 330D are embedded in the first hollows 110D and the second hollow 120D of the recess 105D in the substrate 100D of a semiconductor material. Therefore, there is no need for a lead frame which is otherwise necessary to support the chip resistors 341D, the coils 342D, the capacitors 343D, the fuse 344D and the integrated circuit element 330D. Compared to a case where the lead frame need be formed by using a metal die, the substrate 100D costs less when it need be re-shaped, since it is made of a semiconductor material. Therefore, it is possible to decrease cost of the semiconductor device 1D. The cost reduction is remarkable especially when the semiconductor device 1D is manufactured in a small quantity.

The recess 105D has a two-step structure, having the first hollows 110D and the second hollow 120D. This makes it possible to use the first hollows 110D as dedicated space for incorporation of the coils 342D which are relatively tall elements.

The substrate 100D is made of a monocrystal material of a semiconductor, as Si being a typical of the semiconductors. This allows the first inclined side surfaces 112D and the second inclined side surfaces 122D to be finished as surfaces accurately inclined by a known predetermined angle with respect to the first bottom surface 111D and the second bottom surface 121D. In particular, by using Si for the substrate 100D and by using a (100) surface as the main surface 101D, it becomes possible that all of the eight first inclined side surfaces 112D and four second inclined side surfaces 122D have an inclination angle of about 55 degrees with respect to the first bottom surface 111D and the second bottom surface 121D. Thus, it is possible to give the semiconductor device 1D a well-balanced shape.

The main surface 101D is formed with external terminals 221D. This allows so called surface mounting of the semiconductor device 1D to be achieved by using the external terminals 221D side (the main surface 101D side) as the mounting side.

The second bottom surface 121D is formed with the second bottom surface pads 213D. This makes it possible to mount the chip resistors 341D, the capacitors 343D, the fuse 344D and the integrated circuit element 330D appropriately in the second bottom surface 121D.

The first bottom surface 111D is formed with the first bottom surface pads 211D. This ensures that the coils 342D are mounted reliably.

The wiring layer 200D has connection paths 231D, 233D, 235C, 238C. This makes it possible to provide appropriate continuity between desired components among the external terminals 221D, the second bottom surface pads 213D and the first bottom surface pads 211D. The connection paths 231D, 233D are routed via the second inclined side surfaces 122D. This provides appropriate continuity between the external terminals 221D and the first bottom surface pads 211D and the second bottom surface pad 213D which are formed on a three-dimensional structure of the substrate 100D, with significantly low risk of discontinuity. The connection paths 235D are routed via the first inclined side surfaces 112D. This also provides the advantage of low risk of discontinuity.

The chip resistors 341D, the coils 342D, the capacitors 343D, the fuse 344D and the integrated circuit element 330D are covered by the sealing resin 400D. This provides appropriate protection to these components.

Figure 39:
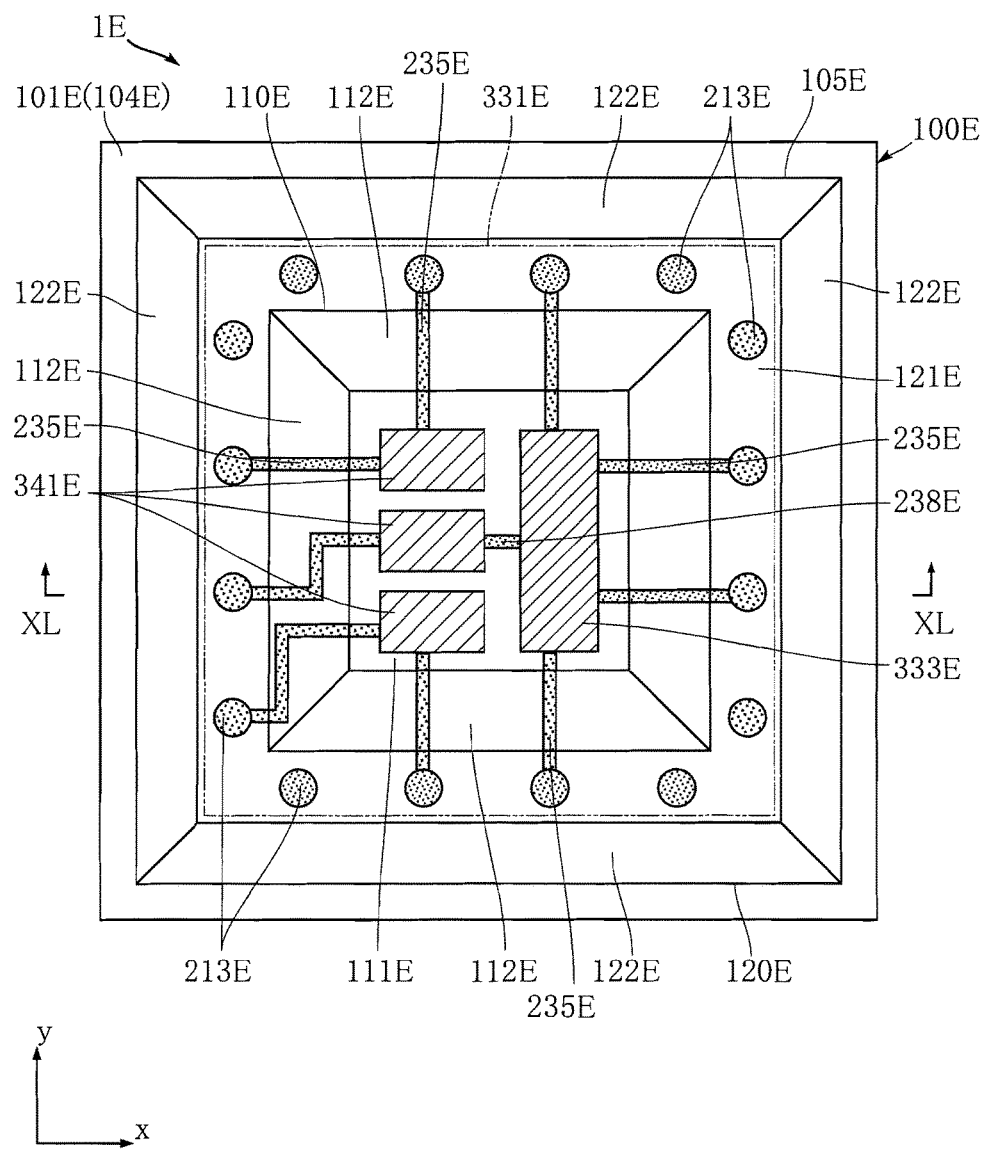
FIG. 39 is a plan view, showing a primary portion of a semiconductor device according to a fifth embodiment of the present invention.
Figure 40:
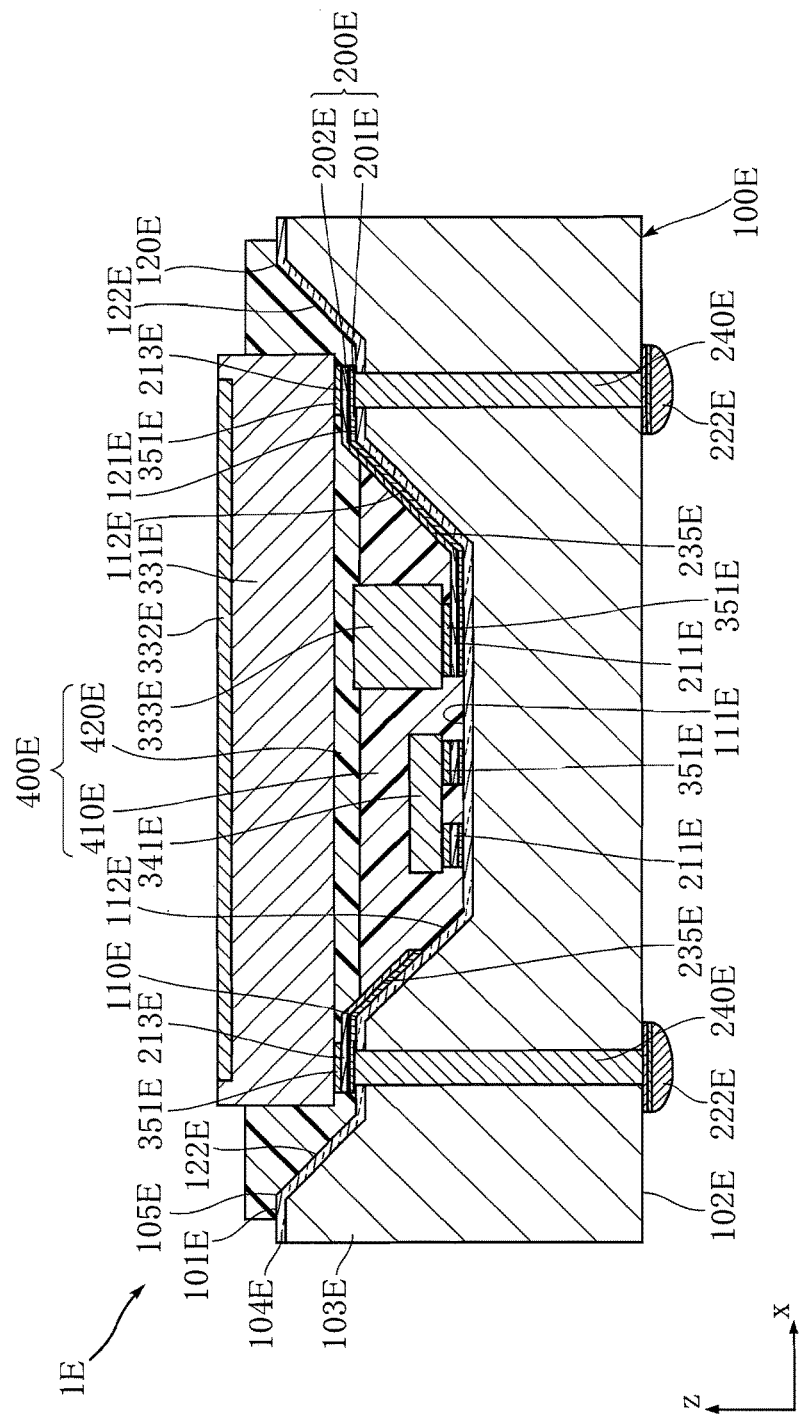
FIG. 40 is a sectional view taken in lines XL-XL in FIG. 39.

FIG. 39 and FIG. 40 show a semiconductor device according to a fifth embodiment of the present invention. A semiconductor device 1E according to the present embodiment includes a substrate 100E; a wiring layer 200E; chip resistors 341E, a CCD imaging element 331E, a driver IC 333E, and a sealing resin 400E. FIG. 39 does not show the sealing resin 400E and show the CCD imaging element 331E in imaginary lines for the sake of easier understanding. FIG. 40 is a sectional view in a zx plane, taken m lines XL-XL in FIG. 39.

The semiconductor device 1E is a surface-mountable imaging module capable of generating electronic image by means of imaging technology, and has an arrangement to be described herebelow.

The substrate 100E serves as a base of the semiconductor device 1E, and includes a base material 103E and an insulation layer 104E. The substrate 100E has a main surface 101E, a back surface 102E, and a recess 105E. In the present embodiment, the main surface 101E and the back surface 102E face away from each other in a direction z, and the direction z represents a thickness direction of the semiconductor device 1E. A direction x and a direction y are both perpendicular to the direction z.

The base material 103E is of a monocrystal semiconductor material, and in the present embodiment is made of monocrystal Si. The insulation layer 104E is formed of $SiO_2$ in the present embodiment. The material for the base material 103E is not limited to Si, but may be anything as far as it is possible to form the recess 105E which satisfy the intension to be described later. The insulation layer 104E covers those regions on the base material 103E which are exposed on a side away from the back surface 102E. The insulation layer 104E has a thickness of approximately 0.7 through 1.0 μm for example. In the present embodiment the back surface 102E may also be formed with an insulation layer 104E.

In the present embodiment, the main surface 101E is provided by a (100) surface of the base material 103E. The recess 105E recedes from the main surface 101E toward the back surface 102E. In the present embodiment, the recess 105E includes a first hollow 110E and a second hollow 120E. The first hollow 110E is on a side closer to the back surface 102E, and has a first bottom surface 111E and four first inclined side surfaces 112E. The second hollow 120E is on a side closer to the main surface 101E than is the first hollow 110E, and has a second bottom surface 121E and four second inclined side surfaces 122E. Shapes of these first hollow 110E and of the second hollow 120E are dependent upon the fact that a (100) surface is used as the main surface 101E.

Since the recess 105E is formed, the main surface 101E is rectangle-annular in a plan view.

The first hollow 110E is substantially square in a plan view and the first bottom surface 111E is generally square-shaped. The four first inclined side surfaces 122E surround the first bottom surface 111E in a plan view, substantially congruent to each other, and are substantially trapezoidal, with their upper bases each represented by a side of the first bottom surface 111E. Each first inclined side surface 112E is inclined with respect to the first bottom surface 111E. In the present embodiment, the first inclined side surfaces 122E are inclined by approximately 55 degrees with respect to an xy plane. The fact that the first inclined side surfaces 112E are substantially trapezoidal which are substantially congruent to each other and that the angle described is 55 degrees are dependent upon the fact that a (100) surface is used as the main surface 101E.

The second hollow 120E is substantially square in a plan view whereas the second bottom surface 121E is rectangle-annular in a plan view, surrounding the first hollow 110E. Also, the second bottom surface 121E connects to the four first inclined side surfaces 112E. The four second inclined side surfaces 122E surround the second bottom surface 121E in a plan view, and are substantially trapezoidal, with their upper bases each represented by a side of the second bottom surface 121E. Each second inclined side surface 122E is inclined with respect to the second bottom surface 121E. In the present embodiment, the second inclined side surfaces 122E are inclined by approximately 55 degrees with respect to an xy plane. The fact that the second inclined side surfaces 122E are substantially trapezoidal and that the angle described is 55 degrees are dependent upon the fact that a (100) surface is used as the main surface 101E.

In the present embodiment, the first hollow 110E and the second hollow 120E have their respective centers at a substantially identical location.

The wiring layer 200E is for mounting the CCD imaging element 331E, the driver IC 333E and the chip resistors 341E, and providing electric-current paths for input to/output from these elements. The wiring layer 200E is formed on the insulation layer 104E, and in the present embodiment, constituted by a barrier-seed layer 201E and a plating layer 202E laminated thereon.

The barrier-seed layer 201E serves as a so called foundation layer for formation of a desired plating layer 202E, and is formed on the insulation layer 104E. The barrier-seed layer 201E is composed of a Ti layer as a barrier layer, for example, formed on the insulation layer 104E; and a Cu layer serving as a seed layer formed in lamination on the barrier layer. The barrier-seed layer 201E is formed by spattering for example.

The plating layer 202E, which is made of Cu for example, is formed by means of electrolytic plating using the barrier-seed layer 201E. The plating layer 202E has a thickness of approximately 5 μm for example.

In the present embodiment, the wiring layer 200E has first bottom surface pads 211E, second bottom surface pads 213E, external terminals 222E and connection paths 235E, 238E.

The first bottom surface pads 211E are formed on the first bottom surface 111E in the first hollow 110E. In the present embodiment, the first bottom surface pads 211E are used to mount the chip resistors 341E and the driver IC 333E.

The second bottom surface pads 213E are formed on the second bottom surface 121E in the second hollow 120E. In the present embodiment, the second bottom surface pads 213E are used to mount the CCD imaging element 331E.

The external terminals 222E are formed on the back surface 102E, and are used to surface-mount the semiconductor device 1E onto a circuit substrate of an unillustrated electronic product for example. The external terminals 222E are provided by bumps obtained through non-electrolytic plating of a metal such as Ni, Pd, Au on the barrier-seed layer 201E and plating layer 202E. As a result, as shown in FIG. 40, the external terminals 222E bulge in the direction z. The semiconductor device 1E has a plurality of through-hole paths 240E for establishing continuity between the first bottom surface pads 211E or the second bottom surface pads 213E and the external terminals 222E. Each through-hole path 240E has a wall of, e.g., the same Cu as of the plating layer 202E, and penetrates the substrate 100E from the second bottom surface 121E to the back surface 102E. The through-hole paths 240E may be formed simultaneously with the plating layer 202E using the same method as used for forming the plating layer. Since the external terminals 222E are formed on the back surface 102E, the back surface 102E side is the mounting surface of the semiconductor device 1E.

The connection paths 235E, 238E constitute pathways for mutual connection between the first bottom surface pads 211E, the second bottom surface pads 213E and external terminals 222E.

The connection paths 235E provide pathways from the second bottom surface 121E, via the first inclined side surfaces 112E, to the first bottom surface 111E, connecting the second bottom surface pads 213E and the first bottom surface pads 211E with each other.

The connection path 238E is formed on the first bottom surface 111E, connecting two first bottom surface pads 211E with each other.

The CCD imaging element 331E has an imaging surface 332E, and is capable of outputting image data based on light received m the imaging surface 332E. The imaging surface 332E has a plurality of light-reception pixels disposed in a matrix pattern.

The CCD imaging element 331E is supported by the second bottom surface 121E with the imaging surface 332E facing upward, and is mounted by using the second bottom surface pads 213E via solders 351E. The CCD imaging element 331E covers the first hollows 110E entirely in a plan view. Also, the CCD imaging element 331E overlaps all of the chip resistors 341E and the driver IC 333E in a plan view. As shown in FIG. 40, the CCD imaging element 331E slightly protrudes upward in the direction z from the second hollow 120E.

The chip resistors 341E are for adjusting electric potential or current to the CCD imaging element 331E and the driver IC 333E. The chip resistors 341E are supported by the first bottom surface 111E, being mounted by using three first bottom surface pads 211E via solders 351E.

The driver IC 333E controls an imaging process of the CCD imaging element 331E. In the present embodiment, the driver IC 333E is supported by the first bottom surface 111E, being mounted by using the first bottom surface pads 211E via solders 351E.

The sealing resin 400E fills the recess 105E and covers the chip resistors 341E and the driver IC 333E entirely while covering lower part of the CCD imaging element 331E. In the present embodiment, the sealing resin 400E includes a first sealing resin 410E and a second sealing resin 420E.

The first sealing resin 410E primarily fills the first hollow 110E, covering the chip resistors 341E and the driver IC 333E entirely. However, the first sealing resin 410E does not cover the second bottom surface pads 213E or the CCD imaging element 331E.

The second sealing resin 420E fills primarily the second hollow 120E and covers lower part of the CCD imaging element 331E. However, the second sealing resin 420E exposes the imaging surface 332E of the CCD imaging element 331E. Also, in a plan view, the second sealing resin 420E is at a position slightly receded inward from outer edges of the substrate 100E.

The first sealing resin 410E and the second sealing resin 420E are provided by, e.g., epoxy resin, phenol resin, polyimide resin, polybenzoxazole (PBO) resin, and silicone resin. The first sealing resin 410E and the second sealing resin 420E may be provided by whichever of a translucent resin and a non-translucent resin. In the present embodiment, however, non-translucent resin is preferred.

Next, functions of the semiconductor device 1E will be described.

According to the present embodiment, the chip resistors 341E and the driver IC 333E are entirely within the recess 105E in the substrate 100E of a semiconductor material, and a lower part of the CCD imaging element 331E is also within the recess 105E. Therefore, there is no need for a lead frame which is otherwise necessary to support the chip resistors 341E and the driver IC 333E in their entirety and to support the lower part of the CCD imaging element 331E. Compared to a case where the lead frame is formed by using a metal die, the substrate 100E costs less when it need be re-shaped, since it is made of a semiconductor material. Therefore, it is possible to decrease cost of the semiconductor device 1E. The cost reduction is remarkable especially when the semiconductor device 1E need be manufactured in a small 2365 quantity.

The recess 105E has a two-step structure, having the first hollow 110E and the second hollow 120E. This makes it possible to use the first hollow 110E as a dedicated space for incorporation of the chip resistors 341E and the driver IC 333E.

The substrate 100E is made of a monocrystal material of a semiconductor, as Si being a typical of the semiconductors. This allows the first inclined side surfaces 112E and the second inclined side surfaces 122E to be finished as surfaces accurately inclined by a known predetermined angle with respect to the first bottom surface 111E and the second bottom surface 121E. In particular, by using Si for the substrate 100E and by using a (100) surface as the main surface 101E, it becomes possible that all of the four first inclined side surfaces 112E and four second inclined side surfaces 122E have an inclination angle of about 55 degrees with respect to the first bottom surface 111E and the second bottom surface 121E. Thus, it is possible to give the semiconductor device 1E a well-balanced shape.

The CCD imaging element 331E is supported by the second bottom surface 121E, and overlaps the first hollow 110E in a plan view. This allows the chip resistors 341E, the driver IC 333E and the CCD imaging element 331E to be disposed three-dimensionally in the direction z. This makes it possible to achieve both of size reduction and higher functionality in the semiconductor device 1E.

The CCD imaging element 331E is supported at its four sides by four regions of the second bottom surface 121E surrounding the first hollow 110E. This allows the CCD imaging element 331E to be supported stably.

The back surface 102E is formed with external terminals 222E. This allows so called surface mounting of the semiconductor device 1E to be achieved by using the external terminals 222E side (the back surface 102E side) as the mounting side. The surface mounting in this fashion allows the imaging surface 332E of the CCD imaging element 331E to be trained in the direction suitable for image taking.

The second bottom surface 321E is formed with the second bottom surface pads 213E. This makes it possible to mount the CCD imaging element 331E appropriately in the second bottom surface 121E.

The connection paths 235E are routed via the first inclined side surfaces 122E. This provides appropriate continuity between the second bottom surface pads 213E and the first bottom surface pads 211E which are formed on a three-dimensional structure of the substrate 100E, with significantly low risk of discontinuity.

The sealing resin 400E covers the chip resistors 341E and the driver IC 333E entirely, and also covers lower part of the CCD imaging element 331E. This provides appropriate protection to these components. The sealing resin 400E is composed of the first sealing resin 410E and the second sealing resin 420E. This makes it possible to appropriately fill the stepped structure of the recess 105E which is composed of the first hollow 110E and the second hollow 120E.

The first sealing resin 410E is mainly filled into the first hollow 110E. This allows the chip resistors 341E and the driver IC 333E to be covered appropriately before the CCD imaging element 331E is mounted. The second sealing resin 420E covers only lower part of the CCD imaging element 331E. This provides appropriate protection to the CCD imaging element 331E while keeping the imaging surface 332E exposed and capable of image taking function. Also, the arrangement makes it possible to form the sealing resin 400E to ensure that there is no unintended gap developing between the CCD imaging element 331E and the chip resistors 341E or the driver IC 333E.

The semiconductor device according to the present invention is not limited to the embodiments described thus far. The semiconductor device according to the present invention may be varied in many ways in any specific details.

Arrangements and variations of the present invention will be listed below.

(Appendix 1A)

A semiconductor device comprising:

a substrate of a semiconductor material, having a main surface and a recess receding from the main surface;

a wiring layer formed on the substrate; and three, direction sensor elements each along a different direction from each other in the recess.

(Appendix 2A)

The semiconductor device according to Appendix 1A, wherein the recess has a bottom surface and an inclined side surface inclined with respect to the bottom surface, At least one of the three direction sensor elements being supported by the inclined side surfaces.

(Appendix 3A)

The semiconductor device according to Appendix 2A, wherein the recess includes: a first hollow incorporating the three direction sensor elements and having a first bottom surface and a first inclined side surface; and a second hollow having a second bottom surface connecting to the first inclined side surface, and a second inclined side surface connecting to the second bottom surface and the main surface.

(Appendix 4A)
The semiconductor device according to Appendix 3A, wherein at least one of the three direction sensor elements is supported by the first bottom surface.

(Appendix 5A)
The semiconductor device according to Appendix 4A, wherein at least one of the three direction sensor elements is supported by the first inclined side surface.

(Appendix 6A)
The semiconductor device according to Appendixes 3A through 5A, wherein the substrate is made of a monocrystal semiconductor material.

(Appendix 7A)
The semiconductor device according to Appendix 6A, wherein the semiconductor material is provided by Si.

(Appendix 8A)
The semiconductor device according to Appendix 7A, wherein the main surface is provided by a (100) surface,
the first hollow having four of the first inclined side surfaces,
the second hollow having four of the second inclined side surfaces.

(Appendix 9A)
The semiconductor device according to Appendix 7A, wherein the main surface is a (110) surface,
the first hollow having: two of the first inclined side surfaces spaced from each other with the first bottom surface in-between; and two first upright side surfaces perpendicular to the first bottom surface and spaced from each other with the first bottom surface in-between;
the second hollow having: two of the second inclined side surfaces spaced from each other with the second bottom surface in-between; and two second upright side surfaces perpendicular to the first bottom surface and spaced from each other with the second bottom surface in-between.

(Appendix 10A)
The semiconductor device according to Appendix 8A or 9A, further comprising an acceleration sensor element for acceleration detection in three mutually different directions from each other.

(Appendix 11A)
The semiconductor device according to Appendix 10A, wherein the acceleration sensor element is housed in the first hollow.

(Appendix 12A)
The semiconductor device according to Appendix 11A, wherein the sensor element is supported by the first bottom surface.

(Appendix 13A)
The semiconductor device according to one of Appendices 8A through 12A, further comprising an integrated circuit element supported by the second bottom surface and overlapping at least part of the first hollow in a normal direction of the main surface.

(Appendix 14A)
The semiconductor device according to Appendix 13A, wherein the integrated circuit element is supported by at least two regions of the second bottom surface which sandwich the first hollow.

(Appendix 15A)
The semiconductor device according to Appendix 14A, wherein the wiring layer has a plurality of external terminals formed on the main surface.

(Appendix 16A)
The semiconductor device according to Appendix 15A, wherein the wiring layer has a plurality of second bottom surface pads formed on the second bottom surface for mounting the integrated circuit element.

(Appendix 17A)
The semiconductor device according to Appendix 16A, wherein the wiring layer has a plurality of first bottom surface pads formed on the first bottom surface for mounting the direction sensor element.

(Appendix 18A)
The semiconductor device according to Appendix 17A, wherein the wiring layer has a plurality of first inclined side surface pads formed on the first inclined side surfaces for mounting the direction sensor elements.

(Appendix 19A)
The semiconductor device according to Appendix 18A, wherein the wiring layer has a connection path for a connection between one pad and another each selected from the external terminals, the second bottom surface pads, the first bottom surface pad and the first inclined side surface pads.

(Appendix 20A)
The semiconductor device according to Appendix 19A, wherein the connection path is routed via the second inclined side surface.

(Appendix 21A)
The semiconductor device according to Appendix 20A, wherein the connection path is routed via the first inclined side surface.

(Appendix 22A)
The semiconductor device according to one of Appendices 15A through 21A, further comprising a sealing resin covering the three direction sensor elements.

(Appendix 23A)
The semiconductor device according to Appendix 22A, wherein the sealing resin includes: a first sealing resin covering at least one of the three direction sensor elements; and a second sealing resin covering at least part of the integrated circuit element.

(Appendix 24A)
The semiconductor device according to Appendix 23A, wherein the second sealing resin entirely covers the integrated circuit element.

(Appendix 25A)
The semiconductor device according to Appendix 24A, wherein the second sealing resin exposes the external terminals.

(Appendix 1B)
A semiconductor device comprising:
a substrate of a semiconductor material, having a main surface and a recess receding from the main surface;
a wiring layer formed on the substrate;
one or more elements housed in the recess; and
an additional element covering at least part of the one or more elements.

(Appendix 2B)
The semiconductor device according to Appendix 1B, wherein the recess includes: a first hollow incorporating said one or more elements and having a first bottom surface and a first inclined side surface; and a second hollow having a second bottom surface connecting to the first inclined side surface, and a second inclined side surface connecting to the second bottom surface and the main surface.

(Appendix 3B)
The semiconductor device according to Appendix 2B, wherein the additional element is supported by the second bottom surface and overlaps at least part of the first hollow in a normal direction of the main surface.

(Appendix 4B)
The semiconductor device according to Appendix 3B, wherein the additional element is supported by at least two regions of the second bottom surface which sandwich the first hollow.

(Appendix 5B)
The semiconductor device according to Appendix 3B or 4B, wherein at least, one of said one or more elements is supported by the first bottom surface.

(Appendix 6B)
The semiconductor device according to one of Appendices 3B through 5B, wherein at least one of said one or more elements is supported by the first inclined side surface.

(Appendix 7B)
The semiconductor device according to one of Appendixes 3B through 6B, wherein the substrate is made of a monocrystal semiconductor material.

(Appendix 8B)
The semiconductor device according to Appendix 7B, wherein the semiconductor material is provided by Si.

(Appendix 9B)
The semiconductor device according to Appendix 8B, wherein the main surface is provided by a (100) surface,
the first hollow having four of the first inclined side surfaces.
the second hollow having four of the second inclined side surfaces.

(Appendix 10B)
The semiconductor device according to Appendix 8B, wherein the main surface is a (110) surface,
the first hollow having: two of the first inclined side surfaces spaced from each other with the first bottom surface in-between; and two first upright side surfaces perpendicular to the first bottom surface and spaced from each other with the first bottom surface in-between.
The semiconductor device according to Appendix 8B, wherein the second hollow has: two of the second inclined side surfaces spaced from each other with the second bottom surface in-between; and two second upright side surfaces perpendicular to the first bottom surface and spaced from each other with the second bottom surface in-between.

(Appendix 11B)
The semiconductor device according to Appendix 9B or 10B, wherein said one or more elements include three direction sensor elements each having a detection reference axis along a direction differing from those directions for the other two.

(Appendix 12B)
The semiconductor device according to Appendix 11B, wherein said one or more elements further include an acceleration sensor element for acceleration detection in three mutually different directions from each other.

(Appendix 13B)
The semiconductor device according to Appendix 12B, wherein the acceleration sensor element is housed in the first hollow.

(Appendix 14B)
The semiconductor device according to Appendix 13B, wherein the acceleration sensor element is supported by the first bottom surface.

(Appendix 15B)
The semiconductor device according to one of Appendices 9B through 14B, wherein the wiring layer has a plurality of external terminals formed on the main surface.

(Appendix 16B)
The semiconductor device according to Appendix 15B, wherein the wiring layer has a plurality of second bottom surface pads formed on the the second bottom surface for mounting the additional element.

(Appendix 17B)
The semiconductor device according to Appendix 16B, wherein the wiring layer has a plurality of first bottom surface pads formed on the first bottom surface for mounting the elements.

(Appendix 18B)
The semiconductor device according to Appendix 17B, wherein the wiring layer has a plurality of first inclined side surface pads formed on the first inclined side surfaces for mounting the elements.

(Appendix 19B)
The semiconductor device according to Appendix 18B, wherein the wiring layer has a connection path for a connection between one pad and another each selected from the external terminals, the second bottom surface pads, the first bottom surface pad and the first inclined side surface pads.

(Appendix 20B)
The semiconductor device according to Appendix 19B, wherein the connection path is routed via the second inclined side surface.

(Appendix 21B)
The semiconductor device according to Appendix 19B or 20B, wherein the connection path is routed via the first inclined side surface.

(Appendix 22B)
The semiconductor device according to one of Appendices 15B through 21B, further comprising a sealing resin covering at least part of each of said one or more elements and of the additional element.

(Appendix 23B)
The semiconductor device according to Appendix 22B, wherein the sealing resin includes: a first sealing resin covering at least one of said one or more elements; and a second sealing resin covering at least part of the additional element.

(Appendix 24B)
The semiconductor device according to Appendix 23B, wherein the second sealing resin entirely covers the additional element.

(Appendix 25B)
The semiconductor device according to Appendix 24B, wherein the second sealing resin exposes the external terminals.

(Appendix 1C)
A semiconductor device comprising:
a substrate of a semiconductor material, having a main surface and a recess receding from the main surface;
a wiring layer formed on the substrate; and
one or more elements each classified as a discrete element as being a single-piece, individual element having surface-mountable surface mounting terminals.

(Appendix 2C)
The semiconductor device according to Appendix 1C, further comprising an additional element covering at least part of said one or more elements.

(Appendix 3C)
The semiconductor device according to Appendix 2C, wherein the recess includes: a first hollow incorporating said one or more elements and having a first bottom surface and a first inclined side surface; and a second hollow having a second bottom surface connecting to the first inclined side surface, and a second inclined side surface connecting to the second bottom surface and the main surface.

(Appendix 4C)
The semiconductor device according to Appendix 3C, wherein the additional element is supported by the second bottom surface and overlaps at least part of the first hollow in a normal direction of the main surface.

(Appendix 5C)
The semiconductor device according to Appendix 4C, wherein the additional element is supported by at least two regions of the second bottom surface which sandwich the first hollow.

(Appendix 6C)
The semiconductor device according to one of Appendices 3C through 5C, wherein at least one of said one or more elements is supported by the first bottom surface.

(Appendix 7C)
The semiconductor device according to one of Appendices 3C through 6C, wherein at least one of said one or more elements is supported by the first inclined side surface.

(Appendix 8C)
The semiconductor device according to one of Appendices 3C through 7C, wherein the substrate is made of a monocrystal semiconductor material.

(Appendix 9C)
The semiconductor device according to Appendix 8C, wherein the semiconductor material is provided by Si.

(Appendix 10C)
The semiconductor device according to Appendix 9C, wherein the main surface is provided by a (100) surface,
the first hollow having four of the first inclined side surfaces,
the second hollow having four of the second inclined side surfaces.

(Appendix 11C)
The semiconductor device according to Appendix 9C, wherein the main surface is provided by a (110) surface,
the first hollow having: two of the first inclined side surfaces spaced from each other with the first bottom surface in-between; and two first upright side surfaces perpendicular to the first bottom surface and spaced from each other with the first bottom surface in-between,
the second hollow having: two of the second inclined side surfaces spaced from each other with the second bottom surface in-between; and two second upright side surfaces perpendicular to the first bottom surface and spaced from each other with the second bottom surface in-between.

(Appendix 12C)
The semiconductor device according to one of Appendices 3C through 11C, wherein said one or more elements include three direction sensor elements each having a detection reference axis along a direction differing from those directions for the other two.

(Appendix 13C)
The semiconductor device according to Appendix 12C, wherein said one or more elements further include an acceleration sensor element for acceleration detection in three mutually different directions from each other.

(Appendix 14C)
The semiconductor device according to Appendix 13C, wherein the acceleration sensor element is housed in the first hollow.

(Appendix 15C)
The semiconductor device according to Appendix 14C, wherein the acceleration sensor element is supported by the first bottom surface.

(Appendix 16C)
The semiconductor device according to one of Appendices 3C through 15C, wherein the wiring layer has a plurality of external terminals formed on the main surface.

(Appendix 17C)
The semiconductor device according to Appendix 16C, wherein the wiring layer has a plurality of second bottom surface pads formed on the second bottom surface for mounting the additional element.

(Appendix 18C)
The semiconductor device according to Appendix 17C, wherein the wiring layer has a plurality of first bottom surface pads formed on the first bottom surface for mounting the elements.

(Appendix 19C)
The semiconductor device according to Appendix 18C, wherein the wiring layer has a plurality of first inclined side surface pads formed on the first inclined side surfaces for mounting the elements.

(Appendix 20C)
The semiconductor device according to Appendix 19C, wherein the wiring layer has a connection path for a connection between one pad and another each selected from the external terminals, the second bottom surface pads, the first bottom surface pad and the first inclined side surface pads.

(Appendix 21C)
The semiconductor device according to Appendix 20C, wherein the connection path is routed via the second inclined side surface.

(Appendix 22C)
The semiconductor device according to Appendix 20C or 21C, wherein the connection path is routed via the first inclined side surface.

(Appendix 23C)
The semiconductor device according to one of Appendices 16C through 22C, further comprising a sealing resin covering at least part of each of said one or more elements and of the additional element.

(Appendix 24C)
The semiconductor device according to Appendix 23C, wherein the sealing resin includes: a first sealing resin covering at least one of said one or more elements; and a second sealing resin covering at least part of the additional element.

(Appendix 25C)
The semiconductor device according to Appendix 24C, wherein the second sealing resin entirely covers the additional element.

(Appendix 26C)
The semiconductor device according to Appendix 25C, wherein the second sealing resin exposes the external terminals.

(Appendix 1D)
A semiconductor device comprising:
a substrate of a monocrystal semiconductor material, having a main surface and a recess receding from the main surface;
a wiring layer formed on the substrate; and
one or more elements housed in the recess; and (Appendix 2D)
The semiconductor device according to Appendix 1D, wherein the semiconductor material is provided by Si.

(Appendix 3D)
The semiconductor device according to Appendix 2D, wherein the recess includes: a first hollow incorporating said one or more elements and having a first bottom surface and a first inclined side surface; and a second hollow having a second bottom surface connecting to the first inclined side surface, and a second inclined side surface connecting to the second bottom surface and the main surface.

(Appendix 4D)
The semiconductor device according to Appendix 3D, wherein the main surface is provided by a (100) surface,
the first hollow having four of the first inclined side surfaces,
the second hollow having four of the second inclined side surfaces.

(Appendix 5D)
The semiconductor device according to Appendix 3D, wherein the main surface is provided by a (110) surface,
the first hollow having: two of the first inclined side surfaces spaced from each other with the first bottom surface in-between; and two first upright side surfaces perpendicular to the first bottom surface and spaced from each other with the first bottom surface in-between.

The semiconductor device according to Appendix 3D, wherein the second hollow has: two of the second inclined side surfaces spaced from each other with the second bottom surface in-between; and two second upright side surfaces perpendicular to the first bottom surface and spaced from each other with the second bottom surface in-between.

(Appendix 6D)
The semiconductor device according to Appendix 4D or 5D, further comprising an additional element covering at least part of said one or more elements.

(Appendix 7D)
The semiconductor device according to Appendix 6D, wherein the additional element is supported by the second bottom surface and overlaps at least part of the first hollow in a normal direction of the main surface, (Appendix 8D)
The semiconductor device according to Appendix 7D, wherein the additional element is supported by at least two regions of the second bottom surface which sandwich the first hollow.

(Appendix 9D)
The semiconductor device according to one of Appendices 6D through 8D, wherein at least one of said one or more elements is supported by the first bottom surface.

(Appendix 10D)
The semiconductor device according to one of Appendices 6D through 9D, wherein at least one of said one or more elements is supported by the first inclined side surface, (Appendix 11D)
The semiconductor device according to one of Appendices 6D through 10D, wherein said one or more elements include three direction sensor elements each having a detection reference axis along a direction differing from those directions for the other two.

(Appendix 12D)
The semiconductor device according to Appendix 11D, wherein said one or more elements further include an acceleration sensor element for acceleration detection in three mutually different directions from each other.

(Appendix 13D)
The semiconductor device according to Appendix 12D, wherein the acceleration sensor element is housed in the first hollow.

(Appendix 14D)
The semiconductor device according to Appendix 13D, wherein the acceleration sensor element is supported by the first bottom surface.

(Appendix 15D)
The semiconductor device according to one of Appendices 6D through 14D, wherein the wiring layer has a plurality of external terminals formed on the main surface.

(Appendix 16D)
The semiconductor device according to Appendix 15D, wherein the wiring layer has a plurality of second bottom surface pads formed on the second bottom surface for mounting the additional element.

(Appendix 17D)
The semiconductor device according to Appendix 16D, wherein the wiring layer has a plurality of first bottom surface pads formed on the first bottom surface for mounting the elements.

(Appendix 18D)
The semiconductor device according to Appendix 17D, wherein the wiring layer has a plurality of first inclined side surface pads formed on the first inclined side surfaces for mounting the elements.

(Appendix 19D)
The semiconductor device according to Appendix 18D, wherein the wiring layer has a connection path for a connection between one pad and another each selected from of the external terminals, the second bottom surface pads, the first bottom surface pad and the first inclined side surface pads.

(Appendix 20D)
The semiconductor device according to Appendix 19D, wherein the connection path is routed via the second inclined side surface.

(Appendix 21D)
The semiconductor device according to Appendix 19D or 20D, wherein the connection path is routed via the first inclined side surface, (Appendix 22D)
The semiconductor device according to one of Appendices 15D through 21D, further comprising a sealing resin covering at least part of each of said one or more elements and of the additional element.

(Appendix 23D)
The semiconductor device according to Appendix 22D, wherein the sealing resin includes: a first sealing resin covering at least one of said one or more elements; and a second sealing resin covering at least part of the additional element, (Appendix 24D)
The semiconductor device according to Appendix 23D, wherein the second sealing resin entirely covers the additional element.

(Appendix 25D)
The semiconductor device according to Appendix 24D, wherein the second sealing resin exposes the external terminals.

(Appendix 1E)
A semiconductor device comprising:
a substrate of a semiconductor material, having a main surface and a recess receding from the main surface;
a wiring layer formed on the substrate; and
one or more elements supported by the inclined side surface in the recess.

(Appendix 2E)
The semiconductor device according to Appendix 1E, wherein the wiring layer has a portion formed on the inclined side surface of the recess.

(Appendix 3E)

The semiconductor device according to Appendix 1E or 2E, further comprising an additional element covering at least part of said one or more elements.

(Appendix 4E)

The semiconductor device according to Appendix 3E, wherein the recess includes: a first hollow incorporating said one or more elements and having a first bottom surface and a first inclined side surface; and a second hollow having a second bottom surface connecting to the first inclined side surface, and a second inclined side surface connecting to the second bottom surface and the main surface.

(Appendix 5E)

The semiconductor device according to Appendix 4E, wherein the additional element is supported by the second bottom surface and overlaps at least part of the first hollow in a normal direction of the main surface.

(Appendix 6E)

The semiconductor device according to Appendix 5E, wherein the additional element is supported by at least two regions of the second bottom surface which sandwich the first hollow.

(Appendix 7E)

The semiconductor device according to one of Appendices 4E through 6E, wherein at least one of said one or more elements is supported by the first bottom surface.

(Appendix 8E)

The semiconductor device according to one of Appendices 4E through 7E, wherein at least one of said one or more elements is supported by the first inclined side surface.

(Appendix 9E)

The semiconductor device according to one of Appendices 4E through 8E, wherein the substrate is made of a monocrystal semiconductor material.

(Appendix 10E)

The semiconductor device according to Appendix 9E, wherein the semiconductor material is provided by Si.

(Appendix 11E)

The semiconductor device according to Appendix 10E, wherein the main surface is provided by a (100) surface, the first hollow having four of the first inclined side surfaces.

the second hollow having four of the second inclined side surfaces.

(Appendix 12E)

The semiconductor device according to Appendix 10E, wherein the main surface is provided by a (110) surface, the first hollow having: two of the first inclined side surfaces spaced from each other with the first bottom surface in-between; and two first upright side surfaces perpendicular to the first bottom surface and spaced from each other with the first bottom surface in-between.

the second hollow having: two of the second inclined side surfaces spaced from each other with the second bottom surface in-between; and two second upright side surfaces perpendicular to the first bottom surface and spaced from each other with the second bottom surface in-between.

(Appendix 13E)

The semiconductor device according to one of Appendices 4E through 12E, wherein said one or more elements include three direction sensor elements each having a detection reference axis along a direction differing from those directions for the other two.

(Appendix 14E)

The semiconductor device according to Appendix 13E, wherein said one or more elements further include an acceleration sensor element for acceleration detection in three mutually different directions from each other.

(Appendix 15E)

The semiconductor device according to Appendix 14E, wherein the acceleration, sensor element is housed in the first hollow.

(Appendix 16E)

The semiconductor device according to Appendix 15E, wherein the acceleration sensor element is supported by the first bottom surface.

(Appendix 17E)

The semiconductor device according to one of Appendices 4E through 16E, wherein the wiring layer has a plurality of external terminals formed on the main surface.

(Appendix 18E)

The semiconductor device according to Appendix 17E, wherein the wiring layer has a plurality of second bottom surface pads formed on the second bottom surface for mounting the additional element.

(Appendix 19E)

The semiconductor device according to Appendix 18E, wherein the wiring layer has a plurality of first bottom surface pads formed on the first bottom surface for mounting the elements.

(Appendix 20E)

The semiconductor device according to Appendix 19E, wherein the wiring layer has a plurality of first inclined side surface pads formed on the first inclined side surfaces for mounting the elements.

(Appendix 21E)

The semiconductor device according to Appendix 20E, wherein the wiring layer has a connection path for a connection between one pad and another each selected from the external terminals, the second bottom surface pads, the first bottom surface pad and the first inclined side surface pads.

(Appendix 22E)

The semiconductor device according to Appendix 21E, wherein the connection path is routed via the second inclined side surface.

(Appendix 23E)

The semiconductor device according to Appendix 21E or 22E, wherein the connection path is routed via the first inclined side surface.

(Appendix 24E)

The semiconductor device according to one of Appendices 17E through 23E, further comprising a sealing resin covering at least part of each of said one or more elements and of the additional element.

(Appendix 25E)

The semiconductor device according to Appendix 24E, wherein the sealing resin includes: a first sealing resin covering at least one of said one or more elements; and a second sealing resin covering at least part of the additional element.

(Appendix 26E)

The semiconductor device according to Appendix 25E, wherein the second sealing resin entirely covers the additional element.

(Appendix 27E)

The semiconductor device according to Appendix 26E, wherein the second sealing resin exposes the external terminals.

The invention claimed is:

1. A semiconductor device comprising:
a substrate made of a semiconductor material and having an obverse surface formed with a recess;
a wiring layer formed on the substrate;

at least one functional element disposed in the recess and electrically connected to the wiring layer; and an additional element controlling an orientation detection process that involves the at least one functional element, the additional element overlapping with at least a part of the at least one functional element as viewed in a direction normal to the obverse surface of the substrate, wherein the recess comprises a first hollow that houses the at least one functional element, the first hollow having a first bottom surface and at least one first inclined side surface, and the first inclined side surface being connected to the first bottom surface, the wiring layer including a portion on the first inclined side surface, the portion of the wiring layer extending from an upper edge of the first inclined side surface on the first inclined side surface, the upper edge of the first inclined side surface extending in a first direction perpendicular to the direction normal to the obverse surface of the substrate, as viewed in the direction normal to the obverse surface of the substrate, the portion of the wiring layer comprises a first extension extending in the first direction and a second extension extending in a second direction that is perpendicular to the first direction and the direction normal to the obverse surface of the substrate, the recess comprises a second hollow that has a second bottom surface and at least one second inclined side surface, the second bottom surface being connected to the first inclined side surface, the second inclined side surface being connected to the second bottom surface and the obverse surface, and an angle of the first inclined side surface relative to the first bottom surface is less than 90 degrees.

2. The semiconductor device according to claim 1, wherein the substrate is made of a monocrystal of the semiconductor material.

3. The semiconductor device according to claim 2, wherein the semiconductor material comprises Si.

4. The semiconductor device according to claim 1, wherein the at least one functional element comprises three direction sensor elements having mutually different detection reference axes, respectively.

5. A semiconductor device comprising:

a substrate made of a semiconductor material and having an obverse surface formed with a recess;

a wiring layer formed on the substrate;

at least one functional element disposed in the recess and electrically connected to the wiring layer; and an additional element controlling an orientation detection process that involves the at least one functional element, the additional element overlapping with at least a part of the at least one functional element as viewed in a direction normal to the obverse surface of the substrate, wherein the recess comprises a first hollow that houses the at least one functional element, the first hollow having a first bottom surface and at least one first inclined side surface, and the first inclined side surface being connected to the first bottom surface, the wiring layer including a portion on the first inclined side surface, the portion of the wiring layer extending from an upper edge of the first inclined side surface on the first inclined side surface, the recess comprises a second hollow that has a second bottom surface and at least one second inclined side surface, the second bottom surface being connected to the first inclined side surface, the second inclined side surface being connected to the second bottom surface and the obverse surface, and an angle of the first inclined side surface relative to the first bottom surface is less than 90 degrees.

6. The semiconductor device according to claim 5, wherein the additional element is supported by the second bottom surface and overlaps with at least a part of the first hollow as viewed in the direction normal to the obverse surface.

7. The semiconductor device according to claim 5, wherein the additional element is supported by at least two regions of the second bottom surface which sandwich the first hollow.

8. The semiconductor device according to claim 5, wherein the at least one functional element is supported by the first bottom surface.

9. The semiconductor device according to claim 5, wherein the at least one functional element is supported by the first inclined side surface.

10. The semiconductor device according to claim 5, wherein the obverse surface is provided by a (100) surface, the first hollow has three additional first inclined side surfaces, and the second hollow has three additional second inclined side surfaces.

11. The semiconductor device according to claim 5, wherein the obverse surface is a (110) surface, the first hollow has an additional first inclined side surface and two first upright side surfaces, the additional first inclined side surface being spaced apart from the at least one first inclined side surface across the first bottom surface, the two first upright side surfaces being perpendicular to the first bottom surface and spaced apart from each other across the first bottom surface, and the second hollow has an additional second inclined side surface and two second upright side surfaces, the additional second inclined side surface being spaced apart from the at least one second inclined side surface across the second bottom surface, the two second upright side surfaces being perpendicular to the second bottom surface and spaced apart from each other across the second bottom surface.

12. The semiconductor device according to claim 5, wherein the at least one functional element comprises an acceleration sensor element for acceleration detection in three mutually different directions.

13. The semiconductor device according to claim 12, wherein the acceleration sensor element is housed in the first hollow.

14. The semiconductor device according to claim 13, wherein the acceleration sensor element is supported by the first bottom surface.

15. The semiconductor device according to claim 5, wherein the wiring layer comprises at least one external terminal formed on the obverse surface of the substrate.

16. The semiconductor device according to claim 15, wherein the wiring layer comprises at least one second bottom surface pad formed on the second bottom surface for mounting the additional element.

17. The semiconductor device according to claim 16, wherein the wiring layer comprises at least one first bottom surface pad formed on the first bottom surface for mounting the at least one functional element.

18. The semiconductor device according to claim 16, wherein the wiring layer comprises at least one first inclined side surface pad formed on the first inclined side surface for mounting the at least one functional element.

19. The semiconductor device according to claim 18, wherein the wiring layer comprises a connection path for connecting two of the external terminal, the second bottom surface pad, the first bottom surface pad and the first inclined side surface pad.

20. The semiconductor device according to claim 19, wherein the connection path extends via the second inclined side surface.

21. The semiconductor device according to claim 19, wherein the connection path extends via the first inclined side surface.

22. The semiconductor device according to claim 15, further comprising a sealing resin that at least partially covers the at least one functional element and the additional element.

23. The semiconductor device according to claim 22, wherein the sealing resin includes a first sealing resin and a second sealing resin, the first sealing resin covering the at least one functional element, the second sealing resin covering at least a part of the additional element.

24. The semiconductor device according to claim 23, wherein the second sealing resin covers an entirety of the additional element.

25. The semiconductor device according to claim 24, wherein the external terminal is exposed from the second sealing resin.

* * * * *